(12) United States Patent
Nakanishi

(10) Patent No.: US 9,582,411 B2
(45) Date of Patent: Feb. 28, 2017

(54) MEMORY CONTROLLER, STORAGE APPARATUS, INFORMATION PROCESSING SYSTEM, AND CONTROL METHOD THEREFOR

(71) Applicant: Sony Corporation, Tokyo (JP)

(72) Inventor: Kenichi Nakanishi, Tokyo (JP)

(73) Assignee: Sony Corporation, Tokyo (JP)

( * ) Notice: Subject to any disclaimer, the term of this patent is extended or adjusted under 35 U.S.C. 154(b) by 78 days.

(21) Appl. No.: 14/620,939

(22) Filed: Feb. 12, 2015

(65) Prior Publication Data

US 2015/0254133 A1 Sep. 10, 2015

(30) Foreign Application Priority Data

Mar. 4, 2014 (JP) ................................. 2014-041749

(51) Int. Cl.
| | | |
|---|---|---|
| *G06F 11/00* | (2006.01) | |
| *G06F 12/00* | (2006.01) | |
| *G06F 11/10* | (2006.01) | |
| *G11C 29/04* | (2006.01) | |

(52) U.S. Cl.
CPC ............ *G06F 12/00* (2013.01); *G06F 11/108* (2013.01); *G06F 11/1044* (2013.01); *G06F 11/1068* (2013.01); *G11C 2029/0409* (2013.01)

(58) Field of Classification Search
CPC ............. G06F 11/1068; G06F 11/1008; G06F 11/1048
See application file for complete search history.

(56) References Cited

U.S. PATENT DOCUMENTS

| | | | | |
|---|---|---|---|---|
| 7,457,919 B2* | 11/2008 | Chen | ................... | G06F 9/30101 711/133 |
| 7,472,331 B2* | 12/2008 | Kim | ...................... | G11C 29/76 714/710 |
| 7,761,655 B2* | 7/2010 | Mizushima | ......... | G06F 12/0804 711/103 |
| 7,831,764 B2* | 11/2010 | Nakajima | ............. | G06F 11/108 711/103 |
| 7,917,688 B2* | 3/2011 | Tanaka | ................... | G06F 1/3225 711/103 |
| 8,001,317 B2* | 8/2011 | Yeh | ...................... | G06F 12/0246 711/103 |
| 8,028,206 B2* | 9/2011 | Sukegawa | ............. | G06F 13/385 365/185.02 |
| 8,229,494 B1* | 7/2012 | Kela | ................... | H04W 52/146 455/522 |

(Continued)

FOREIGN PATENT DOCUMENTS

JP 2003-323352 11/2003

*Primary Examiner* — Esaw Abraham
(74) *Attorney, Agent, or Firm* — Michael Best & Friedrich LLP

(57) ABSTRACT

There is provide a memory controller, which substitutes a substitution page for an error page in a block including a plurality of pages in a non-volatile memory and secures a substitution block to substitute a page in the secured substitution block for the error page when the substitution page is insufficient in a block to which the error page belongs, the substitution page being assigned to the block to which the error page belongs, the substitution block being different from the block to which the error page belongs.

18 Claims, 50 Drawing Sheets

(56) References Cited

U.S. PATENT DOCUMENTS

| | | | | |
|---|---|---|---|---|
| 8,259,498 B2* | 9/2012 | Yogev | ................ | G06F 12/0238 |
| | | | | 365/185.09 |
| 8,341,335 B2* | 12/2012 | Weingarten | ......... | G06F 12/0246 |
| | | | | 365/185.33 |
| 8,423,838 B2* | 4/2013 | Yeh | .................... | G06F 12/0246 |
| | | | | 714/710 |
| 8,443,258 B2* | 5/2013 | Sukegawa | ............. | G06F 13/385 |
| | | | | 365/185.33 |
| 8,667,348 B2* | 3/2014 | Hsu | .................... | G06F 11/1048 |
| | | | | 714/723 |
| 8,756,398 B2* | 6/2014 | Uhlaender | ............ | G11C 29/82 |
| | | | | 711/103 |
| 8,839,072 B2* | 9/2014 | Uchida | ............... | G06F 11/1012 |
| | | | | 714/758 |
| 8,843,698 B2* | 9/2014 | Weingarten | ......... | G06F 12/0246 |
| | | | | 365/185.29 |
| 9,058,288 B2* | 6/2015 | Golov | ................ | G06F 11/1044 |
| 2005/0283647 A1* | 12/2005 | Ishidoshiro | ......... | G06F 11/1068 |
| | | | | 714/5.1 |

* cited by examiner

FIG.14A

Logical page management information:
- Logical page #1 management information → Physical page address #1
- Logical page #2 management information
- Logical page #3 management information → Physical page address #3
- ⋮
- Logical page #(b-e) management information } First address conversion table

FIG.14B

Physical page management information:
- Physical page #1 management information → Physical page -using flag #1 | Physical page fault flag #1
- Physical page #2 management information
- Physical page #3 management information → Physical page -using flag #3 | Physical page fault flag #3
- ⋮
- Physical page #(b-e+1) management information → Substitution page -using flag #1 | Substitution page fault flag #1
- ⋮
- Physical page #b management information → Substitution page -using flag #3 | Substitution page fault flag #3

} First management flag information

Logical block management information

| Logical block #1 management information | Physical block address #1 |
|---|---|
| Logical block #2 management information | |
| Logical block #3 management information | Physical block address #3 |
| ⋮ | |
| Logical block #(m-d) management information | |

Second address conversion table

FIG.15A

Physical block management information

| Physical block #1 management information | Physical block -using flag #1 | Physical block fault flag #1 |
|---|---|---|
| Physical block #2 management information | | |
| Physical block #3 management information | Physical block -using flag #3 | Physical block fault flag #3 |
| ⋮ | | |
| Physical block #(m-d+1) management information | Substitution block -using flag #1 | Substitution block fault flag #1 |
| ⋮ | | |
| Physical block #m management information | Substitution block -using flag #3 | Substitution block fault flag #3 |

Second management flag information

FIG.15B

MEMORY CONTROLLER, STORAGE APPARATUS, INFORMATION PROCESSING SYSTEM, AND CONTROL METHOD THEREFOR

CROSS REFERENCE TO RELATED APPLICATIONS

This application claims the benefit of Japanese Priority Patent Application JP 2014-041749 filed Mar. 4, 2014, the entire contents of which are incorporated herein by reference.

BACKGROUND

The present disclosure relates to a memory controller, and particularly to a memory controller that performs a substitution process on a memory in which an error has occurred, a storage apparatus, an information processing system, and a control method therefor.

A storage apparatus including a non-volatile memory and a memory controller has been used widely. The non-volatile memory performs an access operation in a unit of page of a plurality of bytes, and the memory controller controls the non-volatile memory. In the past, as such a storage apparatus, a storage apparatus in which a memory controller performs a substitution process in a unit of page when a page in which an error associated with memory accessing has occurred (error page) is substituted has been known.

However, as the capacity of the non-volatile memory increases, the number of pages contained therein also increases. Therefore, the number of entries of substitution management information that is necessary for the substitution process increases, and the size of the substitution management information increases. Accordingly, there has been a problem of an increased burden of the substitution process.

In this regard, for example, a storage apparatus in which a memory is managed in segments including a plurality of access units (pages in the above-mentioned example) and the substitution process is performed in a unit of segment has been proposed (see, for example, Japanese Patent Application Laid-open No. 2003-323352).

I. SUMMARY

In the above-mentioned existing technique, the number of entries of the substitution management information decreases and the size of the substitution management information is reduced because the substitution process is performed in a unit of segment. On the other hand, there has been a problem of the increased capacity of the memory substituted when an error has occurred and of the increased capacity of the memory consumed by the substitution process.

The present disclosure has been made in view of the above circumstances, and it is desirable to reduce the size of the substitution management information while performing the substitution process in a unit of page being an access unit of the non-volatile memory.

According to a first embodiment of the present disclosure, there is provided a memory controller, which substitutes a substitution page for an error page in a block including a plurality of pages in a non-volatile memory and secures a substitution block to substitute a page in the secured substitution block for the error page when the substitution page is insufficient in a block to which the error page belongs, the substitution page being assigned to the block to which the error page belongs, the substitution block being different from the block to which the error page belongs. Accordingly, an operation in which the substitution process in a unit of block is performed while performing the substitution process in a unit of page in the block is provided.

Moreover, in the first embodiment, the memory controller may include a first substitution management information buffer configured to store first substitution management information that represents a correspondence relationship between the error page and the substitution page, and a second substitution management information buffer configured to store second substitution management information that represents a correspondence relationship between the block having the insufficient substitution page and the substitution block. Accordingly, an operation in which the substitution process is performed based on the first and second substitution management information held in the first and second buffers, respectively, is provided.

Moreover, in the first embodiment, the first substitution management information may be created when the error page has been generated first, and the second substitution management information may be created when the block having the insufficient substitution page has been generated first. Accordingly, an operation in which the first and second substitution management information does not need to be searched for until the error page or the block having the insufficient substitution page is generated is provided.

Moreover, in the first embodiment, the memory controller may include an address conversion unit configured to convert a logical address of a designated page into a physical address of a page, to convert the logical address into a physical address of the substitution page instead of a physical address of the error page when the error page is substituted, and to convert the logical address into a physical address of the page in the substitution block when the substitution page is insufficient. Accordingly, an operation of having an address conversion function while performing the substitution process in a unit of page in the block and the substitution process in a unit of block is provided.

Moreover, in the first embodiment, the page may include a plurality of banks, an error bank in the error page may be substituted in a unit of bank by a bank in the substitution page when the error page is substituted, and a substitution block that is different from the block to which the error page belongs may be secured to substitute a bank in a page in the substitution block for the error bank when the bank in the substitution page is insufficient in the block to which the error page belongs. Accordingly, an operation in which the substitution process in a unit of block is performed while performing the substitution process in a unit of page in the block even if the non-volatile memory includes a page including a plurality of banks is provided.

Moreover, according to a second embodiment of the present disclosure, there is provided a storage apparatus including a non-volatile memory, and a memory controller configured to substitute a substitution page for an error page in a block including a plurality of pages in the non-volatile memory and secure a substitution block to substitute a page in the secured substitution block for the error page when the substitution page is insufficient in a block to which the error page belongs, the substitution page being assigned to the block to which the error page belongs, the substitution block being different from the block to which the error page belongs. Accordingly, an operation in which the substitution process in a unit of block is performed while performing the substitution process in a unit of page in the block in the non-volatile memory is provided.

Moreover, in the second embodiment, the non-volatile memory may be configured so that the number of substitution pages assigned to the block substantially matches an expected value of the number of error pages generated in pages included in the block, and that the number of substitution blocks substantially matches an expected value of the number of blocks having the insufficient substitution page in all blocks. Accordingly, an operation in which the number of substitution pages and the number of substitution blocks are suitable for the used non-volatile memory is provided.

Moreover, in the second embodiment, the non-volatile memory may be configured to store first substitution management information that represents a correspondence relationship between the error page and the substitution page, and second substitution management information that represents a correspondence relationship between the substitution block and the block having the insufficient substitution page, and the memory controller may include a first substitution management information buffer configured to store the first substitution management information, and a second substitution management information buffer configured to store the second substitution management information. Accordingly, an operation in which the substitution process is performed based on the first and second substitution management information held by the first and second buffers, respectively, in the storage apparatus is provided.

Moreover, according to a third embodiment of the present disclosure, there is provided an information processing system including a non-volatile memory, a memory controller configured to substitute a substitution page for an error page in a block including a plurality of pages in the non-volatile memory and secure a substitution block to substitute a page in the secured substitution block for the error page when the substitution page is insufficient in a block to which the error page belongs, the substitution page being assigned to the block to which the error page belongs, the substitution block being different from the block to which the error page belongs, and a host computer configured to access the non-volatile memory via the memory controller. Accordingly, an operation in which the substitution process in a unit of block is performed while performing the substitution process in a unit of page in the block in the non-volatile memory is provided.

Moreover, according to a fourth embodiment of the present disclosure, there is provided an information processing system including a non-volatile memory, a memory controller configured to substitute a substitution page for an error page in a block including a plurality of pages in the non-volatile memory, the substitution page being assigned to a block to which the error page belongs, and a host computer configured to access the non-volatile memory via the memory controller, and to change an access destination to a substitution block that is different from the block to which the error page belongs to substitute a page in the substitution block for the error page when the substitution page is insufficient in the block to which the error page belongs. Accordingly, an operation in which the substitution process in a unit of block is performed while performing the substitution process in a unit of page in the block in the non-volatile memory is provided.

Moreover, according to a fifth embodiment of the present disclosure, there is provided a method of controlling a non-volatile memory including substituting a substitution page for an error page in a block including a plurality of pages in a non-volatile memory, and securing a substitution block to substitute a page in the secured substitution block for the error page when the substitution page is insufficient in a block to which the error page belongs, the substitution page being assigned to the block to which the error page belongs, the substitution block being different from the block to which the error page belongs. Accordingly, an operation in which the substitution process in a unit of block is performed while performing the substitution process in a unit of page in the block in the non-volatile memory is provided.

According to the present disclosure, it is possible to perform a substitution process in a unit of page in a block as a first substitution process and to use a substitution process in a unit of block as a second substitution process together therewith. Accordingly, such excellent effects that the capacity of a memory consumed by the substitution process decreases and the size of substitution management information that is necessary therefor is reduced can be achieved. It should be noted that the effects described above are not necessarily restrictive, and may be any of those described in the present disclosure.

These and other objects, features and advantages of the present disclosure will become more apparent in light of the following detailed description of best mode embodiments thereof, as illustrated in the accompanying drawings.

II. BRIEF DESCRIPTION OF DRAWINGS

FIGS. 14A and 14B are each a diagram showing an example of first substitution management information according to a second embodiment of the present disclosure;

FIGS. 15A and 15B are each a diagram showing an example of second substitution management information according to the second embodiment;

III. DETAILED DESCRIPTION OF EMBODIMENTS

Hereinafter, embodiments for carrying out the present disclosure (hereinafter, referred to as embodiments) will be described with reference to the drawings. The description will be made in the following order.

1. First Embodiment (example of memory controller)
2. Second embodiment (example of memory controller having address conversion function)
3. Third embodiment (example in which substitution management information is generated with substitution process having been performed)
4. Fourth embodiment (example in which page of non-volatile memory includes plurality of banks)
5. Fifth embodiment (example in which page of non-volatile memory includes plurality of banks and memory controller has address conversion function)

6. Sixth embodiment (example in which first substitution process is performed by memory controller and second substitution process is performed by host computer)
7. Modified example

1. First Embodiment (Configuration of Information Processing System)

Figure 1:
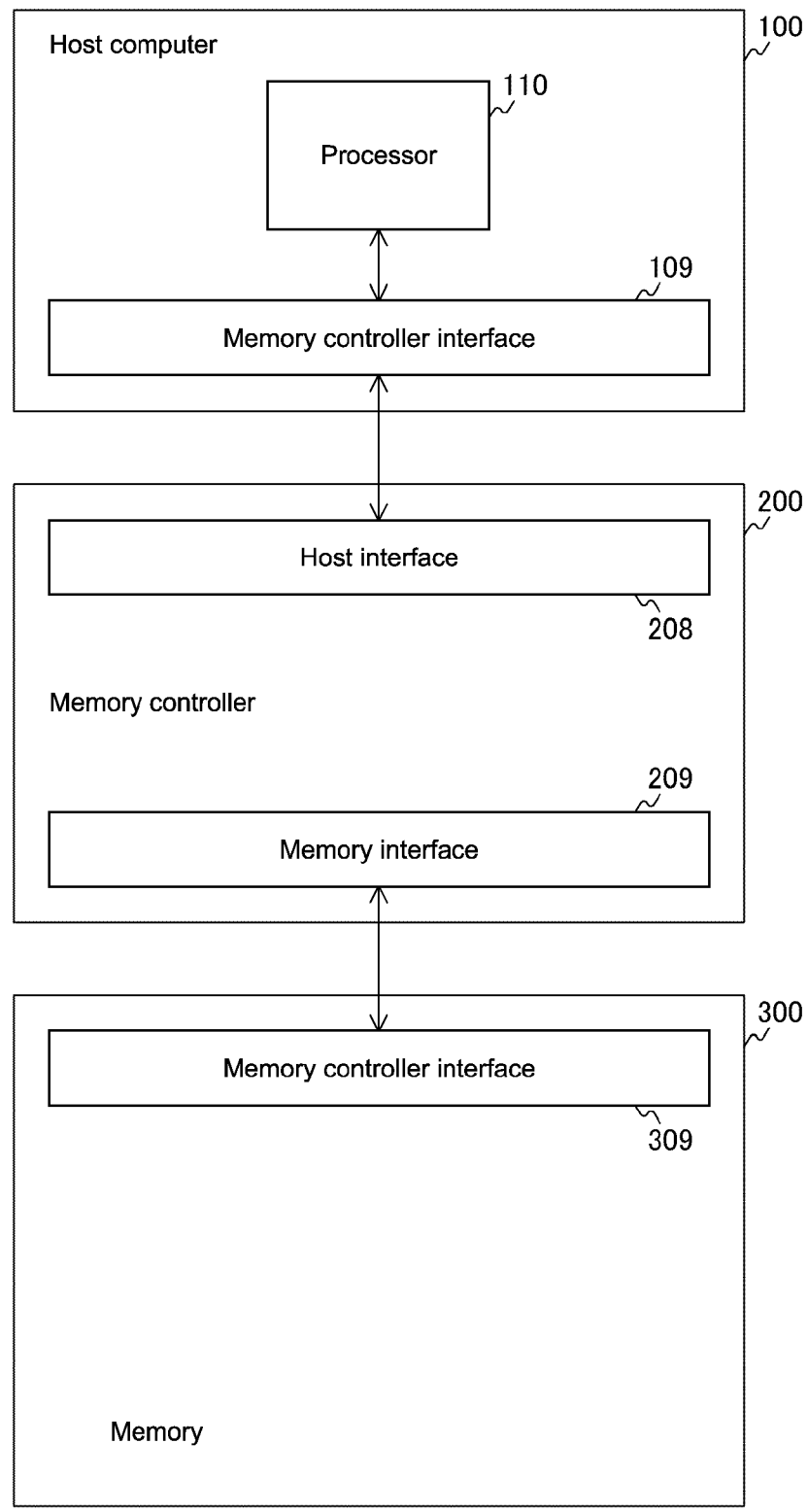
FIG. 1 is a diagram showing a configuration example of a function according to an embodiment of the present disclosure.

FIG. 1 is a diagram showing a configuration example of a function according to an embodiment of the present disclosure. A host computer 100 includes a processor 110 and a memory controller interface 109. The processor 110 is configured to control the operation of the entire host computer 100. The memory controller interface 109 is configured to communicate with a memory controller 200. The host computer 100 is configured to issue a command to read or write data for the memory controller 200 via the memory controller interface 109. As an interface connecting the host computer 100 and the memory controller 200, SATA, PCI Express, eMMC, USB, or the like can be used. It should be noted that the host computer 100 includes a memory such as a read-only memory (ROM) and a random-access memory (RAM) (not shown).

The memory controller 200 includes a host interface 208 and a memory interface 209. The host interface 208 is configured to communicate with the host computer 100. The memory interface 209 is configured to communicate with a memory 300. The memory controller 200 is configured to receive a reading command or a writing command from the host computer 100 via the host interface 208. After that, the memory controller 200 requests the memory 300 to write or read data via the memory interface 209 based on the received command.

The memory 300 includes a non-volatile memory, a peripheral circuit, and a memory controller interface 309 configured to communicate with the memory controller 200. The non-volatile memory included in the memory 300 is capable of reading and writing data in a unit of page, and stores data that is necessary for the operation of the host computer 100. It should be noted that the size of the page may be an arbitrary number of bytes. As will be described later, the non-volatile memory included in the memory 300 is managed also in a unit of block including a plurality of pages. Examples of the non-volatile memory include a NAND flash memory, a phase-change RAM (PCRAM), a magnetoresistive RAM (MRAM), and a resistance RAM (ReRAM).

Figure 2:
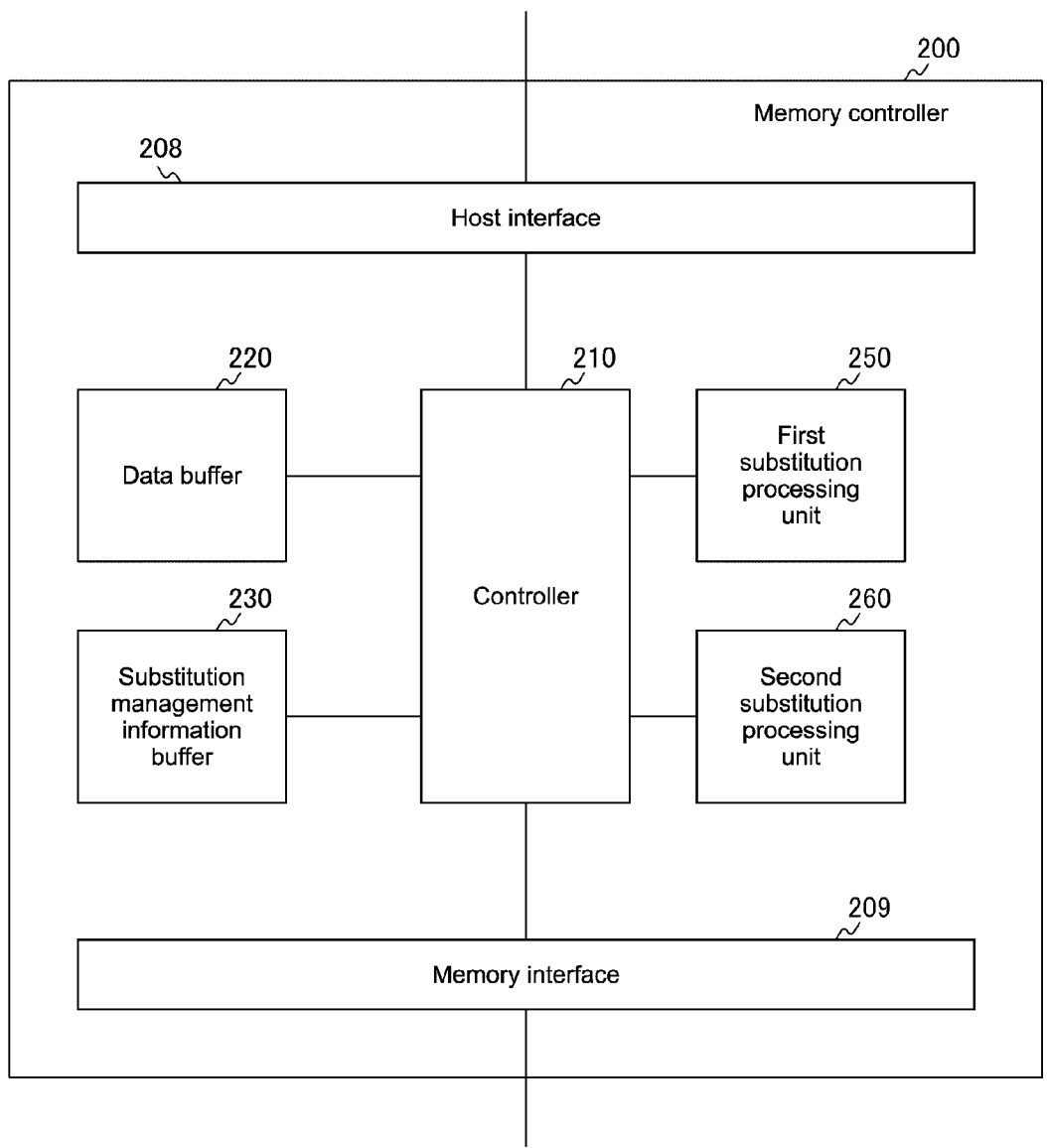
FIG. 2 is a diagram showing a configuration example of a memory controller according to a first embodiment of the present disclosure.

FIG. 2 is a diagram showing a configuration example of a memory controller according to an embodiment of the present disclosure. The memory controller 200 includes a sub-controller 210, a data buffer 220, a substitution management information buffer 230, a first substitution processing unit 250, and a second substitution processing unit 260 in addition to the host interface 208 and the memory interface 209 described above.

The memory controller 200 is configured to manage the non-volatile memory included in the memory 300 based on first substitution management information and second substitution management information, and to control the non-volatile memory. The first substitution management information represents the correspondence relationship between an error page and a substitution page, and the second substitution management information represents a correspondence relationship between a substitution block and a block having the insufficient substitution page. Details thereof will be described later. It should be noted that the first substitution management information is first substitution management information according to an embodiment of the present disclosure. Similarly, the second substitution management information is second substitution management information according to an embodiment of the present disclosure.

The controller 210 is configured to interpret the command issued by the host computer 100. After that, the controller 210 inputs/outputs a control command and data between the controller 210 and the memory 300. Moreover, the controller 210 is configured to control the data buffer 220, the substitution management information buffer 230, the first substitution processing unit 250, and the second substitution processing unit 260.

The data buffer 220 is configured to temporarily store data when the data is transferred between the host computer 100 and the memory 300. The substitution management information buffer 230 is configured to temporarily store the first and second substitution management information. The first substitution processing unit 250 is configured to perform a first substitution process based on the first substitution management information. The second substitution processing unit 260 is configured to perform a second substitution process based on the second substitution management information. The first and second substitution processes will be described later. It should be noted that the substitution management information buffer 230 is an example of the first substitution management information and the second substitution management information buffer according to an embodiment of the present disclosure.

In an embodiment of the present disclosure, the first and second substitution management information are stored in the non-volatile memory in the memory 300. The controller 210 is configured to transfer the first and second substitution management information to the substitution management information buffer 230 when an information processing system is activated. The first substitution processing unit 250 is configured to perform the substitution process based on the first substitution management information transferred to the substitution management information buffer 230. When an error page is generated, the first substitution processing unit 250 sets new substitution management information to the first substitution management information transferred to the substitution management information buffer 230. Similarly, the second substitution processing unit 260 performs the substitution process based on the second substitution management information transferred to the substitution management information buffer 230. When an error block is generated, the second substitution processing unit 260 sets new substitution management information to the second substitution management information transferred to the substitution management information buffer 230. The controller 210 is configured to ensure consistency of the first and second substitution management information stored in the substitution management information buffer 230 with that stored in the non-volatile memory in the memory 300. Specifically, based on the first and second substitution management information appropriately stored in the substitution management information buffer 230, the first and second substitution management information stored in the non-volatile memory in the memory 300 is updated.

With the above-mentioned process, the memory controller 200 can perform the substitution process without accessing the first and second substitution management information stored in the non-volatile memory in the memory 300.

(Storage Area in Memory 300)

Figure 3:
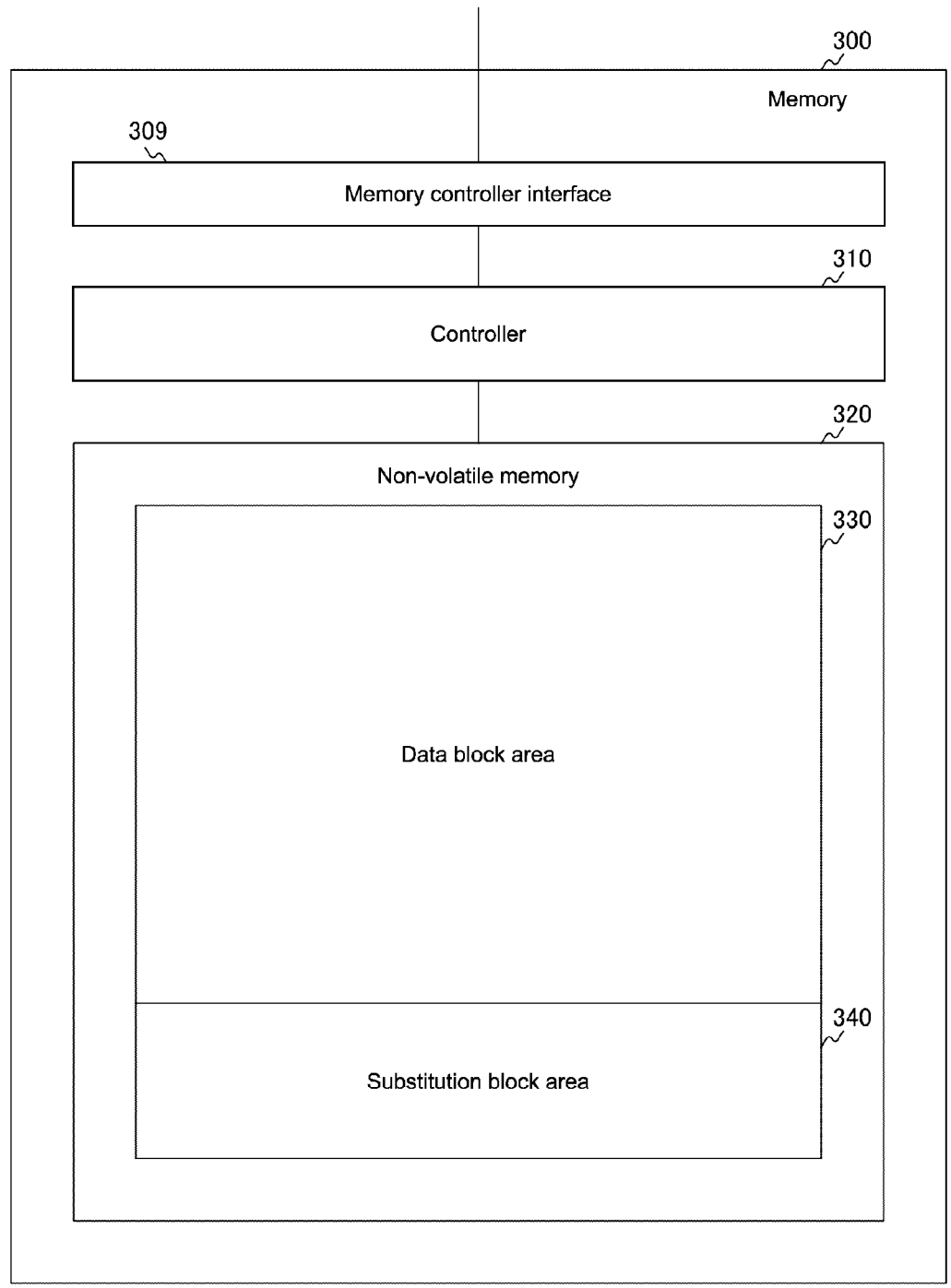
FIG. 3 is a diagram showing a configuration example of a memory according to the first embodiment.

FIG. 3 is a diagram showing a configuration example of a memory according to an embodiment of the present disclosure. The memory 300 includes a controller 310 and a non-volatile memory 320 in addition to the memory controller interface 309 described above. The controller 310 is configured to perform reading and writing operations on the non-volatile memory 320 in accordance with the control command transmitted from the memory controller 200. The non-volatile memory 320 includes a data block area 330 and a substitution block area 340. The data block area 330 is formed of a data storing block used for storing data normally. The substitution block area 340 is formed of a substitution block that is substituted for an error block.

Figure 4:
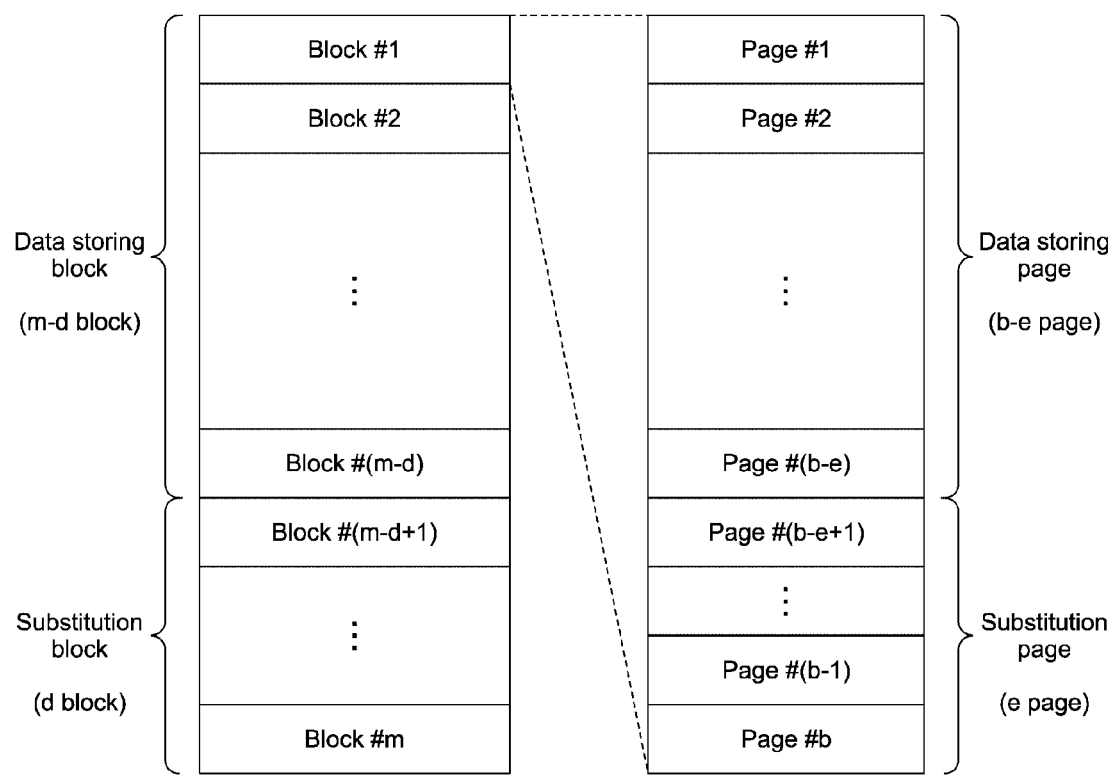
FIG. 4 is a diagram showing a configuration example of the area of a non-volatile memory according to the first embodiment.

FIG. 4 is a diagram showing a configuration example of an area of a non-volatile memory according to an embodiment of the present disclosure. As shown in FIG. 4, a data storing block and a substitution block in the non-volatile memory 320 include a data storing page and a substitution page, respectively. The data storing page is used for storing data normally, and has a partial area for storing the first and second substitution management information. The substitution page is substituted for an error page.

(Substitution Process)

Now, a substitution process according to an embodiment of the present disclosure will be described. Normally, a memory controller is configured to write and read data, i.e., access the data storing page included in the data storing block shown in FIG. 4. In the case where the data storing page is an error page, the memory controller 200 is caused to access not the error page but the substitution page in the block to which the error page belongs. This process is the first substitution process.

As a result of the first substitution process, a block in which the substitution page in the block is insufficient and a further substitution process is hard to be performed is expected to be generated. It should be noted that in the following description, the block having the insufficient substitution page is referred to as error block. In this case, the memory controller 200 performs the substitution process in a unit of block. Specifically, the memory controller 200 is caused to use a substitution block instead of the error block to perform accessing. This process is the second substitution process. As described above, in an embodiment of the present disclosure, the non-volatile memory is managed in a unit of page and block, and two-staged, i.e., first and second substitution processes are performed.

In FIG. 4, m represents the total number of blocks included in the non-volatile memory 320, d represents the number of substitution blocks, b represents the total number of pages included in the block, and e represents the number of substitution pages. In this case, m-d represents the number of data storing blocks, and b-e represents the number of data storing pages. The storage area of the non-volatile memory 320 includes m continued blocks and is divided into m-d data storing blocks and d substitution blocks. The blocks are included in the data block area 330 and the substitution block area 340. Moreover, each block includes b continued pages, and is divided into b-e data storing pages and e substitution pages.

Now, the case where an embodiment of the present disclosure is applied to a non-volatile memory of 2 G bytes is discussed. In the case where the size of the page is 512 bytes and the block size is 32 pages, m is 131,072, d is 8192, b is 32, and e is 2, for example. Moreover, in the case where the page size is 4096 bytes and the block size is 32 pages, m is 16384, d is 1024, b is 32, and e is 2, for example.

(Substitution Management Information)

Figure 5A:
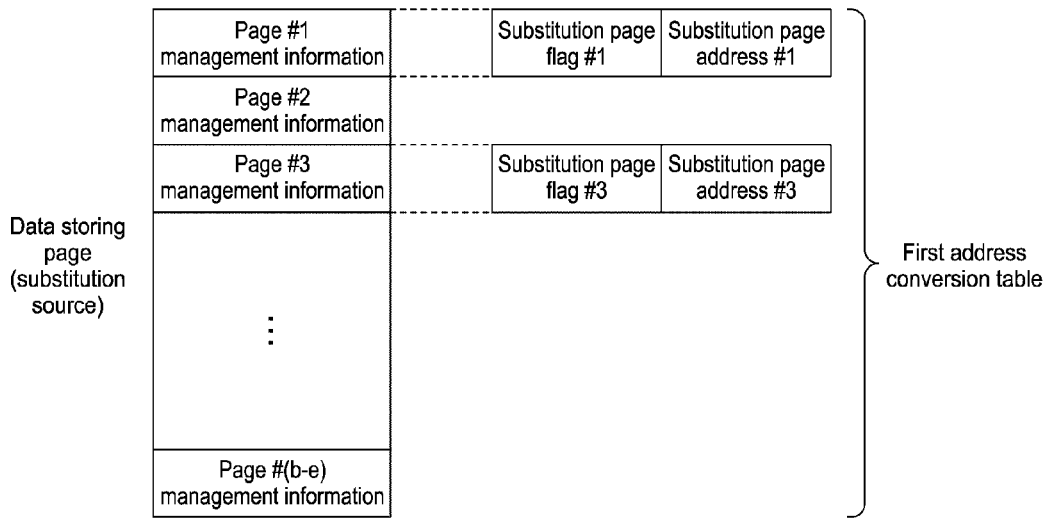
FIGS. 5A and 5B are each a diagram showing an example of first substitution management information according to the first embodiment.
Figure 5B:
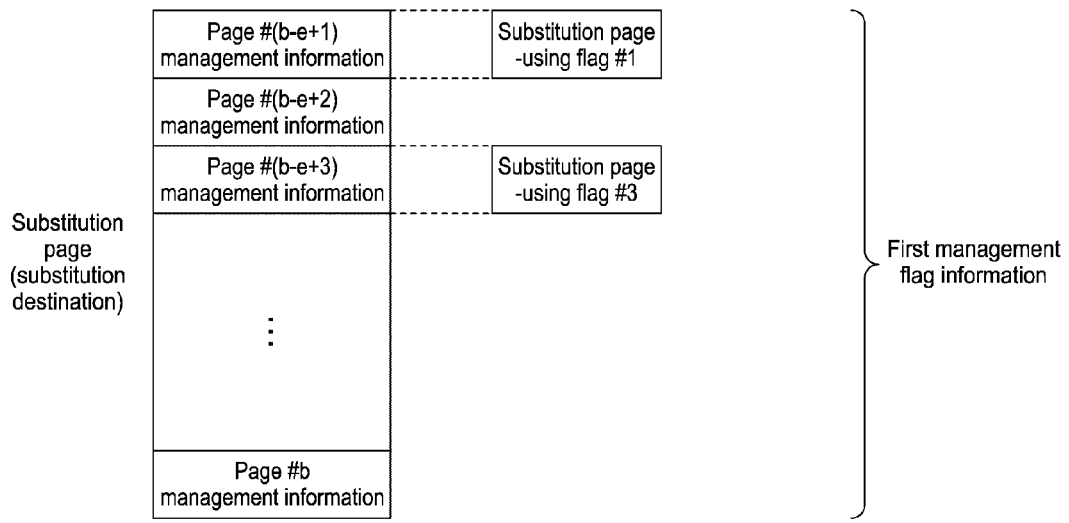

FIG. 5 are each a diagram showing an example of the first substitution management information according to the first embodiment. The first substitution management information according to the first embodiment includes a first address conversion table that manages a data storing page (i.e., substitution source) and a first management flag information that manages a substitution page (i.e., substitution destination). FIG. 5A shows the first address conversion table, and FIG. 5B shows the first management flag information. The first address conversion table includes as many pieces of page management information as the number of data storing pages in the block. The page management information includes a substitution page flag that represents whether or not the data storing page is an error page and is substituted, and a substitution page address that represents a page address of the substitution destination in the case where the data storing page is substituted. The first management flag information includes as many pieces of page management information as the number of substitution pages in the block. The page management information includes a substitution page-using flag that represent whether or not the substitution page is used. As the substitution page address being page management information of the first address conversion table, an address of a page offset from the first page in the block or bit information that represents any one of a plurality of substitution pages can be used.

In the above-mentioned example, the total number b of pages included in the block is 32, and the number e of substitution pages is 2. Therefore, the number of entries of the first address conversion table per one block is b-e, i.e., 30. In the case where an address of a page offset from the first substitution page in the block is used as the substitution page address, the size of the substitution page flag and the size of the substitution page address are each only 1 bit. Therefore, the size of entries of the first address conversion table is 2 bits. Moreover, the number of data storing blocks is m-d, i.e., 122,880, and thus 122,880 first address conversion tables are necessary. As a result, the total size of the first address conversion table is 122,880×30×2, i.e., about 921 K bytes.

Figure 6A:
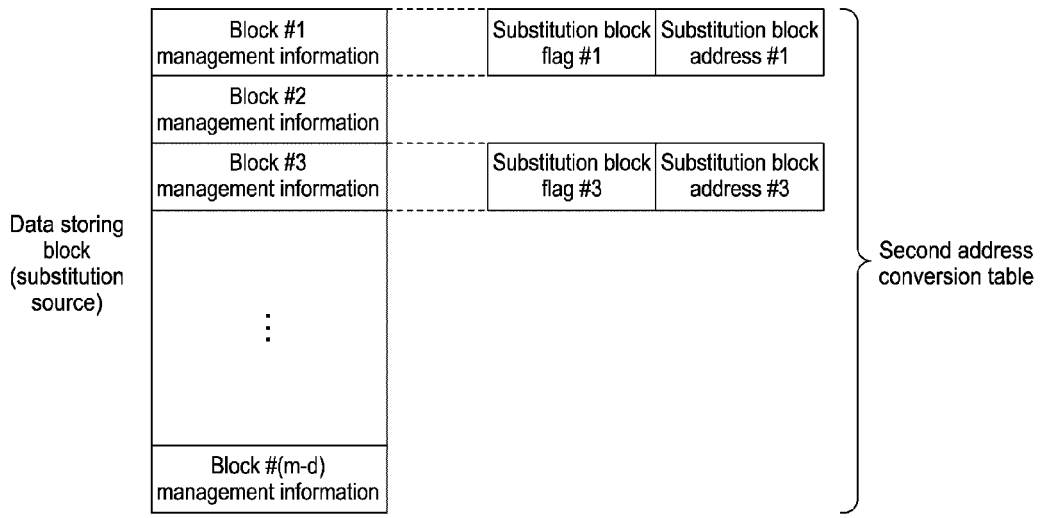
FIGS. 6A and 6B are each a diagram showing an example of second substitution management information according to the first embodiment.
Figure 6B:
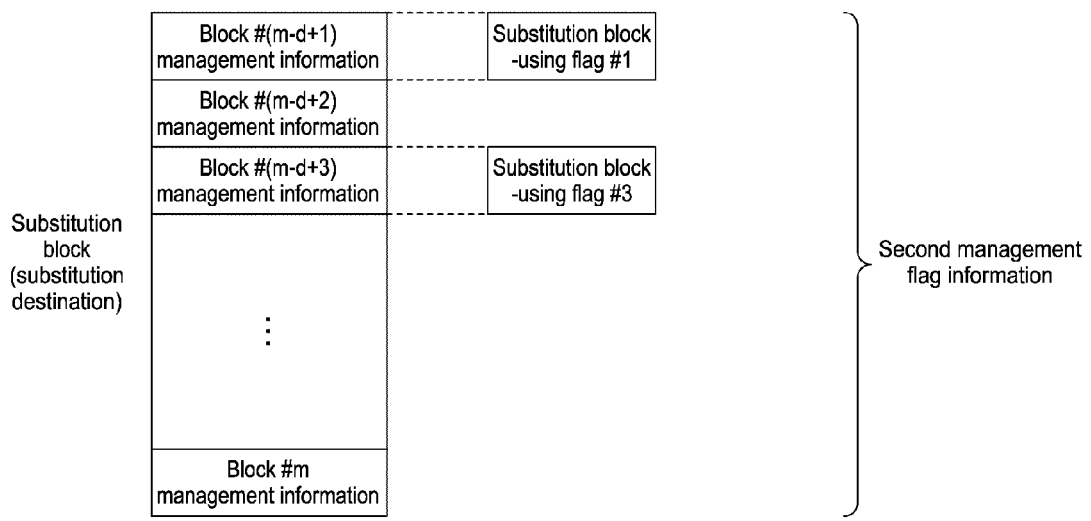

FIG. 6 are each a diagram showing an example of the second substitution management information according to the first embodiment. The second substitution management information according to an embodiment of the present disclosure includes a second address conversion table that manages a data storing block (i.e., substitution source) and second management flag information that manages a substitution block (i.e., substitution destination). FIG. 6A shows the second address conversion table, and FIG. 6B shows the second management flag information. The second address conversion table includes as many pieces of block management information as the number of blocks included in the data block area 330. The block management information includes a substitution block flag that represents whether or not the block is an error block and is substituted, and a substitution block address that represents the block address of the substitution destination. The second management flag information includes as many pieces of block management information as the number of blocks included in the substitution block area 340. The block management information includes a substitution block-using flag that represents whether or not the substitution block is used. As the substitution block address being block management information of the second address conversion table, an address of a page offset from the first block of the substitution block area 340 or bit information that represents any one of a plurality of substitution blocks can be used.

In the above-mentioned example, the number of data storing blocks is 122,880, and the number of substitution pages is 8,192. In the case where an address of a page offset from the first block of the substitution block area 340 is used as the substitution block address, an address of 13 bits is necessary as the substitution block address. Because the size of the substitution block-using flag is 1 bit, the size of entries of the second address conversion table is 14 bits. Therefore, the size of the second address conversion table is 122,880× 14, i.e., about 215 K bytes.

It should be noted that the first and second address conversion tables according to an embodiment of the present disclosure are used for converting the address of the substituted page or block. In the case where a non-substituted page or block is accessed, the address of the page or block designated by the host computer 100 is used as it is.

Next, writing and reading operations according to the above-mentioned embodiment will be described with reference to the drawings.

(Process Procedure of Writing Process)

Figure 7:
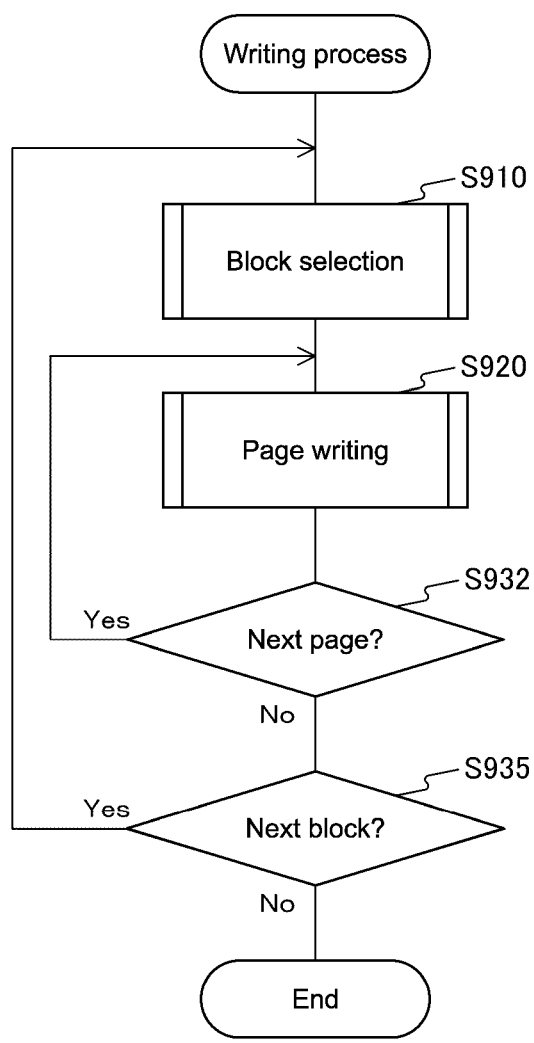
FIG. 7 is a diagram showing an exemplary process procedure of a writing process according to the first embodiment.

FIG. 7 is a diagram showing an exemplary process procedure of a writing process according to the first embodiment. When receiving a writing command from the host computer 100, the memory controller 200 starts the writing process. It should be noted that the writing command includes a designated page address being a writing target and writing data. First, a block selection process (Step S910) is performed to select a block corresponding to the designated page address. Next, a page writing process (Step S920) is performed. In the case where the writing process is performed over a plurality of pages and there is a next writing page (Step S932: Yes), the page writing process (Step S920) is performed again. In the case where there is no next page in the selected block (Step S932: No), the process proceeds to Step S935. In the case where the writing process is performed over a plurality of blocks and there is a next writing block (Step S935: Yes), the process of S910 and the subsequent processes are performed again. In the case where there is no next writing block (Step S935: No), the writing process is finished.

Figure 8:
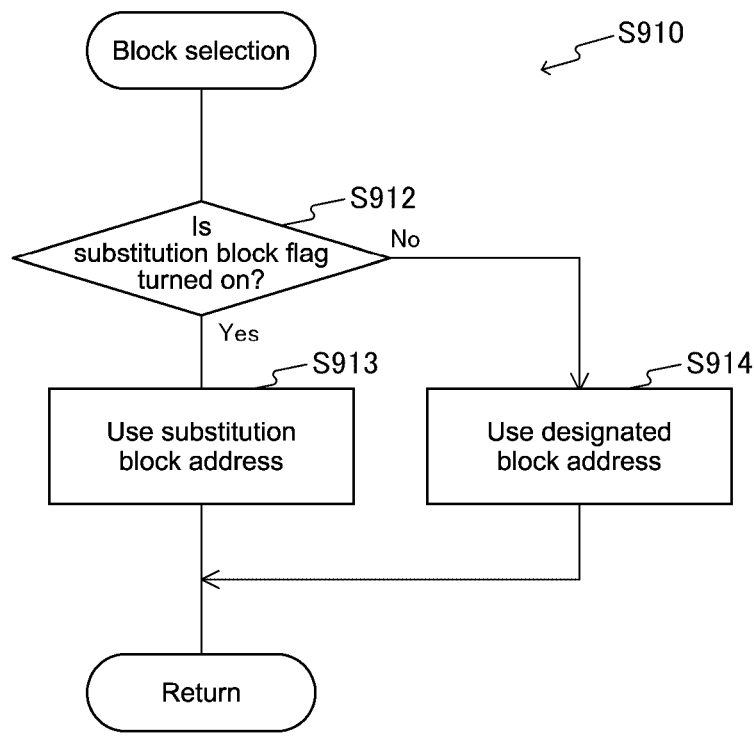
FIG. 8 is a diagram showing an exemplary process procedure of a block selection process (Step S910) according to the first embodiment.

FIG. 8 is a diagram showing an exemplary process procedure of the block selection process (Step S910) according to the first embodiment. The memory controller 200 is configured to search for a substitution block flag of the second substitution management information corresponding to the writing target block. In the case where this flag is turned on, i.e., the block is substituted (Step S912: Yes), the substitution block address is used to perform the subsequent processes (Step S913). In the case where the block is not substituted (Step S912: No), the address of the block to which the page designated by the writing command belongs is used to perform the subsequent processes (Step S914). In the following description, the address of the block to which the page designated by the writing command or the reading command belongs is referred to as designated block address.

Figure 9:
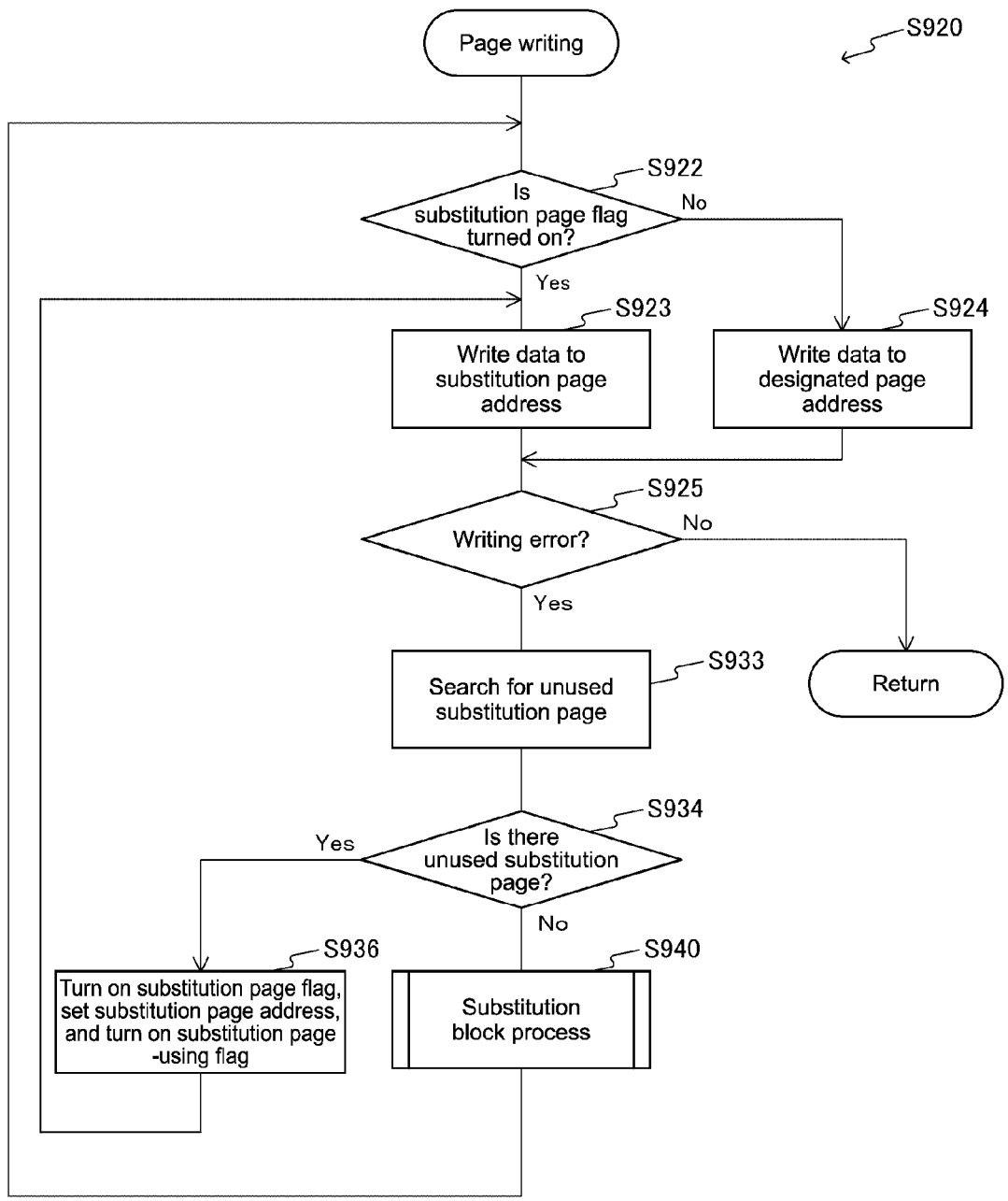
FIG. 9 is a diagram showing an exemplary process procedure of a page writing process (Step S920) according to the first embodiment.

FIG. 9 is a diagram showing an exemplary process procedure of the page writing process (Step S920) according to the first embodiment. The memory controller 200 is configured to search for the substitution page flag of the first substitution management information corresponding to the writing target page. In the case where this flag is turned on, i.e., the page is substituted (Step S922: Yes), data is written to the substitution page address (Step S923). In the case where the page is not substituted (Step S922: No), data is written to the designated page address (Step S924). After that, in the case where no writing error has occurred (Step S925: No), the page writing process is finished.

In the case where a writing error has occurred (Step S925: Yes), the memory controller 200 searches for an unused substitution page to perform the substitution process (Step S933). This process is performed by searching for a substitution page for which the substitution page-using flag of the first substitution management information is not turned on. As a result, in the case where there is an unused substitution page (step S934: Yes), the substitution page flag of the first substitution management information is turned on, the address of the unused substitution page is set to the substitution page address, and the substitution page-using flag is turned on (Step S936). After that, the process returns to Step S923, and the data writing process is performed again. In the case where there is no unused substitution page, e.g., all substitution pages are used (Step S934: No), the substitution block process (Step S940) is performed before the page writing process is performed again.

Figure 10:
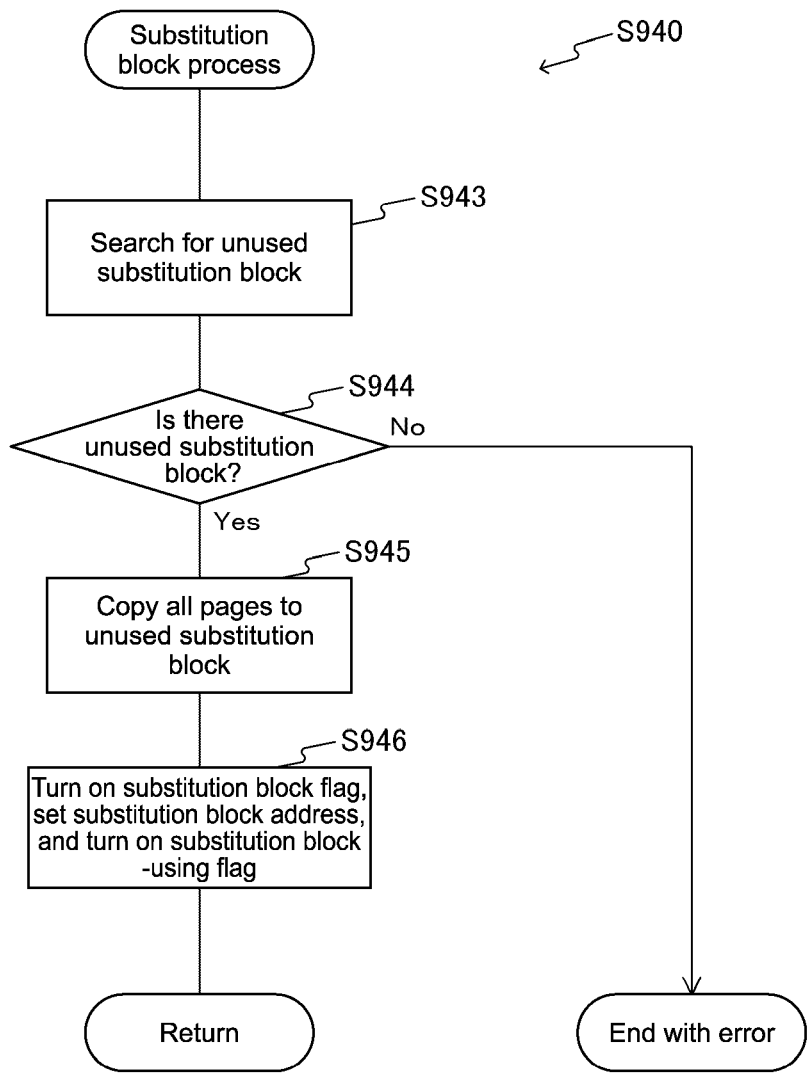
FIG. 10 is a diagram showing an exemplary process procedure of a substitution block process (Step S940) according to the first embodiment.

FIG. 10 is a diagram showing an exemplary process procedure of a substitution block process (Step S940) according to the first embodiment. The memory controller 200 is configured to search for an unused substitution block (Step S943). This process is performed by searching for a substitution block-using flag of the second substitution management information. As a result, in the case where there is no unused substitution block (Step S944: No), the substitution process is hard to perform. The memory controller 200 is configured to notify generation of an error of the host computer, and to finish the writing process.

In the case where there is an unused substitution block (Step S944: Yes), the memory controller 200 copies data stored in all pages in the designated block to the page of the unused substitution block (Step S945). After that, the substitution block flag of the second substitution management information is turned on, the address of the unused substitution block is set to the substitution block address, and the substitution block-using flag is turned on (Step S946). The substitution block process is finished, and the process returns to the page writing process described above with reference to FIG. 9. At this time, the memory controller 200 is caused to perform the subsequent processes (after S922) with the address of the substitution block secured in the substitution block process instead of the address of the block designated by the host computer 100.

(Process Procedure of Reading Process)

Figure 11:
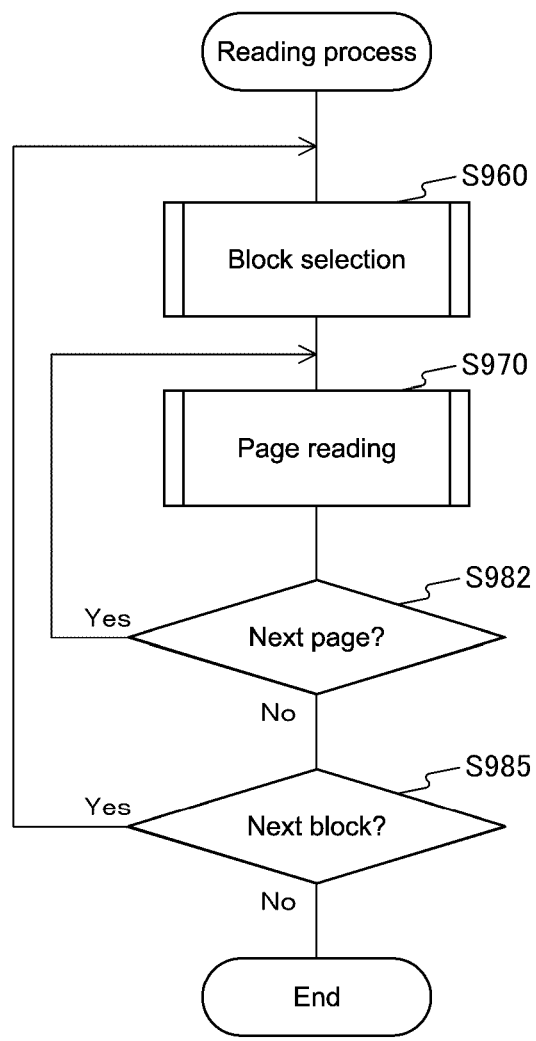
FIG. 11 is a diagram showing an exemplary process procedure of a reading process according to the first embodiment.

FIG. 11 is a diagram showing an exemplary process procedure of a reading process according to the first embodiment. When receiving a reading command from the host computer 100, the memory controller 200 starts the reading process. It should be noted that the reading command includes a designated page address. First, a block selection process (Step S960) is performed to select a block corresponding to the designate page address. Next, a page reading process (Step S970) is performed. In the case where the reading process is performed over a plurality of pages and there is a next reading page (Step S982: Yes), the page reading process (Step S970) is performed again. In the case where there is no next reading page in the selected block (Step S982: No), the process proceeds to S985. In the case where the reading process is performed over a plurality of blocks and there is a next reading block (Step S985: Yes), the process of Step S960 and the subsequent processes are performed again. In the case where there is no next reading block (Step S985: No), the reading process is finished.

Figure 12:
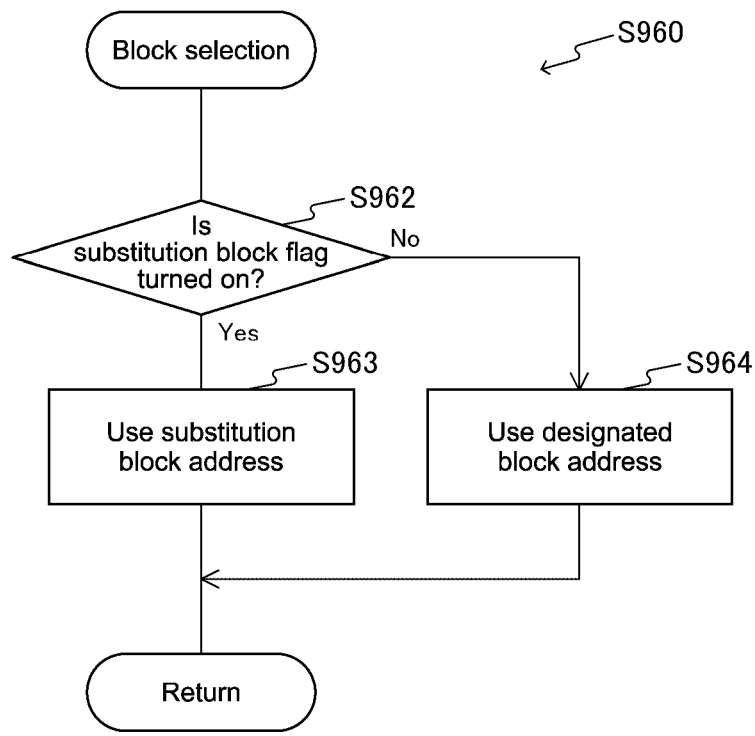
FIG. 12 is a diagram showing an exemplary process procedure of a block selection process (Step S960) according to the first embodiment.

FIG. 12 is a diagram showing an exemplary process procedure of a block selection process (Step S960) according to the first embodiment. The memory controller 200 is configured to search for a substitution block flag of the second substitution management information corresponding to a reading target block. In the case where this flag is turned on, i.e., the block is substituted (Step S962: Yes), the substitution block address is used to perform the subsequent processes (Step S963). In the case where the block is not substituted (Step S962: No), the designated block address is used to perform the subsequent processes (Step S964).

Figure 13:
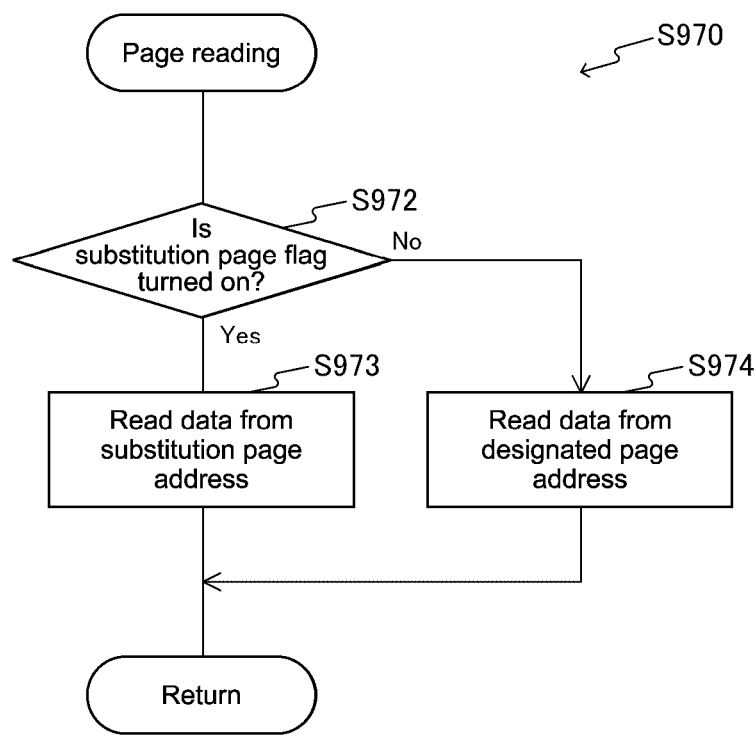
FIG. 13 is a diagram showing an exemplary process procedure of a page reading process (Step S970) according to the first embodiment.

FIG. 13 is a diagram showing an exemplary process procedure of a page reading process (Step S970) according to the first embodiment. The memory controller 200 is configured to determine whether or not a page being a data reading target is substituted. The memory controller 200 is configured to search for the substitution page flag of the first substitution management information corresponding to the reading target page. In the case where this flag is turned on, i.e., the page is substituted (Step S972: Yes), data is read from the substitution page address (Step S973). In the case where the page is not substituted (Step S972: No), data is read from the designated page address (Step S974). After that, the page reading process is finished.

Now, the effects of the first embodiment will be described. The size of the substitution management information in the case where the substitution process is performed in a unit of page is compared with that according to an embodiment of the present disclosure. The substitution page-using flag and the substitution block-using flag are omitted for simplicity.

First, the existing technique in which the substitution management of a non-volatile memory of 2 G bytes is performed not for each block but in a unit of page of 512 bytes is discussed. The total number of pages is 4,194,304. If the number of substitution pages is 1/16 of the total number of pages as in the above-mentioned example, the number of data pages is 3,932,160, and the number of substitution pages is 262,144. In the case where an address of a page offset from the first page of the substitution page area is used as the substitution page address, an address of 18 bits is necessary as the substitution page address. The substitution block-using flag of 1 bit is added thereto, and thus the size of entries of the address conversion table is 19 bits. Therefore, the size of the address conversion table is 3,932,160× 19, i.e., about 9.33 M bytes.

On the other hand, in the first embodiment, the size of the first address conversion table is about 921 K and the size of the second address conversion table is about 215 K bytes, as described above. The total size is only about 1.13 M bytes.

As described above, according to the first embodiment, it is possible to significantly reduce the size of the substitution management information while performing the substitution process in a page unit in the block. Therefore, it is possible to reduce also the capacity of the substitution management information buffer 230 that stores the substitution management information.

Moreover, in the first embodiment, two-staged, i.e., first and second substitution processes are performed. Therefore, it is possible to improve the reliability against an error, as compared with the case where only one-staged substitution is performed as in a system in which a substitution process is performed in a unit of page.

Furthermore, in the first embodiment, the first and second substitution management information are transferred from the non-volatile memory in the memory 300 to the substitution management information buffer 230, and is used for the substitution process. With such a configuration, the memory controller 200 can perform the substitution process without accessing the first and second substitution management information stored in the non-volatile memory in the memory 300. Therefore, it is possible to perform the substitution process at high speed. Moreover, it is possible to avoid access concentration to the area in the non-volatile memory in which the first and second substitution management information are stored.

2. Second Embodiment

In the first embodiment, the logical page is used as the physical page as it is. In a second embodiment of the present disclosure, however, the memory controller 200 has an address conversion function for converting a logical page address into a physical page address. In an information system using a non-volatile memory, access concentration to a specific page occurs in some cases. In view of the above, the address conversion function is applied to a memory controller to distribute the accesses to another page. The address of the page designated by the host computer 100 is used as the logical page address, and the address of the page on the non-volatile memory 320 is used as the physical page address. By appropriately changing the correspondence relationship therebetween to rearrange data, the accesses to a specific page is distributed. Furthermore, in this embodiment, an address conversion function in a unit of block is also provided. The first and second substitution processes are achieved as a part of these address conversion functions. The first substitution processing unit 250 includes an address conversion unit configured to perform address conversion in a unit of page and the first substitution process. The second substitution processing unit 260 includes an address conversion unit configured to perform address conversion in a unit of block and the second substitution process. It should be noted that the address conversion units are each an example of an address conversion unit according to an embodiment of the present disclosure.

The functional configuration as a system and the configuration of areas of the memory controller 200, the memory 300, and the non-volatile memory are the same as those according to the first embodiment. In the following, the description thereof will be omitted.

(Substitution Management Information)

FIG. 14 are each a diagram showing an example of the first substitution management information according to the second embodiment. The first substitution management information according to an embodiment of the present disclosure includes a first address conversion table and first management flag information. The first address conversion table includes logical page management information, and the first management flag information includes physical page management information. FIG. 14A shows the first address conversion table, and FIG. 14B shows the first management flag information. The first address conversion table includes as many pieces of logical page management information as the number of data storing pages in the block. The logical page management information includes a physical page address assigned to the logical page. Moreover, the physical page address can be an address of a page offset from the first page of the block. The first management flag information includes as many pieces of physical page management information as the number of pages in the block. The physical page management information in the data storing page is different from that in the substitution page. The data storing page includes a physical page-using flag and a physical page fault flag. The physical page-using flag represents whether or not the address of the page has been assigned to the physical page address corresponding to the logical page address. The physical page fault flag represents that the page is an error page. The substitution page includes a substitution page-using flag and a substitution page fault flag. The substitution page-using flag represents that the page has been assigned as the substitution page. The substitution page fault flag represents that the page is an error page.

FIG. 15 are each a diagram showing an example of the second substitution management information according to the second embodiment. The second substitution management information according to an embodiment of the present disclosure includes a second address conversion table and second management flag information. The second address conversion table includes logical block management information, and the second management flag information includes physical block management information. FIG. 15A shows the second address conversion table, and FIG. 15B shows the second management flag information. The second address conversion table includes as many pieces of logical block management information as the number of blocks included in the data block area 330. The logical block management information includes a physical block address assigned to the logical block. Moreover, the physical block address can be the first page address of each block. The second management flag information includes as many pieces of physical block management information as the total number of blocks included in the non-volatile memory 320. The physical block management information in the data storing block is different from that in the substitution block. The data storing block includes a physical block-using flag and a physical block fault flag. The physical block-using flag represents whether or not the address of the block has been assigned to the physical block address corresponding to the logical block address. The physical block fault flag represents that the block is an error block. The substitution block includes a substitution block-using flag and a substitution block fault flag. The substitution block-using flag represents that the block has been assigned as the substitution block. The substitution block fault flag represents that the block is an error block.

Next, the writing process and the reading process according to the above-mentioned embodiment will be described with reference to the drawings.

(Process Procedure of Writing Process)

Figure 16:
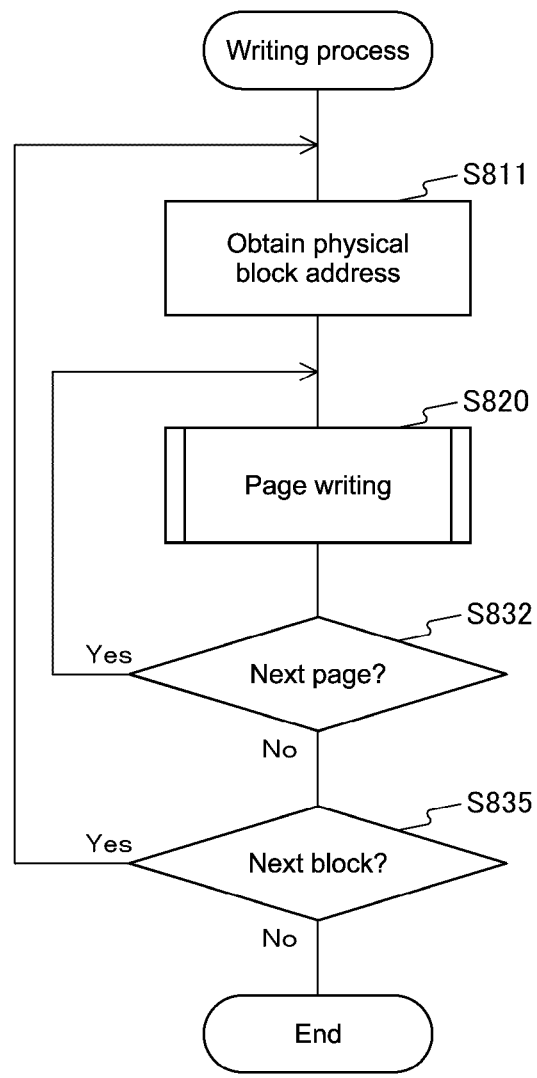
FIG. 16 is a diagram showing an exemplary process procedure of a writing process according to the second embodiment.

FIG. 16 is a diagram showing an exemplary process procedure of a writing process according to the second embodiment. When receiving a writing command from the host computer 100, the memory controller 200 starts the writing process. It should be noted that the writing command includes a logical page address being a writing target and writing data. First, the memory controller 200 obtains a physical block address (step S811). This process is performed by obtaining a physical block address from the second address conversion table of the second substitution management information. Next, a page writing process (Step S820) is performed. In the case where the writing process is performed over a plurality of pages and there is a next writing page (Step S832: Yes), the page writing process (Step S820) is performed again. In the case where there is no next writing page in the obtained block (Step S835: No), the process proceeds to Step S835. In the case where the writing process is performed over a plurality of blocks and there is a next writing block (Step S835: Yes), the process of S811 and the subsequent processes are performed again. In the case where there is no next writing block (Step S835: No), the writing process is finished.

Figure 17:
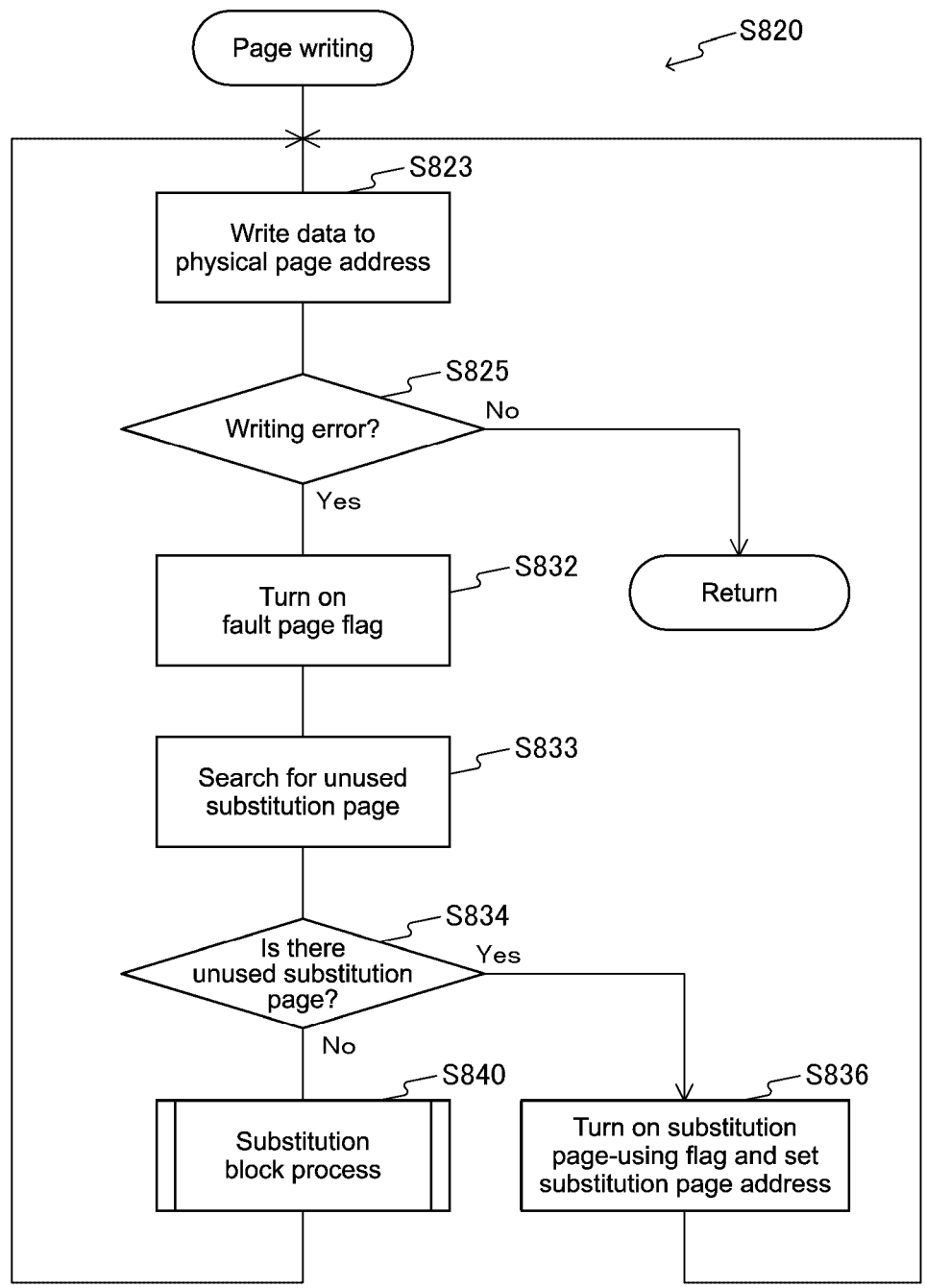
FIG. 17 is a diagram showing an exemplary process procedure of a page writing process (Step S820) according to the second embodiment.

FIG. 17 is a diagram showing an exemplary process procedure of a page writing process (Step S820) according to the second embodiment. The memory controller 200 is configured to obtain a physical page address from the first address conversion table of the first substitution management information and to write data to the physical page address (Step S823). After that, in the case where a writing error has not occurred (Step S825: No), the page writing process is finished.

In the case where a writing error has occurred (Step S825: Yes), the memory controller 200 turns on the physical page fault flag of the first substitution management information corresponding to the physical page (Step S832). Next, in order to perform the substitution process, an unused substitution page is searched for (Step S833). This process is performed by searching for a substitution page for which the substitution page-using flag and the substitution page fault flag of the first substitution management information are not turned on. As a result, in the case where there is an unused substitution page (Step S834: Yes), the substitution page-using flag of the first substitution management information corresponding to the unused substitution page is turned on. Moreover, the address of the unused substitution page is set as the physical page address corresponding to the logical page address being a writing target in the first address conversion table (Step S836). After that, the process returns to Step S823, and the data writing process is performed again. In the case where there is no unused substitution page, e.g., all substitution pages are used (Step S834: No), the substitution block process (Step S840) is performed before the page writing process is performed again.

Figure 18:
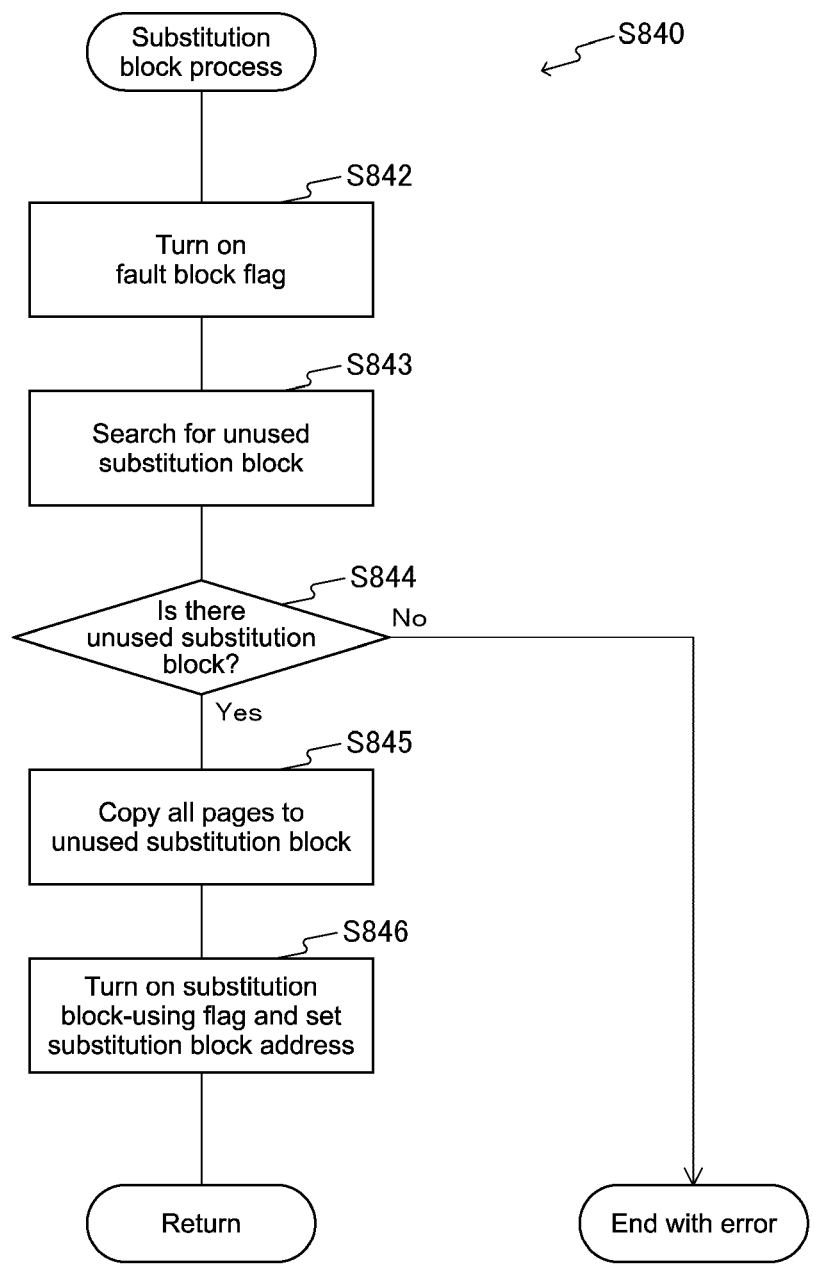
FIG. 18 is a diagram showing an exemplary process procedure of a substitution block process (Step S840) according to the second embodiment.

FIG. 18 is a diagram showing an exemplary process procedure of a substitution block process (Step S840) according to the second embodiment. The memory controller 200 is configured to turn on the physical block fault flag of the second substitution management information corresponding to an error block (Step S842). Next, an unused substitution block is searched for (Step S843). This process is performed by searching for a substitution block for which the substitution block-using flag and the substitution block fault flag are not turned on. As a result, in the case where there is no unused substitution block (Step S844: No), the substitution process is hard to perform. The memory controller 200 is configured to notify generation of an error of the host computer, and to finish the writing process.

In the case where there is an unused substitution block (Step S844: Yes), the memory controller 200 copies data stored in all pages included in the designated block to the page of the unused substitution block (Step S845). After that, the substitution block-using flag of the second substitution management information corresponding to the substitution block is turned on. Moreover, the address of the unused substitution page is set to the second address conversion table of the second substitution management information as the physical page address corresponding to the logical page address being a writing target (Step S846). After that, the substitution block process is finished, and the process returns to the page writing process described above with reference to FIG. 17. At this time, the memory controller 200 uses the address of the substitution block secured in the substitution block process to perform the processes (process of Step S823 and the subsequent processes) in accordance with the second address conversion table of the second substitution management information.

(Process Procedure of Reading Process)

Figure 19:
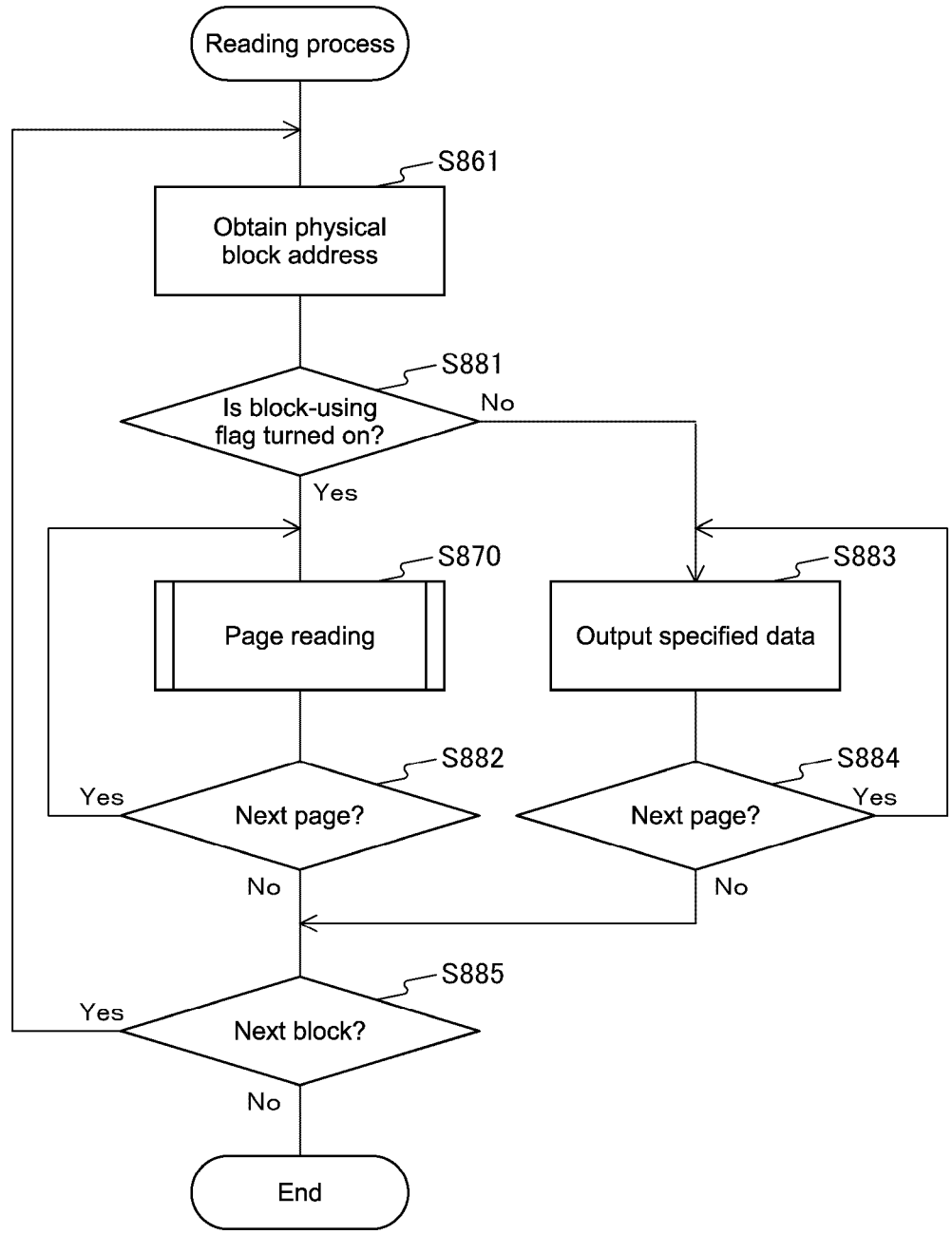
FIG. 19 is a diagram showing an exemplary process procedure of a reading process according to the second embodiment.

FIG. 19 is a diagram showing an exemplary process procedure of a reading process according to the second embodiment. When receiving a reading command from the host computer 100, the memory controller 200 starts the reading process. It should be noted that the reading command includes a logical page address being a reading target.

First, the physical block address is obtained (Step S861). This process is performed by obtaining a physical block address from the second address conversion table of the second substitution management information. Next, a physical block-using flag corresponding to the physical block address is searched for. In the case where this flag is turned on, i.e., the block is being used (Step S881: Yes), the page reading process (Step S870) is performed. In the case where the reading process is performed over a plurality of pages and there is a next reading page (Step S882: Yes), the page reading process (Step S870) is performed again. In the case where there is no next reading page in the obtained block (Step S882: No), the process proceeds to Step S885.

On the other hand, in the case where the block is not used (Step S881: No), specified data is output to the host computer 100 (Step S883). It should be noted that the specified data is data output to notify that the reading data is invalid of the host computer, and is, for example, data whose bits are all 0 or 1. In the case where the reading process is performed over a plurality of pages and there is a next reading page (step S884: Yes), the specified data is output again (Step S883). In the case where there is no next reading page in the obtained block (Step S884: No), the process proceeds to Step S885. In the case where the reading process is performed over a plurality of blocks and there is a next reading block (Step S885: Yes), the process of Step S861 and the subsequent processes are performed again. In the case where there is no next reading block (Step S885: No), the reading process is finished.

Figure 20:
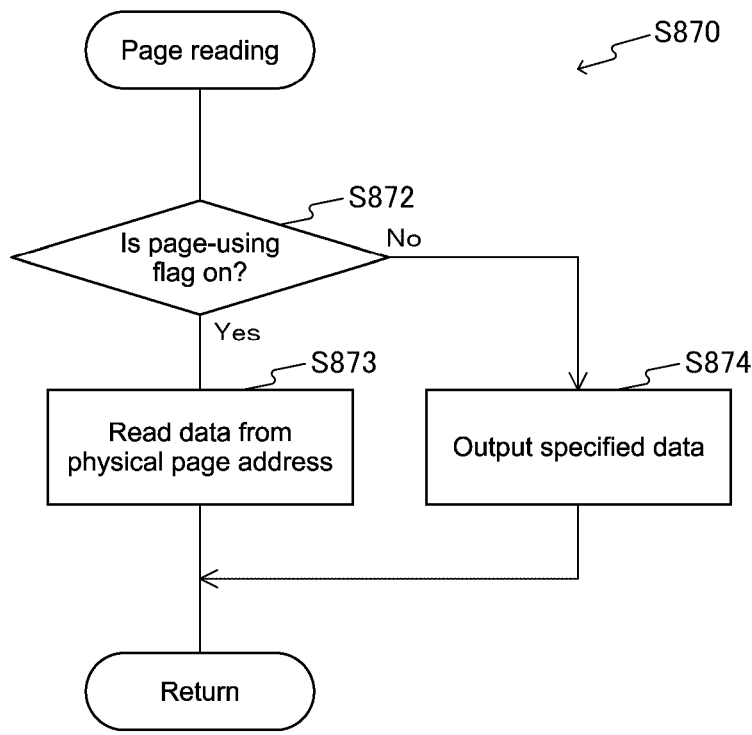
FIG. 20 is a diagram showing an exemplary process procedure of a page reading process (Step S870) according to the second embodiment.

FIG. 20 is a diagram showing an exemplary process procedure of a page reading process (Step S870) according to the second embodiment. The memory controller 200 is configured to obtain a physical page address from the first address conversion table of the first substitution management information corresponding to a reading target page, and to search for a physical page-using flag corresponding to the physical page address. In the case where this flag is turned on, i.e., the page is being used (Step S872: Yes), data is read from the physical page address (Step S873). In the case where the page is not used (Step S872: No), the specified data is output to the host computer 100 (Step S874). After that, the page reading process is finished.

Now, the effects of the second embodiment will be described. The physical page address of the first substitution management information is an address of a page offset from the first page of the block. Therefore, the size of entries of the address conversion table can be reduced as compared with the case where the substitution management is performed in a unit of page. Moreover, because the substitution management is performed in a unit of block, the size of entries of the address conversion table of the second substitution management information can be reduced as compared with the case where the substitution management is performed in a unit of page.

As described above, according to the second embodiment, it is possible to avoid access concentration to a specific page because the memory controller has an address conversion function of converting a logical address into a physical address.

3. Third Embodiment

In the first and second embodiments, the first and second substitution management information are stored in the memory controller 200 or the like in advance. In a third embodiment of the present disclosure, the first and second substitution management information are dynamically generated when the substitution process is performed. It should be noted that the generation of the substitution management information represents that substitution management information in the state where no substitution is performed is generated as an initial value. New substitution management information is added at each time when substitution is performed after the substitution management information is generated.

The functional configuration as a system and the configuration of areas of the memory controller 200, the memory 300, and the non-volatile memory are the same as those according to the first embodiment. In the following, the description thereof will be omitted. Moreover, as the first and second substitution management information, the management information described above with reference to FIG. 5 and FIG. 6 can be used.

Next, the writing operation and the reading operation according to the above-mentioned embodiment will be described with reference to the drawings.
(Process Procedure of Writing Process)

Figure 21:
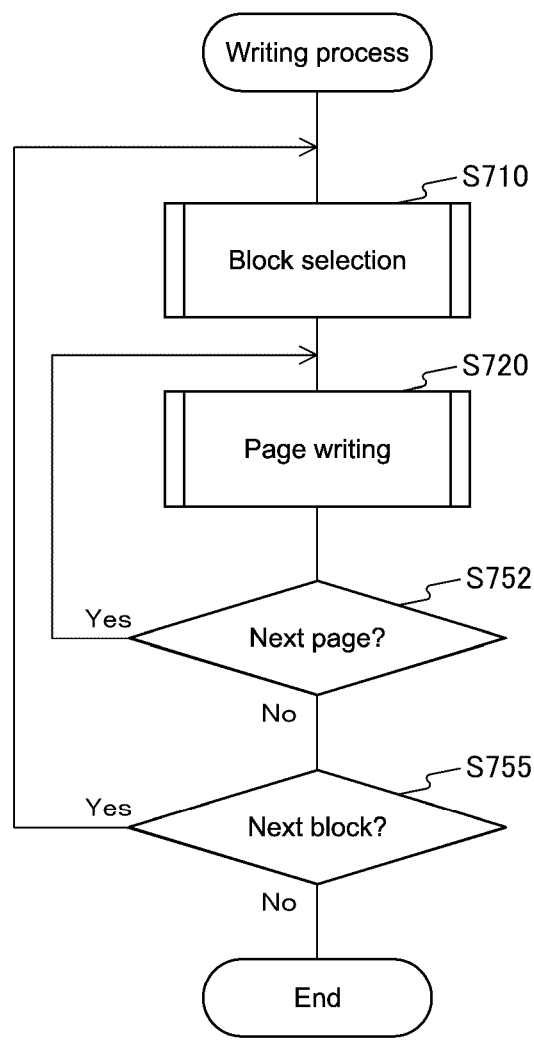
FIG. 21 is a diagram showing an exemplary process procedure of a writing process according to a third embodiment of the present disclosure.

FIG. 21 is a diagram showing an exemplary process procedure of a writing process according to the third embodiment. When receiving a writing command from the host computer 100, the memory controller 200 starts the writing process. It should be noted that the writing command includes a designated page address being a writing target and writing data. First, a block selection process (Step S710) is performed to select a block corresponding to the designated page address. Next, a page writing process (Step S720) is performed. In the case where the writing process is performed over a plurality of pages and there is a next writing page (step S752: Yes), the page writing process is performed again (Step S720). In the case where there is no next writing page in the selected block (Step S752: No), the process proceeds to Step S755. In the case where the writing process is performed over a plurality of blocks and there is a next writing block (Step S755: Yes), the process of Step S710 and the subsequent processes are performed again. In the case where there is no next writing block (Step S755: No), the writing process is finished.

Figure 22:
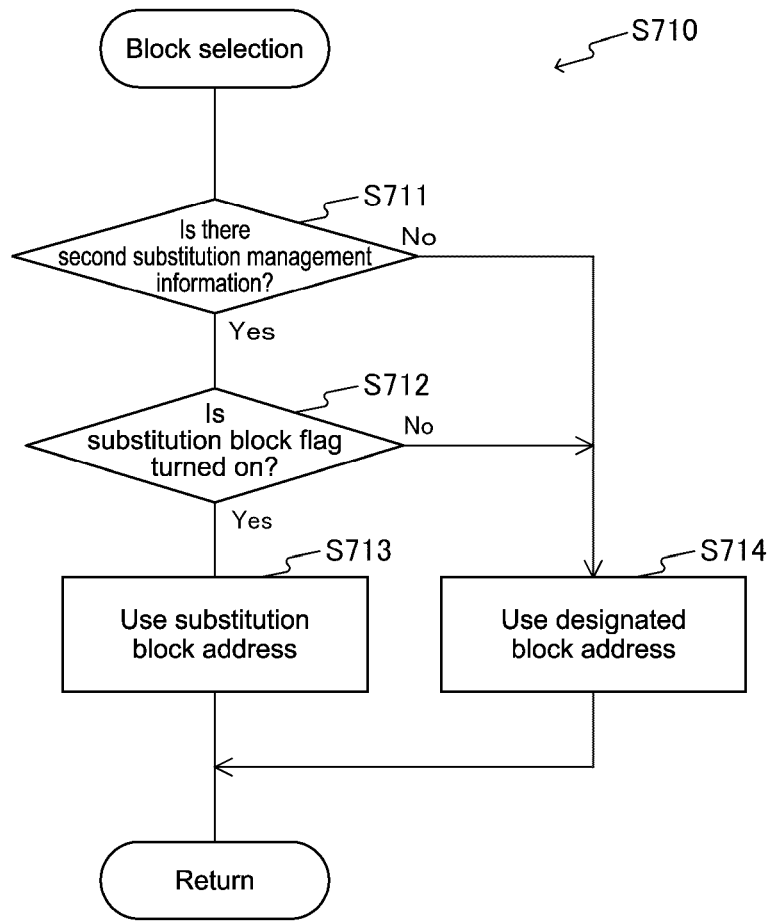
FIG. 22 is a diagram showing an exemplary process procedure of a block selection process (Step S710) according to the third embodiment.

FIG. 22 is a diagram showing an exemplary process procedure of a block selection process (Step S710) according to the third embodiment. The memory controller 200 is configured to check whether or not the second substitution management information is generated. As a result, in the case where the second substitution management information is not generated (Step S711: No), no substitution is performed. Therefore, the designated block address is used to perform the subsequent processes (Step S714). In the case where the second substitution management information is generated (Step S711: Yes), the process proceeds to Step S712. The memory controller 200 is configured to search for the substitution block flag of the second substitution management information corresponding to the writing target block. In the case where this flag is turned on, i.e., the block is substituted (Step S712: Yes), the substitution block address is used to perform the subsequent processes (Step S713). In the case where the block is not substituted (Step S712: No), the process proceeds to Step S714.

Figure 23:
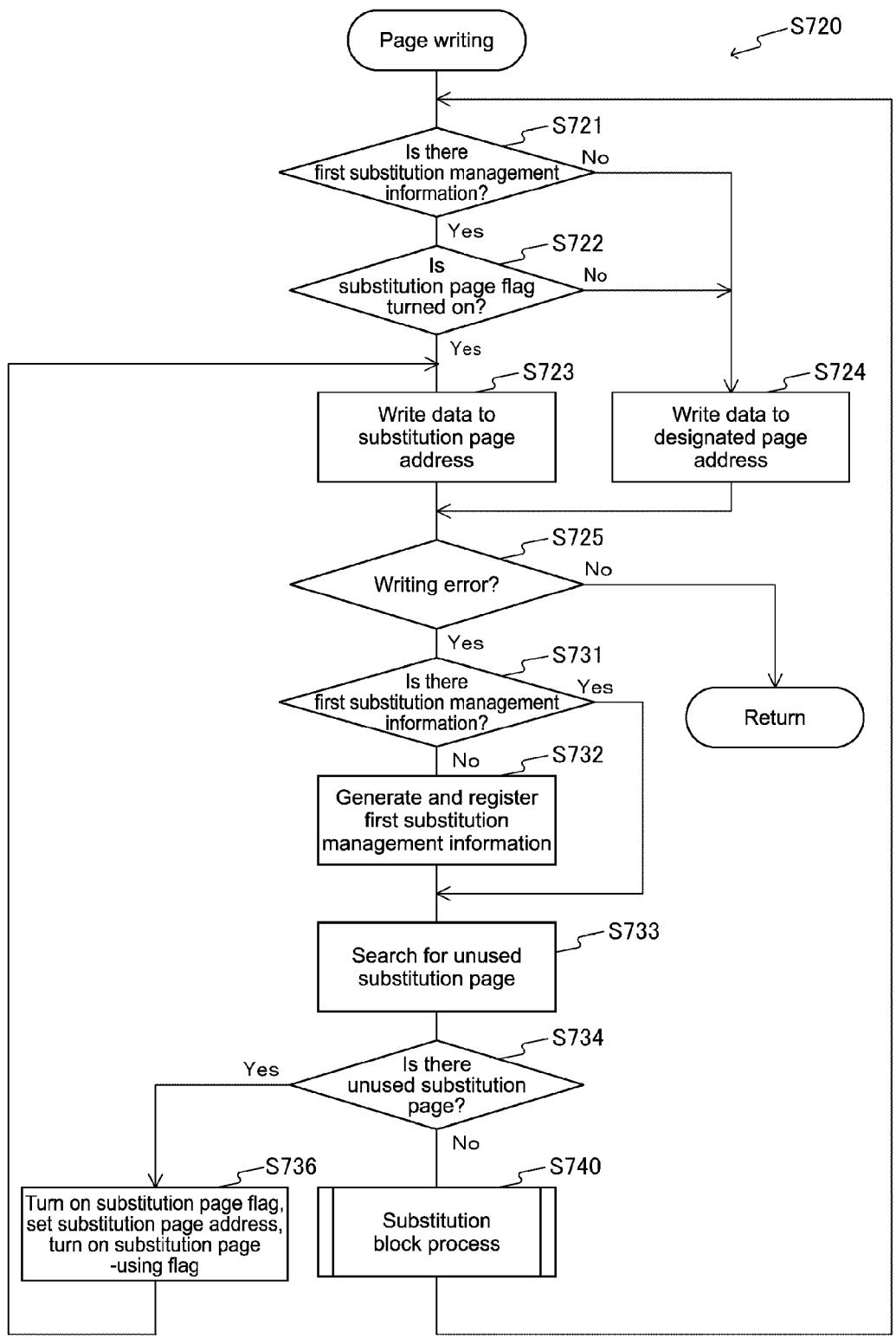
FIG. 23 is a diagram showing an exemplary process procedure of a page writing process (Step S720) according to the third embodiment.

FIG. 23 is a diagram showing an exemplary process procedure of a page writing process (Step S720) according to the third embodiment. The memory controller 200 is configured to check whether or not the first substitution management information is generated. As a result, in the case where the first substitution management information is not generated (step S721: No), data is written to the designated page address (Step S724). In the case where the first substitution management information is generated (Step S721: Yes), the process proceeds to Step S722. The memory controller 200 is configured to search for the substitution page flag of the first substitution management information corresponding to the writing target page. In the case where this flag is turned on, i.e., the page is substituted (step S722: Yes), data is written to the substitution page address (Step S723). In the case where the page is not substituted (Step S722: No), data is written to the designated page address (Step S724). After that, in the case where a writing error has not occurred (step S725: No), the page writing process is finished.

In the case where a writing error has occurred (Step S725: Yes), the memory controller 200 checks whether or not the first substitution management information is generated. As a result, in the case where the first substitution management information is not generated (Step S731: No), the first substitution management information is generated and registered (Step S732). It should be noted that the generated first substitution management information is stored in the substitution management information buffer 230, and is used for the subsequent substitution process. After that, in order to perform the substitution process, an unused substitution page is searched for (step S733). This process is performed by searching for a substitution page for which the substitution page-using flag of the first substitution management information is not turned on. As a result, in the case where there is an unused substitution page (Step S734: Yes), the substitution page flag of the first substitution management information is turned on, the address of the unused substitution page is set to the substitution page address, and the substitution page-using flag is turned on (Step S736). After that, the process returns to Step S723, and the data writing process is performed again. In the case where there is no unused substitution page (Step S734: No), a substitution block process (Step S740) is performed before the process of Step S721 and the subsequent processes are performed again.

Figure 24:
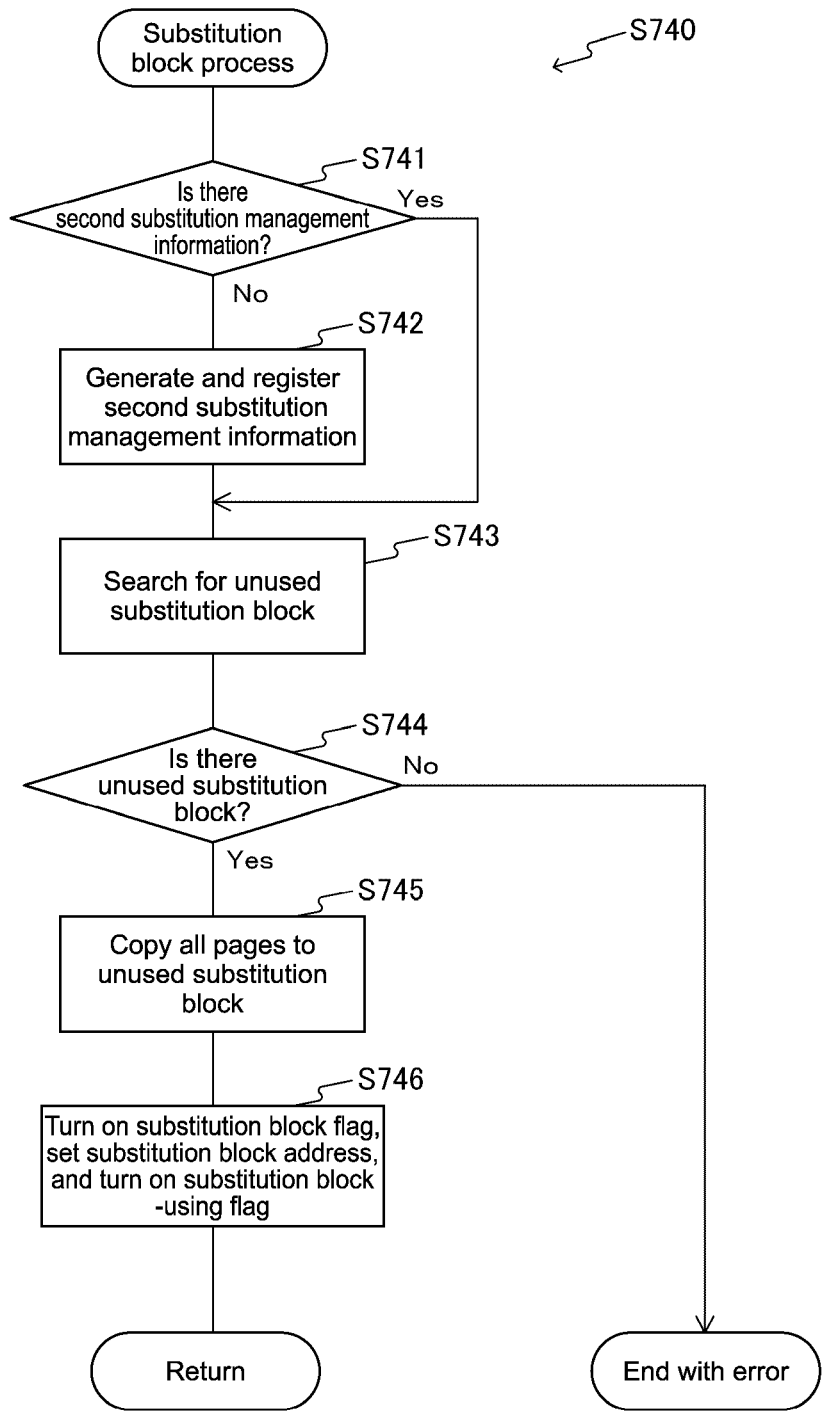
FIG. 24 is a diagram showing an exemplary process procedure of a substitution block process (Step S740) according to the third embodiment.

FIG. 24 is a diagram showing an exemplary process procedure of a substitution block process (Step S740) according to the third embodiment. The memory controller 200 is configured to check whether or not the second substitution management information is generated. As a result, in the case where the second substitution management information is not generated (Step S741: No), the second substitution management information is generated and registered (Step S742). It should be noted that the generated second substitution management information is stored in the substitution management information buffer 230 and is used for the subsequent substitution process. After that, an unused substitution block is searched for (Step S743). This process is performed by searching for the substitution block-using flag of the second substitution management information. As a result, in the case where there is no unused substitution block (Step S744: No), the substitution process is hard to perform. The memory controller 200 is configured to notify generation of an error of the host computer, and to finish the writing process.

In the case where there is an unused substitution block (step S744: Yes), the memory controller 200 copies data stored in all pages included in the designated block to the page of the unused substitution block (Step S745). After that, the substitution block flag of the second substitution management information is turned on, the address of the unused substitution block is set to the substitution block address, and the substitution block-using flag is turned on (Step S746). After that, the substitution block process is finished, and the process returns to the page writing process described above with reference to FIG. 23. At this time, the processes (process of Step S721 and the subsequent processes) are performed on the substitution block address secured in the substitution block process instead of the address of the block designated by the host computer 100.

(Process Procedure of Reading Process)

Figure 25:
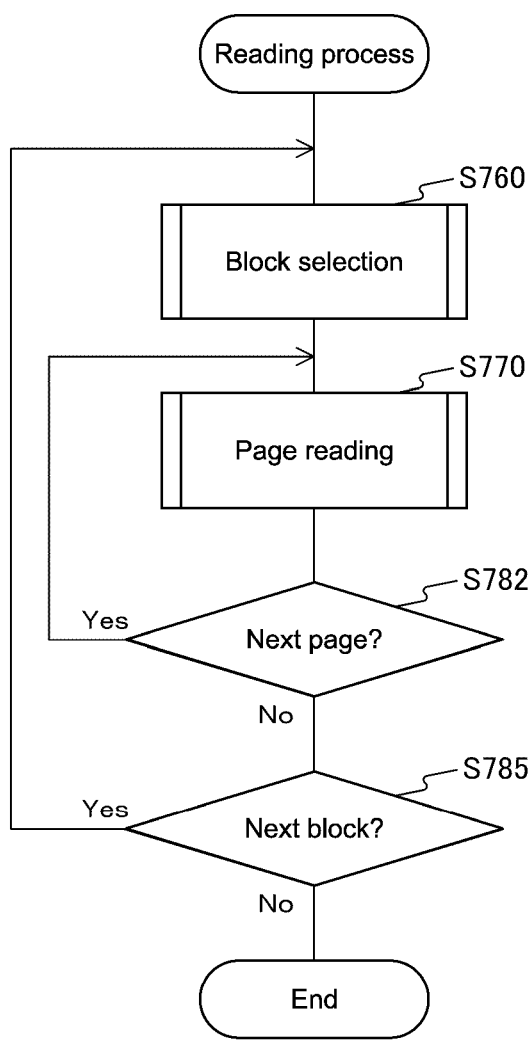
FIG. 25 is a diagram showing an exemplary process procedure of a reading process according to the third embodiment.

FIG. 25 is a diagram showing an exemplary process procedure of a reading process according to the third embodiment. When receiving a reading command from the host computer 100, the memory controller 200 starts the reading process. It should be noted that the reading command includes a designated page address. First, a block selection process (Step S760) is performed to select a block corresponding to the designated page address. Next, a page reading process (Step S770) is performed. In the case where the reading process is performed over a plurality of pages and there is a next reading page (Step S782: Yes), the page reading process (Step S770) is performed again. In the case where there is no next reading page in the selected block (Step S782: No), the process proceeds to Step S785. In the case where the reading process is performed over a plurality of blocks and there is a next reading block (Step S785: Yes), the process of Step S760 and the subsequent processes are performed. In the case where there is no next reading block (Step S785: No), the reading process is finished.

Figure 26:
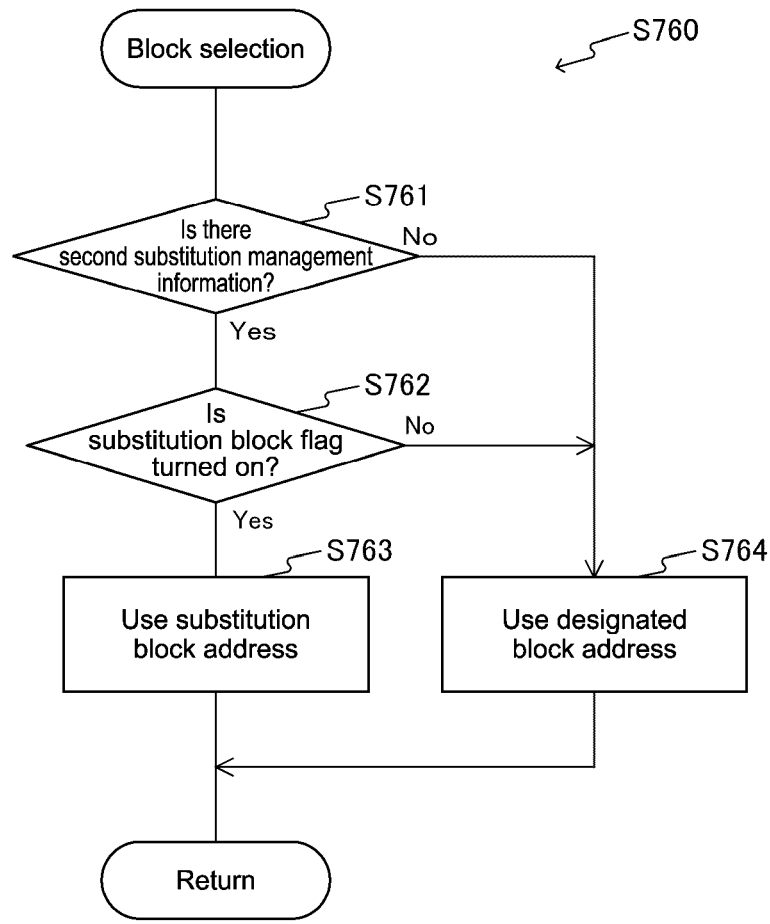
FIG. 26 is a diagram showing an exemplary process procedure of a block selection process (Step S760) according to the third embodiment.

FIG. 26 is a diagram showing an exemplary process procedure of a block selection process (Step S760) according to the third embodiment. The memory controller 200 is configured to check whether or not the second substitution management information is generated. As a result, in the case where the second substitution management information is not generated (Step S761: No), no substitution is performed. Therefore, the designated block address is used to perform the subsequent processes (Step S764). In the case where the second substitution management information is generated (Step S761: Yes), the process proceeds to Step S762. The memory controller 200 is configured to search for the substitution block flag of the second substitution management information corresponding to the reading target block. In the case where this flag is turned on, i.e., the block is substituted (Step S762: Yes), the substitution block address is used to perform the subsequent processes (Step S763). In the case where the block is not substituted (Step S762: No), the process returns to Step S764.

Figure 27:
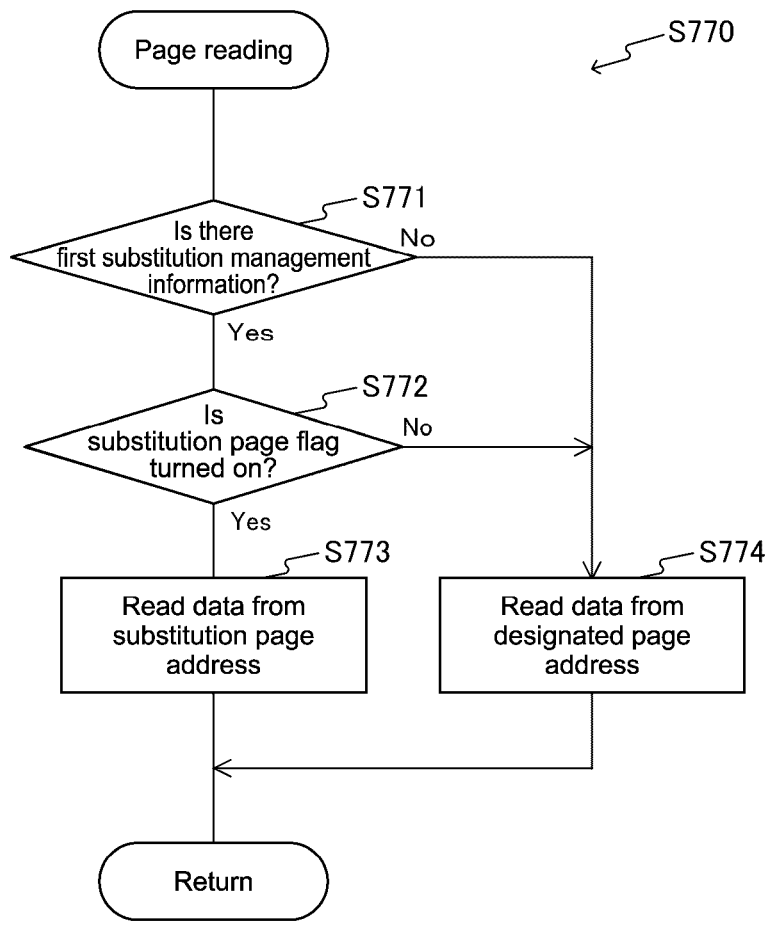
FIG. 27 is a diagram showing an exemplary process procedure of a page reading process (Step S770) according to the third embodiment.

FIG. 27 is a diagram showing an exemplary process procedure of a page reading process (Step S770) according to the third embodiment. The memory controller 200 is configured to check whether or not the first substitution management information is generated. As a result, in the case where no first substitution management information is generated (Step S771: No), no substitution is performed. Therefore, data is read from the designated page address (Step S774). In the case where the first substitution management information is generated (Step S771: Yes), the process proceeds to Step S772. The memory controller 200 is configured to search for the substitution page flag of the first substitution management information corresponding to the reading target page. In the case where this flag is turned on, i.e., the page is substituted (Step S772: Yes), data is read from the substitution page address (Step S773). In the case where the page is not substituted (Step S772: No), data is read from the designated page address (Step S774). After that, the page reading process is finished.

In the third embodiment, no substitution management information is held until the substitution process is performed. Therefore, it is possible to omit the process for searching for the substitution block flag and substitution page flag of the substitution management information in the process such as the block selection (Step S710) and the page writing (Step S720). Moreover, because data can be added to the substitution management information at each time when the substitution process is performed, the size of the substitution management information is in proportion to the number of performed substitution processes.

As described above, according to the third embodiment, it is possible to perform the reading process or the writing process at high speed by dynamically generating the first and second substitution management information. In particular, the effects are significant in a storage apparatus having low possibility of substitution process being performed such as a storage apparatus including a non-volatile memory having low possibility of an error page being generated. Moreover, as described above, data is added as necessary. Therefore, it is possible to make the size of the substitution management information the minimum size.

4. Fourth Embodiment

In the first and second embodiments, the minimum unit of access is the page of the non-volatile memory. In a fourth embodiment of the present disclosure, however, the page of the non-volatile memory further includes a plurality of banks.

The functional configuration as a system and the configuration of the memory controller 200 and the memory 300 are the same as those according to the first embodiment. In the following, the description thereof will be omitted.
(Configuration of Area in Memory 300)

Figure 28:
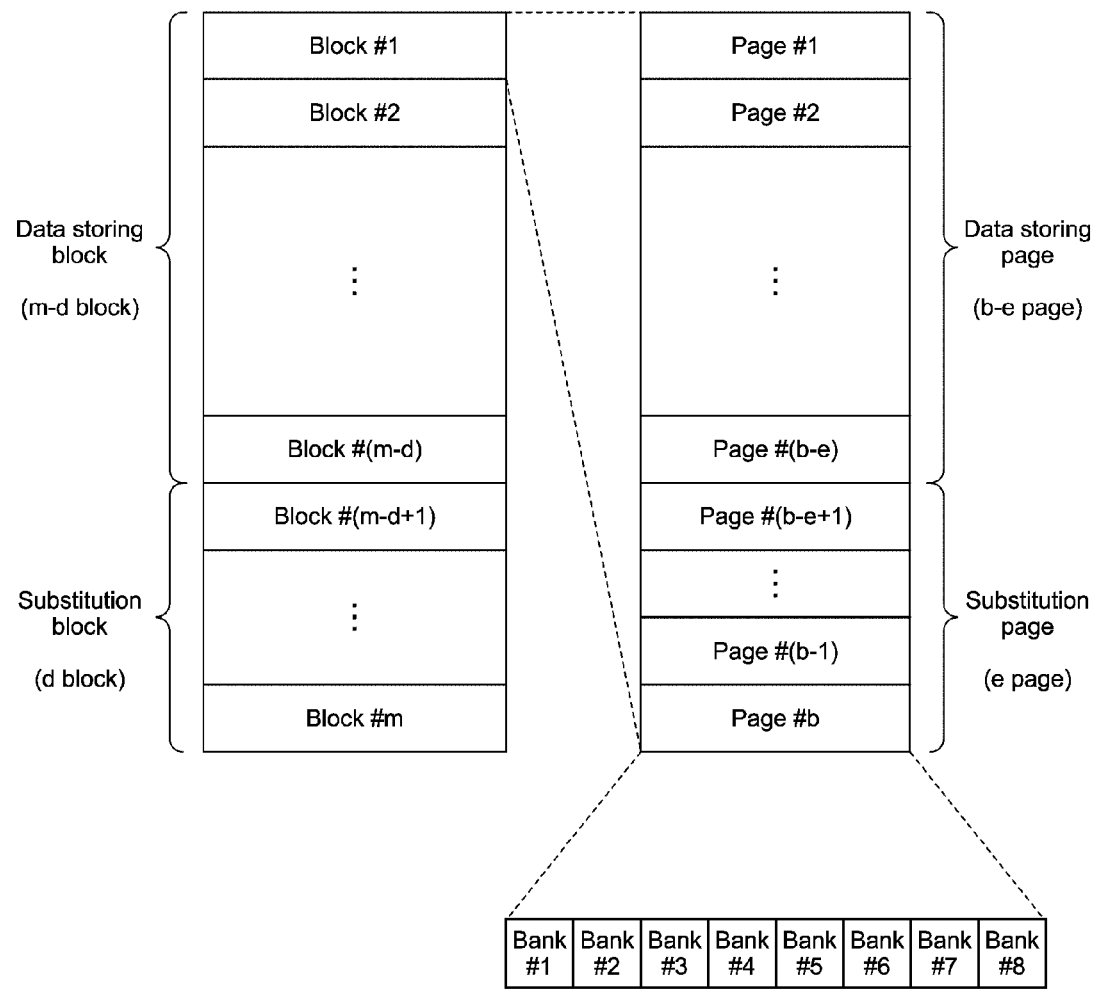
FIG. 28 is a diagram showing a configuration example of the area of a non-volatile memory according to a fourth embodiment of the present disclosure.

FIG. 28 is a diagram showing a configuration example of the area of a non-volatile memory according to the fourth embodiment. FIG. 28 shows an example in which the page in the non-volatile memory 320 includes 8 banks. From the memory controller 200, an access operation can be performed in a unit of bank. On the other hand, the host computer is capable of inputting/outputting data in a unit of page, and of writing/reading data at high speed. Moreover, in the fourth embodiment, the first substitution process is a substitution process in a unit of bank. Specifically, in the case where an error has occurred in a bank of the data storing page, a bank having the same bank number in the substitution page is substituted for the bank. It should be noted that the substitution of the error block could be performed by the similar way to the second substitution process. It should be noted that the non-volatile memory in which the page includes a plurality of banks is an example of a non-volatile memory according to an embodiment of the present disclosure.

Now, the case where an embodiment of the present disclosure is applied to a non-volatile memory of 2 G bytes is discussed. If the bank size is 512 bytes, the page size is 8 times as large as the bank size, i.e., 4,096 bytes. In the case where the block size is 32 pages, m is 16,384, d is 1,024, b is 32, and e is 2, for example.

Figure 29A:
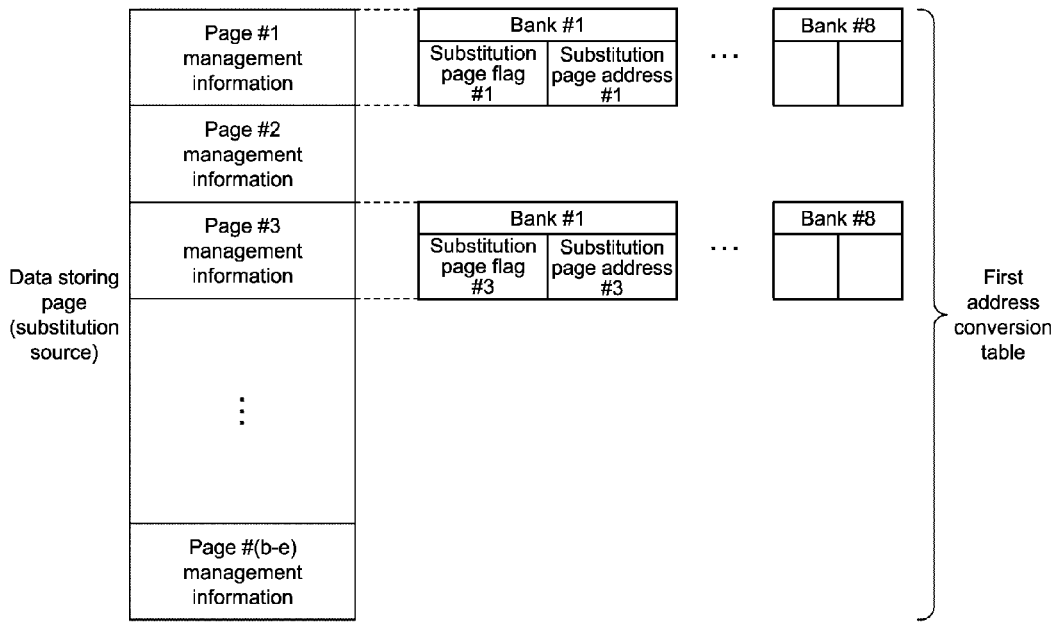
FIGS. 29A and 29B are each a diagram showing an example of first substitution management information according to a fourth embodiment of the present disclosure.
Figure 29B:
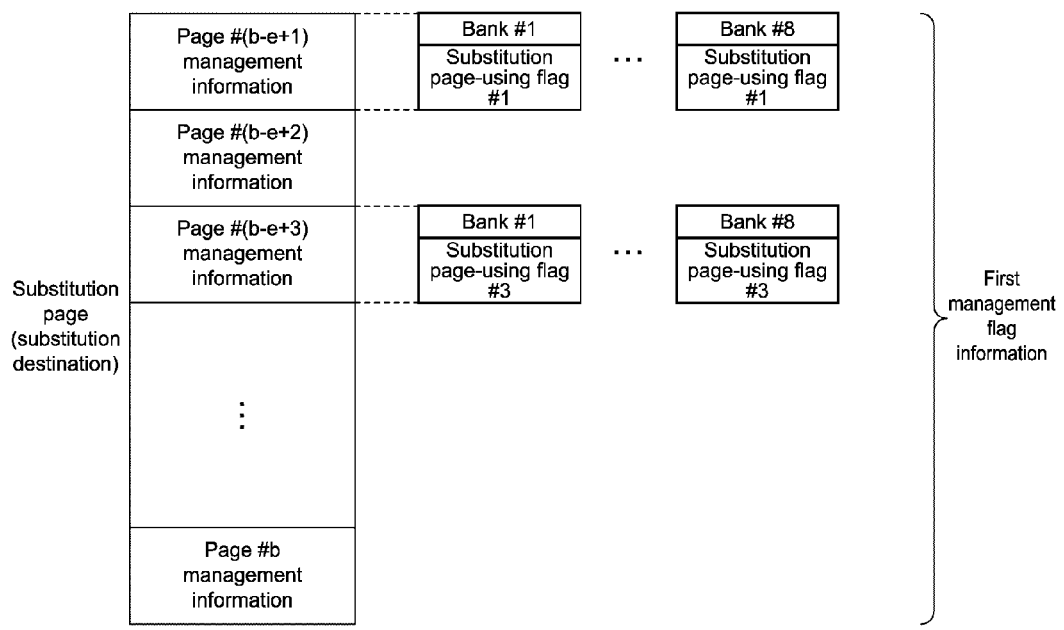

FIG. 29 are each a diagram showing an example of the first substitution management information according to the fourth embodiment. The first substitution management information according to an embodiment of the present disclosure includes a substitution page flag, a substitution page address, and a substitution page-using flag for each bank. Other than this, the same configuration as that of the first substitution management information described above with reference to FIG. 5 can be employed. Moreover, the second substitution management information can be the same as the management information shown in FIG. 6.

Next, the writing operation and the reading operation according to the above-mentioned embodiment will be described with reference to the drawings. It should be noted that in this embodiment, the memory controller 200 is configured to store a pointer (Bank) that represents the bank number. In the following description, data writing and data reading is performed on the bank represented by the Bank. Moreover, only the flag corresponding to the bank represented by the Bank, which is included in the first substitution management information or the like, is operated.
(Process Procedure of Writing Process)

Figure 30:
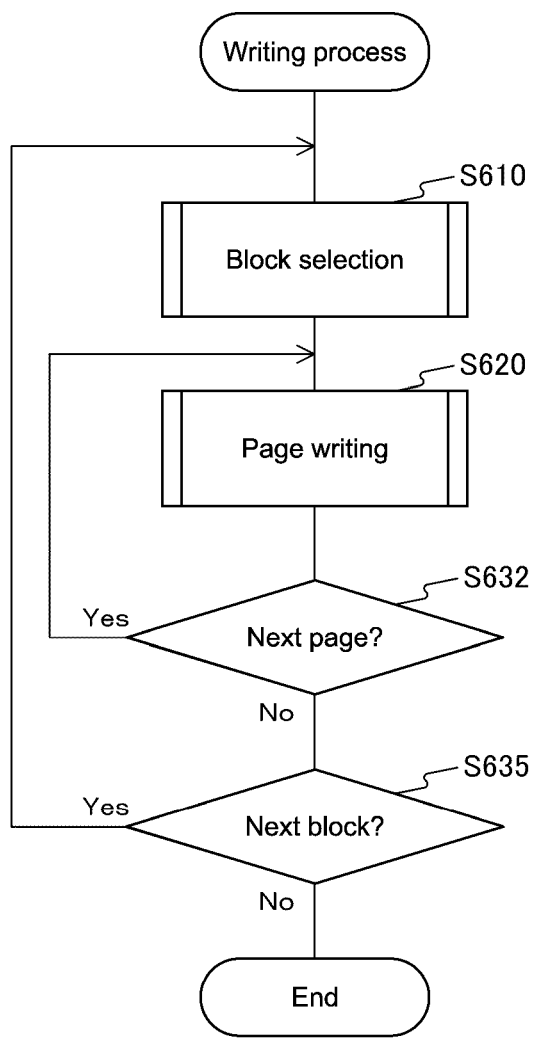
FIG. 30 is a diagram showing an exemplary process procedure of a writing process according to the fourth embodiment.

FIG. 30 is a diagram showing an exemplary process procedure of a writing process according to the fourth embodiment. When receiving a writing command from the host computer 100, the memory controller 200 starts the writing process. It should be noted that the writing command includes the designated page address being a writing target and the writing data. First, a block selection process (Step S610) is performed to select the block corresponding to the designated page address. Next, a page writing process (Step S620) is performed. In the case where the writing process is performed over a plurality of pages and there is a next writing page (Step S632: Yes), the page writing process (Step S620) is performed again. In the case where there is no next writing page (Step S632: No) in the selected block, the process proceeds to Step S635. In the case where the writing process is performed over a plurality of blocks and there is a next wiring block (Step S635: Yes), the process of Step S610 and the subsequent processes are performed again. In the case where there is no next writing block (Step S635: No), the writing process is finished.

Figure 31:
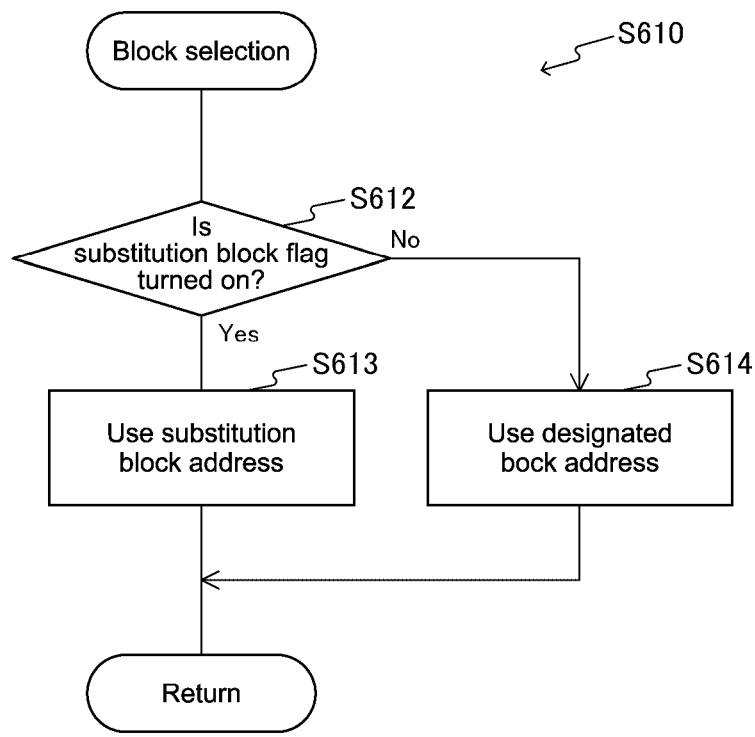
FIG. 31 is a diagram showing an exemplary process procedure of a block selection process (Step S610) according to the fourth embodiment.

FIG. 31 is a diagram showing an exemplary process procedure of a block selection process (Step S610) according to the fourth embodiment. The memory controller 200 is configured to search for a substitution block flag of the second substitution management information corresponding to the writing target block. In the case where this flag is turned on, i.e., the block is substituted (Step S612: Yes), the substitution block address is used to perform the subsequent processes (Step S613). In the case where the block is not substituted (Step S612: No), the designated block address is used to perform the subsequent processes (step S614).

Figure 32:
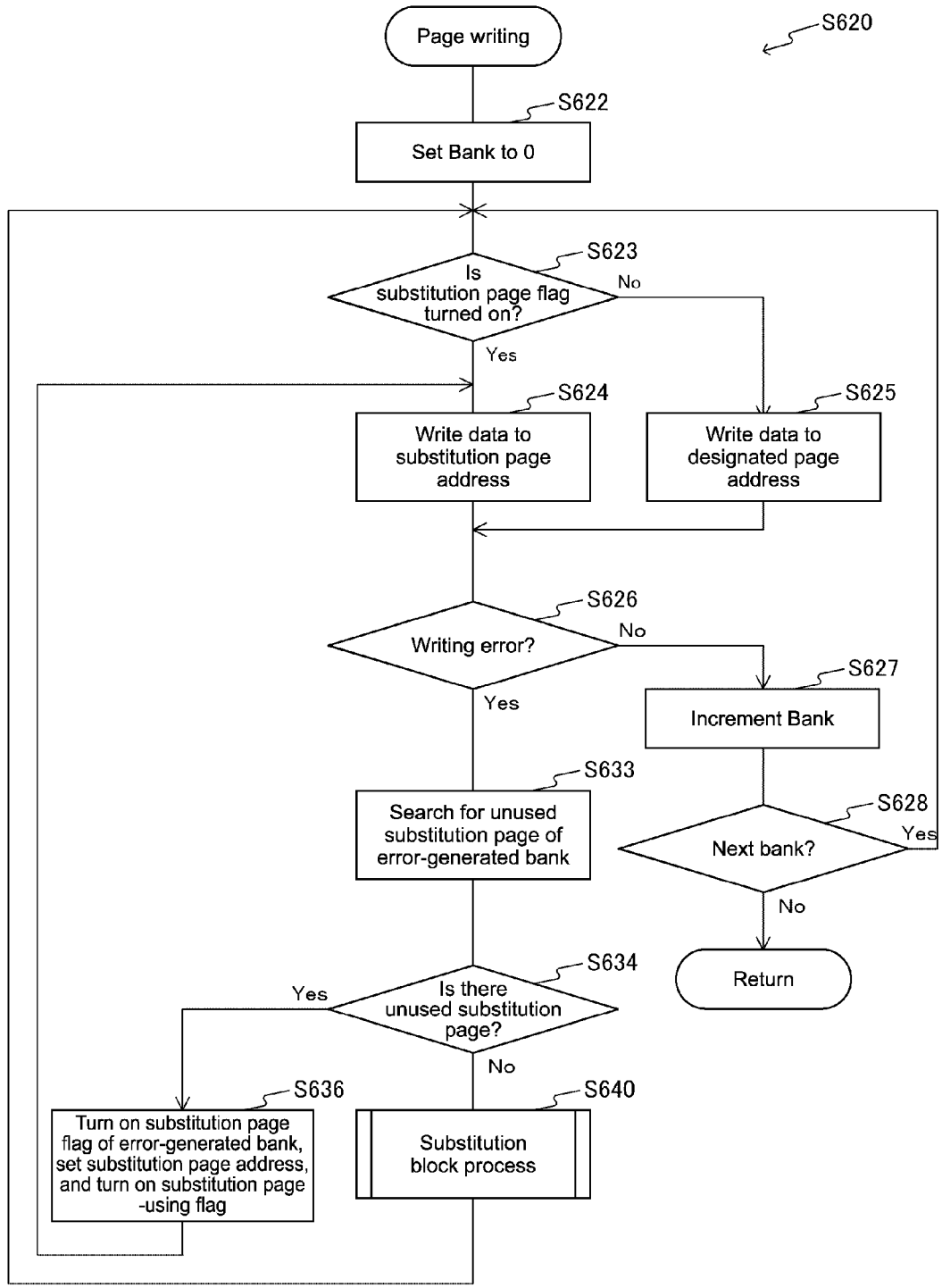
FIG. 32 is a diagram showing an exemplary process procedure of a page writing process (Step S620) according to the fourth embodiment.

FIG. 32 is a diagram showing an exemplary process procedure of a page writing process (Step S620) according to the fourth embodiment. The memory controller 200 is configured to set the Bank to 0 for initialization (Step S622). Next, the substitution page flag of the first substitution management information corresponding to the writing target page is searched for. In the case where this flag is turned on, i.e., the page is substituted (Step S623: Yes), data is written to the substitution page address (Step S624). In the case where the page is not substituted (Step S623: No), data is written to the designated page address (Step S625). After that, in the case where a writing error has not occurred (Step S626: No), the Bank is incremented (Step S627). As a result, in the case where writing is finished for all banks and there is no next bank (step S628: No), the page writing process is finished. In the case where there is a next bank (Step S628: Yes), the process of Step S623 and the subsequent processes are performed again.

In the case where a writing error has occurred (Step S626: Yes), the memory controller 200 searches for the unused substitution page corresponding to an error-generated bank (error bank) to perform the substitution process (Step S633). This process is performed by searching for the bank of the substitution page in the first substitution management information for which the substitution page-using flag is not turned on, which has the same bank number as the error bank. As a result, in the case where there is an unused substitution page (step S634: Yes), the substitution page flag of the first substitution management information is turned on, the address of the unused substitution page is set to the substitution page address, and the substitution page-using flag is turned on (Step S636). After that, the process returns to Step S624, and the data writing process is performed again. In the case where there is no unused substitution page, e.g., all banks of the substitution page is used (Step S634: No), a substitution block process (Step S640) is performed before the page writing process is performed again.

Figure 33:
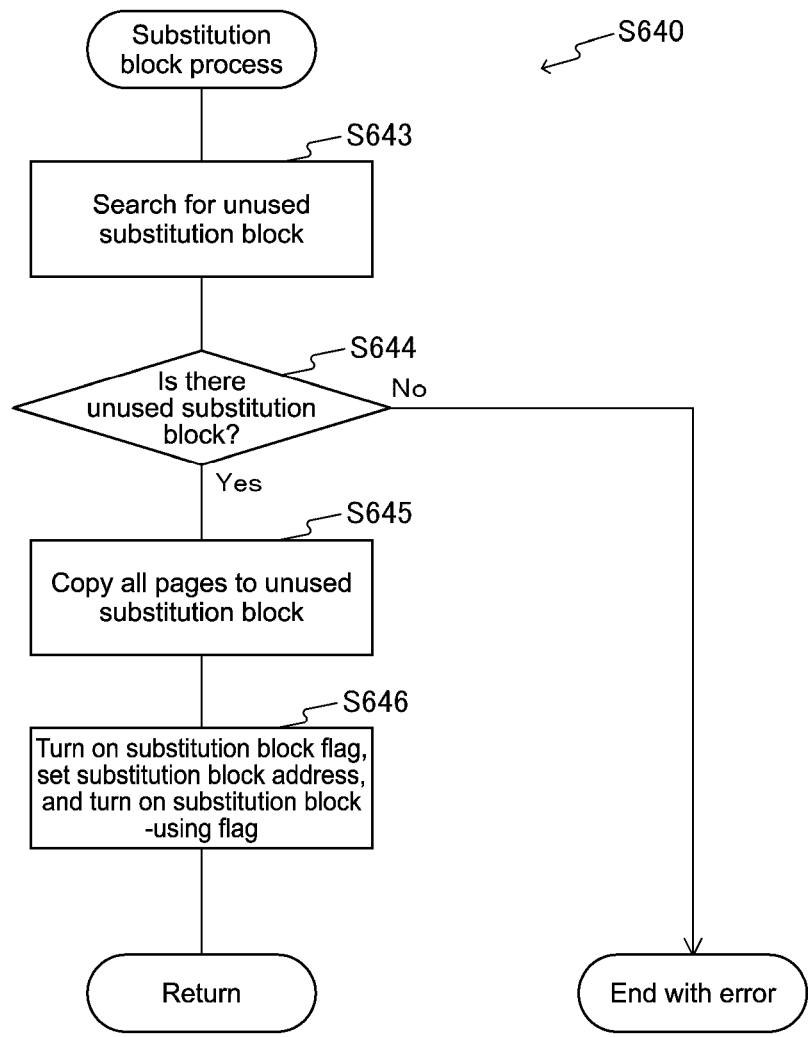
FIG. 33 is a diagram showing an exemplary process procedure of a substitution block process (Step S640) according to the fourth embodiment.

FIG. 33 is a diagram showing an exemplary process procedure of a substitution block process (Step S640) according to the fourth embodiment. The memory controller 200 is configured to search for an unused substitution block (Step S643). This process is performed by searching for the substitution block-using flag of the second substitution management information. As a result, in the case where there is no unused substitution block (Step S644: No), the substitution process is hard to perform. The memory controller 200 is configured to notify generation of an error of the host computer, and to finish the writing process.

In the case where there is an unused substitution block (Step S644: Yes), the memory controller 200 copies data stored in all pages included in the designated block to the page of the unused substitution block (Step S645). After that, the substitution block flag of the second substitution management information is turned on, the address of the unused substitution block is set to the substitution block address, and the substitution block-using flag is turned on (Step S646). After that, the substitution block process is finished, and the process returns to the page writing process described above with reference to FIG. 32. At this time, the processes (process of Step S623 and the subsequent processes) are performed on the substitution block address secured in the substitution block process instead of the address of the block designated by the host computer 100.

(Process Procedure of Reading Process)

Figure 34:
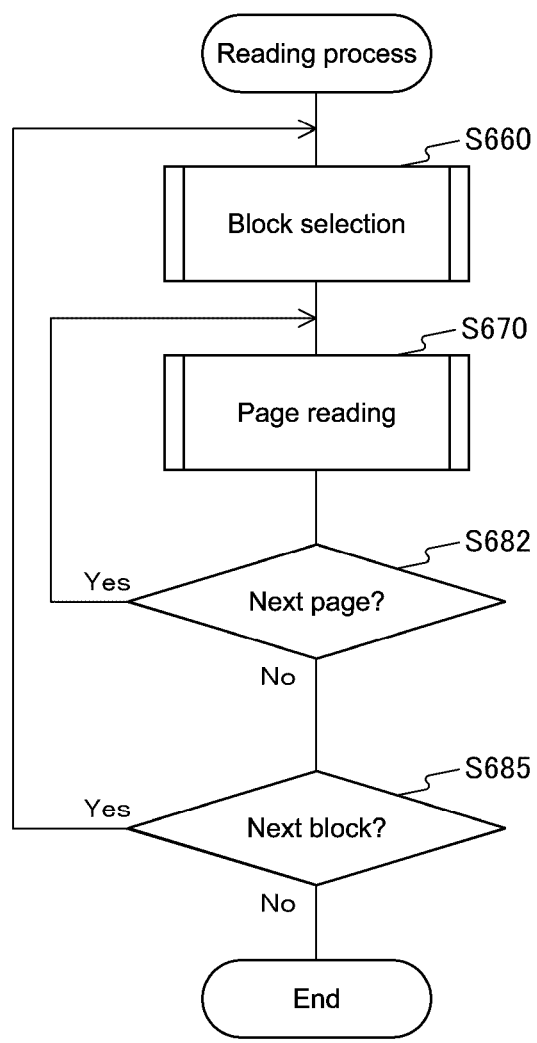
FIG. 34 is a diagram showing an exemplary process procedure of a reading process according to the fourth embodiment.

FIG. 34 is a diagram showing an exemplary process procedure of a reading process according to the fourth embodiment. When receiving a reading command from the host computer 100, the memory controller 200 starts the reading process. It should be noted that the reading command includes a designated page address. First, a block selection process (Step S660) is performed to select the block corresponding to the designated page address. Next, a page reading process (Step S670) is performed. In the case where the reading process is performed over a plurality of pages and there is a next reading page (Step S682: Yes), the page reading process (Step S670) is performed again. In the case where there is no next reading page in the selected block (Step S682: No), the process proceeds to Step S685. In the case where the reading process is performed over a plurality of blocks and there is a next reading block (Step S685: Yes), the process of Step S660 and the subsequent processes are performed again. In the case where there is no next reading block (Step S685: No), the reading process is finished.

Figure 35:
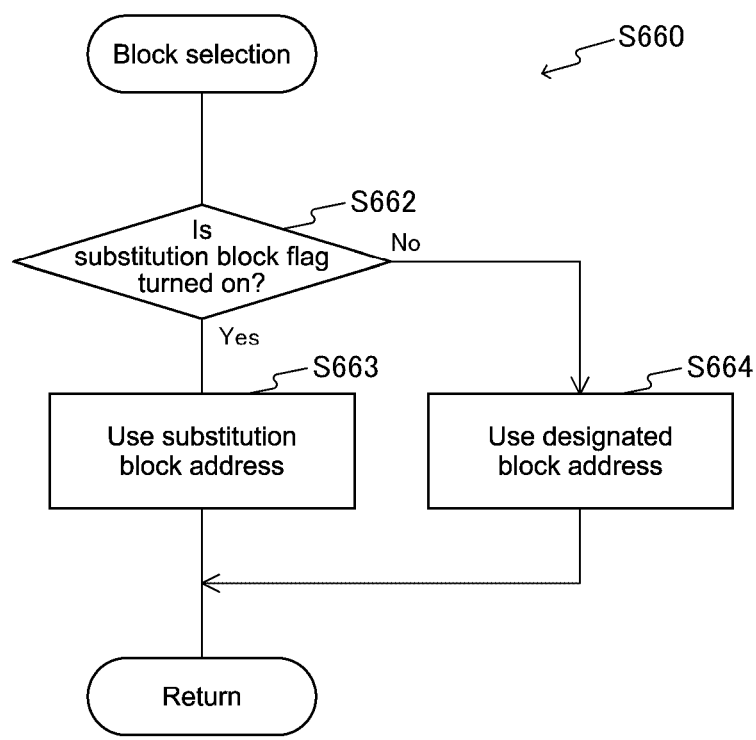
FIG. 35 is a diagram showing an exemplary process procedure of a block selection process (Step S660) according to the fourth embodiment.

FIG. 35 is a diagram showing an exemplary process procedure of a block selection process (Step S660) according to the fourth embodiment. The memory controller 200 is configured to search for the substitution block flag of the second substitution management information corresponding to the reading target block. In the case where this flag is turned on, i.e., the block is substituted (Step S662: Yes), the substitution block address is used to perform the subsequent processes (Step S663). In the case where the block is not substituted (Step S662: No), the designated block address is used to perform the subsequent processes (Step S664).

Figure 36:
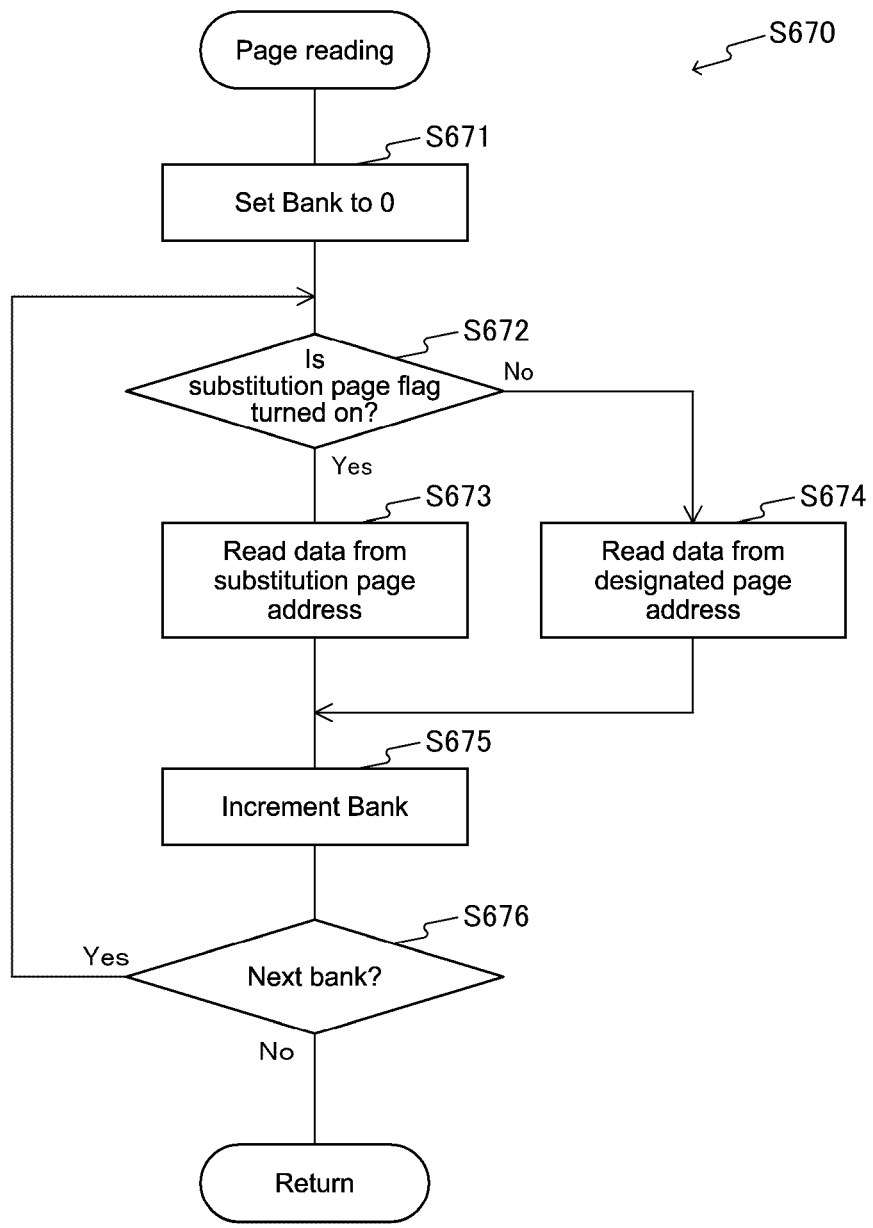
FIG. 36 is a diagram showing an exemplary process procedure of a page reading process (Step S670) according to the fourth embodiment.

FIG. 36 is a diagram showing an exemplary process procedure of a page reading process (Step S670) according to the fourth embodiment. The memory controller 200 is configured to set the Bank to 0 for initialization (Step S671). Next, the substitution page flag of the first substitution management information corresponding to the reading target page is searched for. In the case where this flag is turned on, i.e., the page is substituted (Step S672: Yes), data is read from the substitution page address (Step S673). In the case where the page is not substituted (Step S672: No), data is read from the designated page address (Step S674). After that, the Bank is incremented (Step S675). As a result, in the case where writing is finished for all banks and there is no next bank (Step S676: No), the page reading process is finished. In the case where there is a next bank (Step S676: Yes), the process of Step S672 and the subsequent processes are performed again.

As described above, according to the fourth embodiment, it is possible to reduce the size of the substitution management information by performing the first and second substitution processes even if the page of the non-volatile memory 320 includes a plurality of banks.

5. Fifth Embodiment

In the fourth embodiment, the logical page is used as the physical page as it is. In a fifth embodiment of the present disclosure, however, the memory controller 200 has an address conversion function of converting a logical page address into a physical page address.

The functional configuration as a system and the configuration of the memory controller 200 and the memory 300 are the same as those according to the first embodiment. Moreover, the configuration of the area of the non-volatile memory is the same as that according to the fourth embodiment. In the following, the description thereof will be omitted.

Figure 37A:
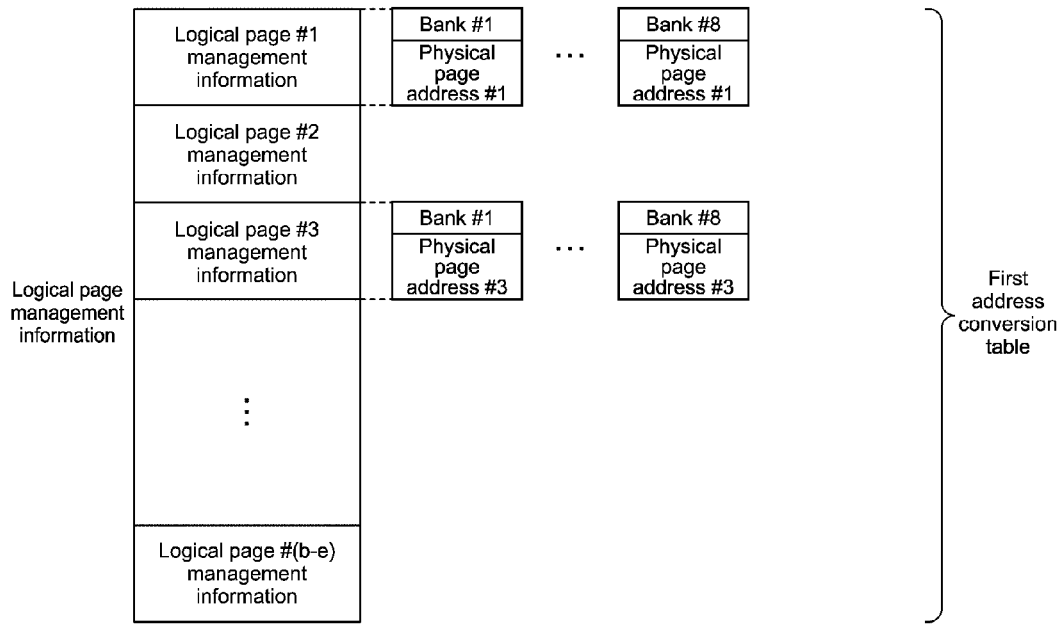
FIGS. 37A and 37B are each a diagram showing an example of first substitution management information according to a fifth embodiment of the present disclosure.
Figure 37B:
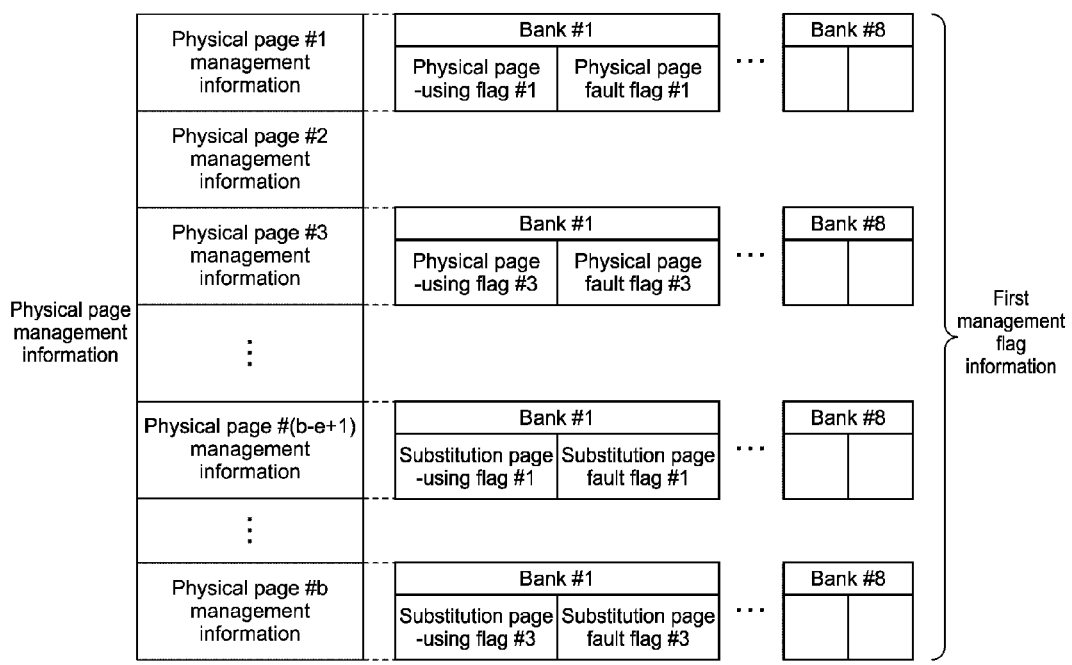

FIG. 37 are each a diagram showing an example of the first substitution management information according to the fifth embodiment. The first substitution management information according to an embodiment of the present disclosure includes a physical page address, a physical page-using flag, and a physical page fault flag for each bank. Other than this, the same configuration as the first substitution management information described above with reference to FIG. 14 can be employed. Moreover, the second substitution management information can be the same as the management information shown in FIG. 15.

Next, the writing operation and the reading operation according to the above-mentioned embodiment will be described with reference to the drawings. The operation of the Bank being a pointer that represents the bank number is the same as that according to the fourth embodiment.

(Process Procedure of Writing Process)

Figure 38:
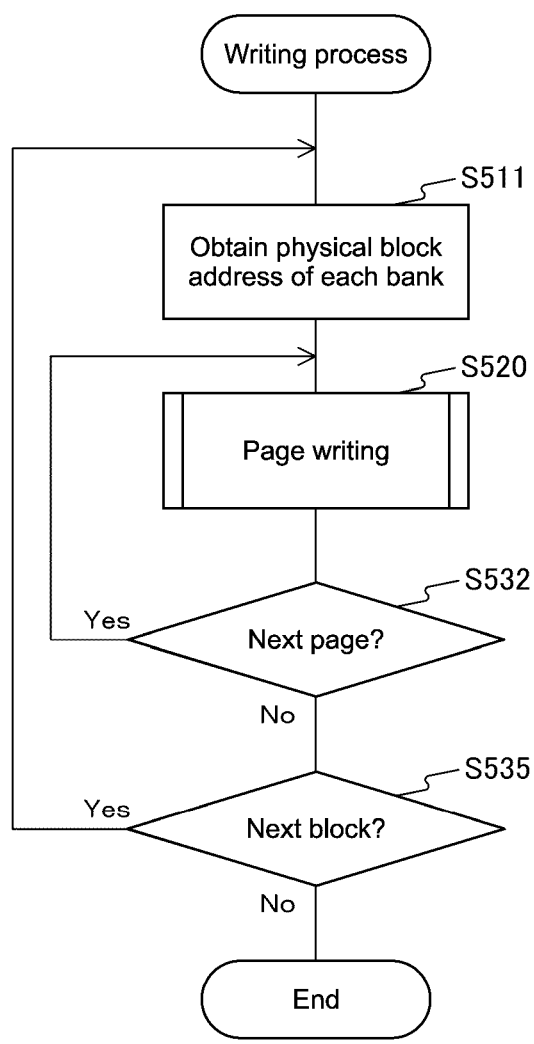
FIG. 38 is a diagram showing an exemplary process procedure of a writing process according to the fifth embodiment.

FIG. 38 is a diagram showing an exemplary process procedure of a writing process according to the fifth embodiment. When receiving a writing command from the host computer 100, the memory controller 200 starts the writing process. It should be noted that the writing command includes a logical page address being a writing target and writing data. First, the memory controller 200 obtains the physical block address of each bank (Step S511). This process is performed by obtaining the physical block address from the second address conversion table of the second substitution management information. Next, a page writing process (Step S520) is performed. In the case where the writing process is performed over a plurality of pages and there is a next writing page (Step S532: Yes), the page writing process (Step S520) is performed again. In the case where there is no next writing page in the obtained block (Step S532: No), the process proceeds to Step S535. In the case where the writing process is performed over a plurality of blocks and there is a next writing block (Step S535: Yes), the process of Step S511 and the subsequent processes are performed again. In the case where there is no next writing block (Step S535: No), the writing process is finished.

Figure 39:
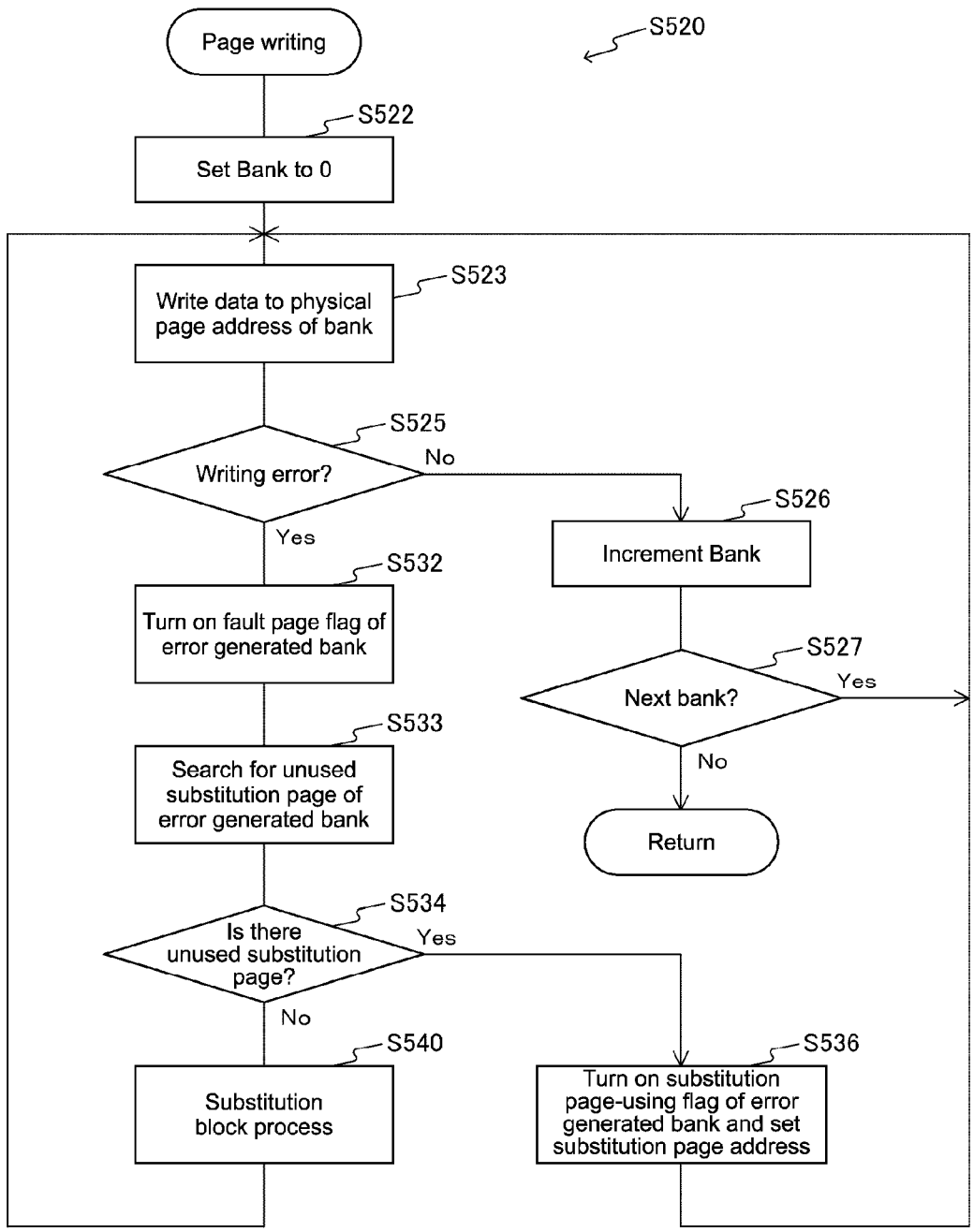
FIG. 39 is a diagram showing an exemplary process procedure of a page writing process (Step S520) according to the fifth embodiment.

FIG. 39 is a diagram showing an exemplary process procedure of a page writing process (Step S520) according to the fifth embodiment. The memory controller 200 is configured to set the Bank to 0 for initialization (Step S522). Next, the physical page address of the bank is obtained from the first address conversion table of the first substitution management information, and data is written to the physical page address (Step S523). After that, in the case where a writing error has not occurred (Step S525: No), the Bank is incremented (Step S526). As a result, in the case where writing is finished for all banks and there is no next bank (step S527: No), the page writing process is finished. In the case where there is a next bank (step S527: Yes), the process of Step S523 and the subsequent processes are performed again.

In the case where a writing error has occurred (Step S525: Yes), the memory controller 200 turns on the physical page fault flag of the first substitution management information corresponding to the physical page (Step S532). Next, in order to perform the substitution process, an unused substitution page is searched for (step S533). This process is performed by searching for the bank of the substitution page in the first substitution management information for which the substitution page-using flag and the substitution page fault flag are not turned on, which has the same bank number as the error bank. As a result, in the case where there is an unused substitution page (Step S534: Yes), the substitution page-using flag of the first substitution management information corresponding to the unused substitution page is turned on. Moreover, the address of the unused substitution page is set as the physical page address corresponding to the logical page address being a writing target in the first address conversion table (Step S536). After that, the process returns to S523, and the data writing process is performed again. In the case where there is no unused substitution page, e.g., all banks of the substitution page are used (Step S534: No), a substitution block process (Step S540) is performed before the page writing process is performed again.

Figure 40:
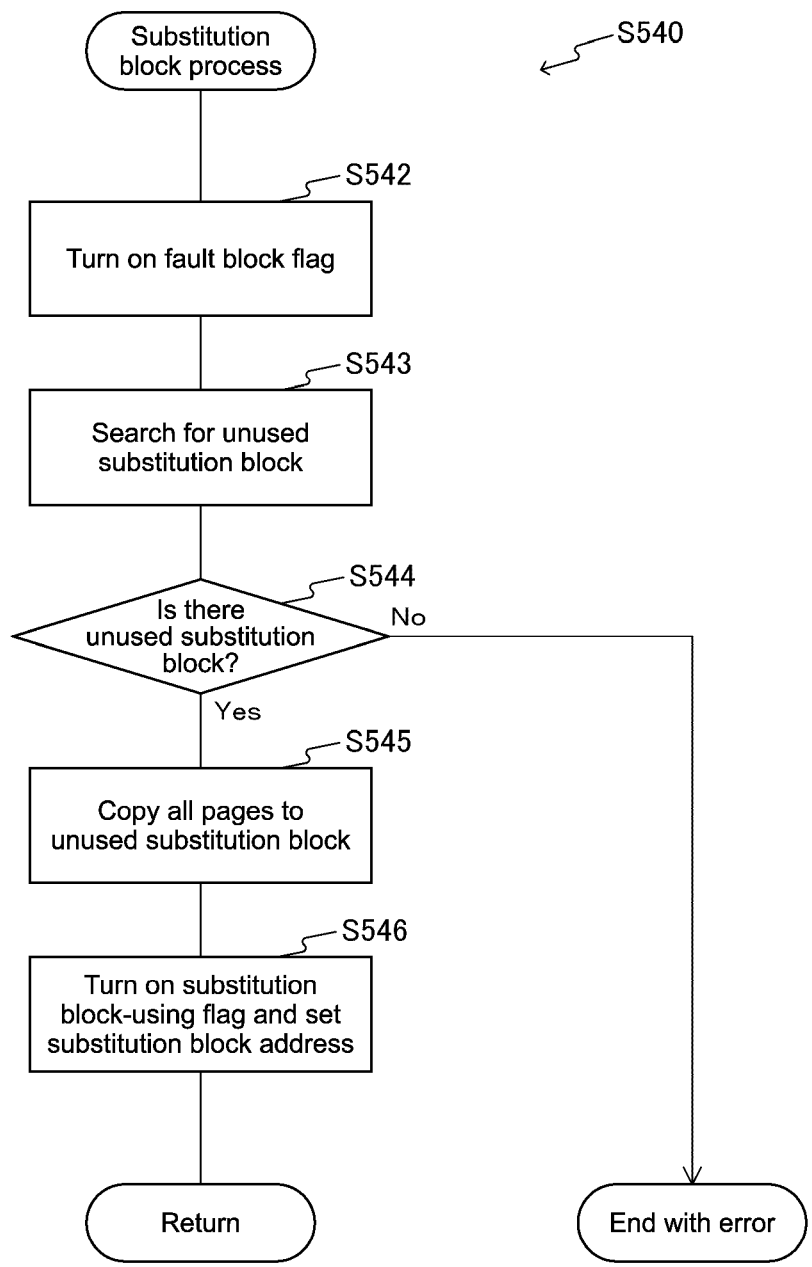
FIG. 40 is a diagram showing an exemplary process procedure of a substitution block process (Step S540) according to the fifth embodiment.

FIG. 40 is a diagram showing an exemplary process procedure of a substitution block process (Step S540) according to the fifth embodiment. The memory controller 200 is configured to turn on the physical block fault flag of the second substitution management information corresponding to the error block (Step S542). Next, an unused substitution block is searched for (Step S543). This process is performed by searching for a substitution block-using flag of the second substitution management information. As a result, in the case where there is no unused substitution block (Step S544: No), the substitution process is hard to perform. The memory controller 200 is configured to notify generation of an error of the host computer, and to finish the writing process.

In the case where there is an unused substitution block (Step S544: Yes), the memory controller 200 copies data stored in all pages included in the designated block to the page the unused substitution block (Step S545). After that, the substitution block-using flag of the second substitution management information corresponding to the substitution block is turned on. Moreover, the address of the unused substitution page is set to the second address conversion table of the second substitution management information as the physical page address corresponding to the logical page address being a writing target (Step S546). After that, the substitution block process is finished, and the process returns to the page writing process described above with reference to FIG. 39. At this time, the processes (process of Step S523 and the subsequent processes) are performed on the address of the substitution block secured in the substitution block process in accordance with the second address conversion table of the second substitution management information.

(Process Procedure of Reading Process)

Figure 41:
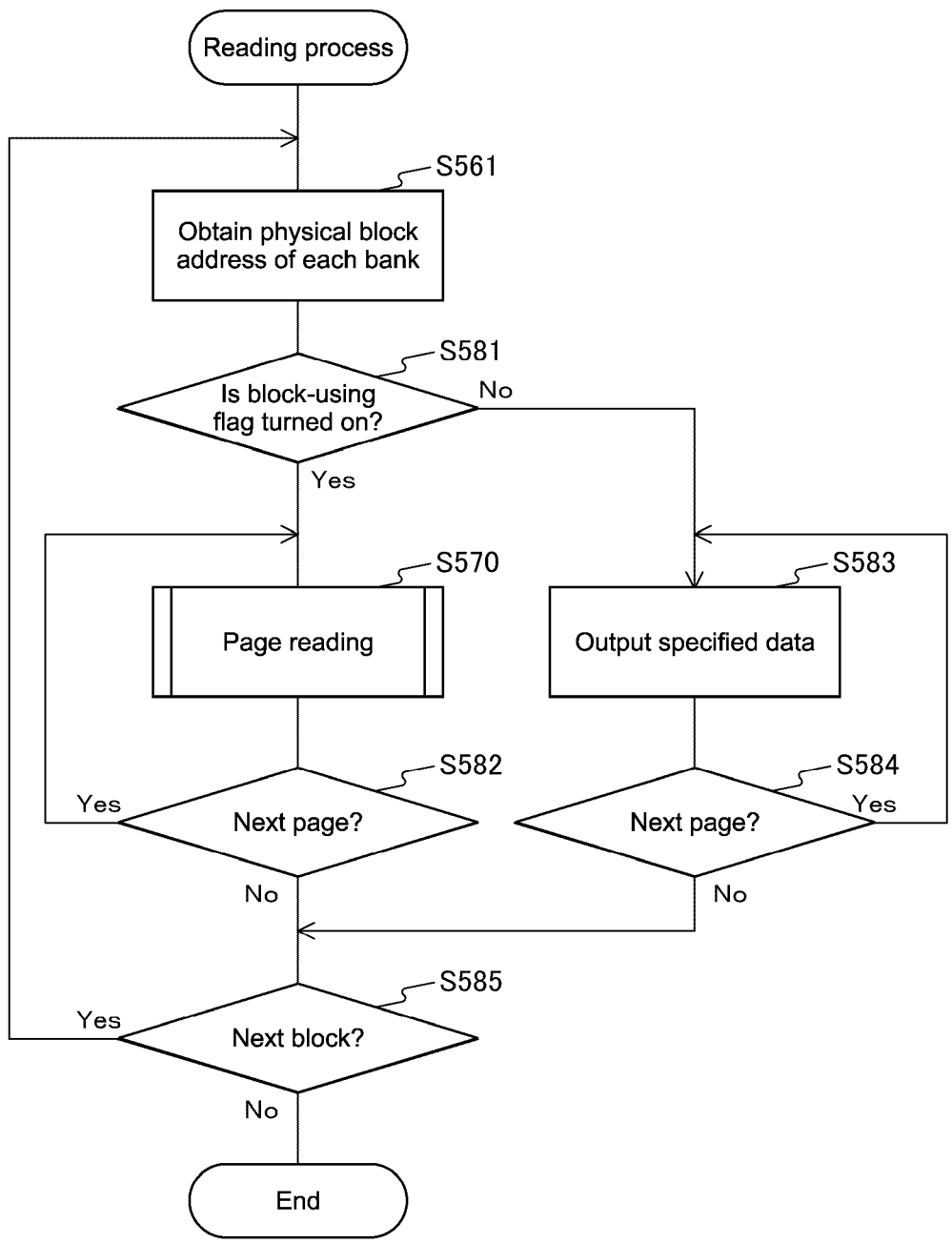
FIG. 41 is a diagram showing an exemplary process procedure of a reading process according to the fifth embodiment.

FIG. 41 is a diagram showing an exemplary process procedure of a reading process according to the fifth embodiment. When receiving a reading command from the host computer 100, the memory controller 200 starts the reading process. It should be noted that the reading command includes a designated page address being a reading target. First, the physical block address of each bank is obtained (Step S561). This process is performed by obtaining the physical block address from the second address conversion table of the second substitution management information. Next, the physical block-using flag corresponding to the physical block address is searched for. In the case where this flag is turned on, i.e., the block is being used (Step S581: Yes), a page reading process (Step S570) is performed. In the case where the reading process is performed over a plurality of pages and there is a next reading page (Step S582: Yes), the page reading process (Step S570) is performed again. In the case where there is no next reading page in the obtained block (Step S582: No), the process proceeds to Step S585.

On the other hand, in the case where the page is not used (Step S581: No), specified data is output to the host computer 100 (Step S583). In the case where the reading process is performed over a plurality of pages and there is a next reading page (Step S584: Yes), specified data is output (Step S583) again. In the case where there is no next reading page (Step S584: No), the process proceeds to Step S585. In the case where the reading process is performed over a plurality of blocks and there is a next reading block (Step S585: Yes), the process of Step S561 and the subsequent processes are performed again. In the case where there is no next reading block (Step S585: No), the reading process is finished.

Figure 42:
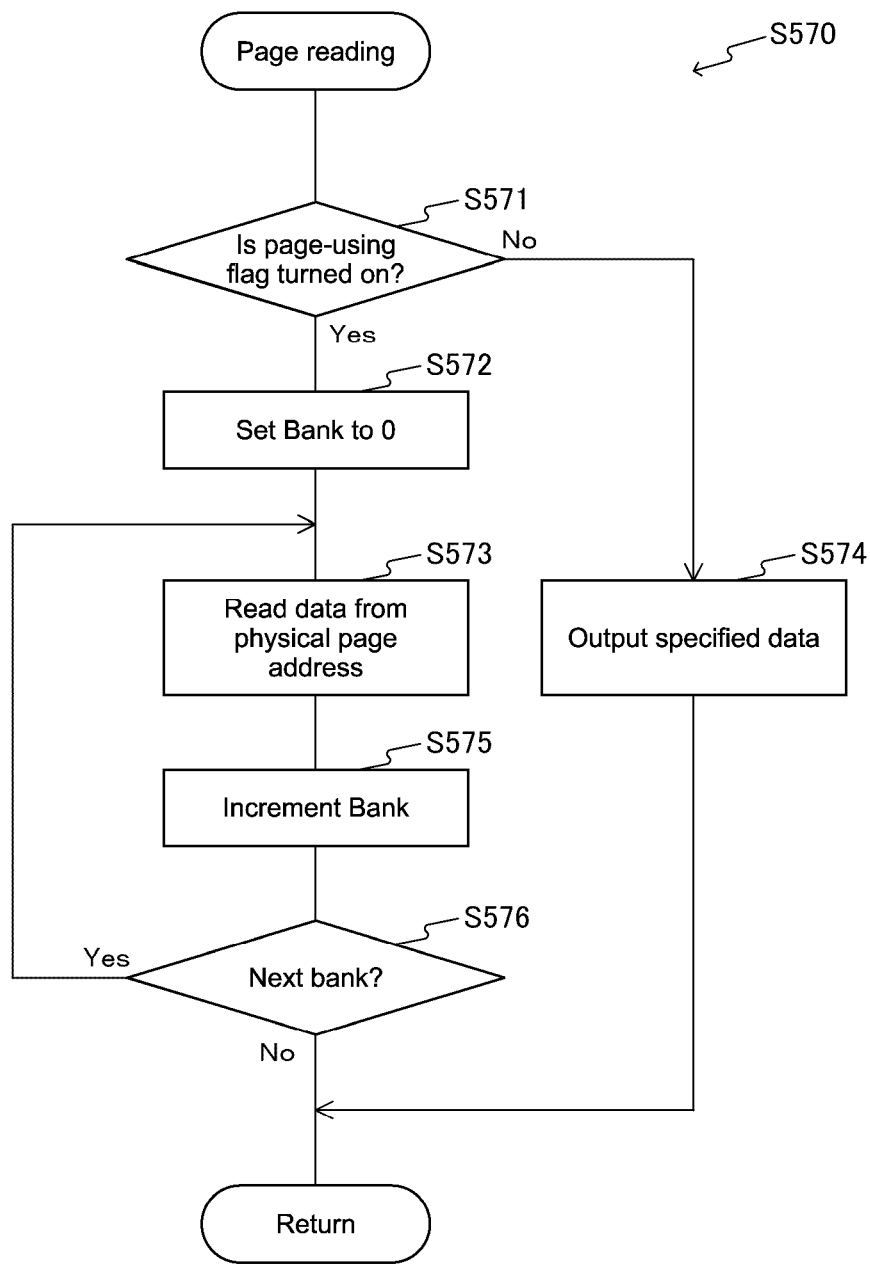
FIG. 42 is a diagram showing an exemplary process procedure of a page reading process (Step S570) according to the fifth embodiment.

FIG. 42 is a diagram showing an exemplary process procedure of a page reading process (Step S570) according to the fifth embodiment. The memory controller 200 is configured to obtain the physical page address from the first address conversion table of the first substitution management information corresponding to the reading target page, and to search for the physical page-using flag corresponding to the physical page address. In the case where this flag is turned on, i.e., the page is being used (Step S571: Yes), the memory controller 200 sets the Bank to 0 for initialization (Step S572). Data is read from the physical page address (Step S573). After that, the Bank is incremented (Step S575). As a result, in the case where writing is finished for all banks and there is no next bank (Step S576: No), the page reading process is finished. In the case where there is a next bank (Step S576: Yes), the process of Step S573 and the subsequent processes are performed again. On the other hand, in the case where the page is not used (Step S571: No), specified data is output to the host computer 100 (Step S574), and the page reading process is finished.

As described above, according to the fifth embodiment, it is possible to reduce the size of the substitution management information by performing the first and second substitution processes even if the page of the non-volatile memory 320 includes a plurality of banks. Moreover, because the memory controller 200 has the address conversion function, it is possible to prevent access concentration to a specific page.

6. Sixth Embodiment

In the first to fifth embodiments, the memory controller 200 performs the first and the second substitution processes. On the other hand, in a sixth embodiment of the present disclosure, a memory controller performs the first substitution process, and a host computer performs the second substitution process. In this case, it is possible to perform the substitution process in a unit of block with the file system management information in the host computer, which includes the second substitution management information.

Figure 43:
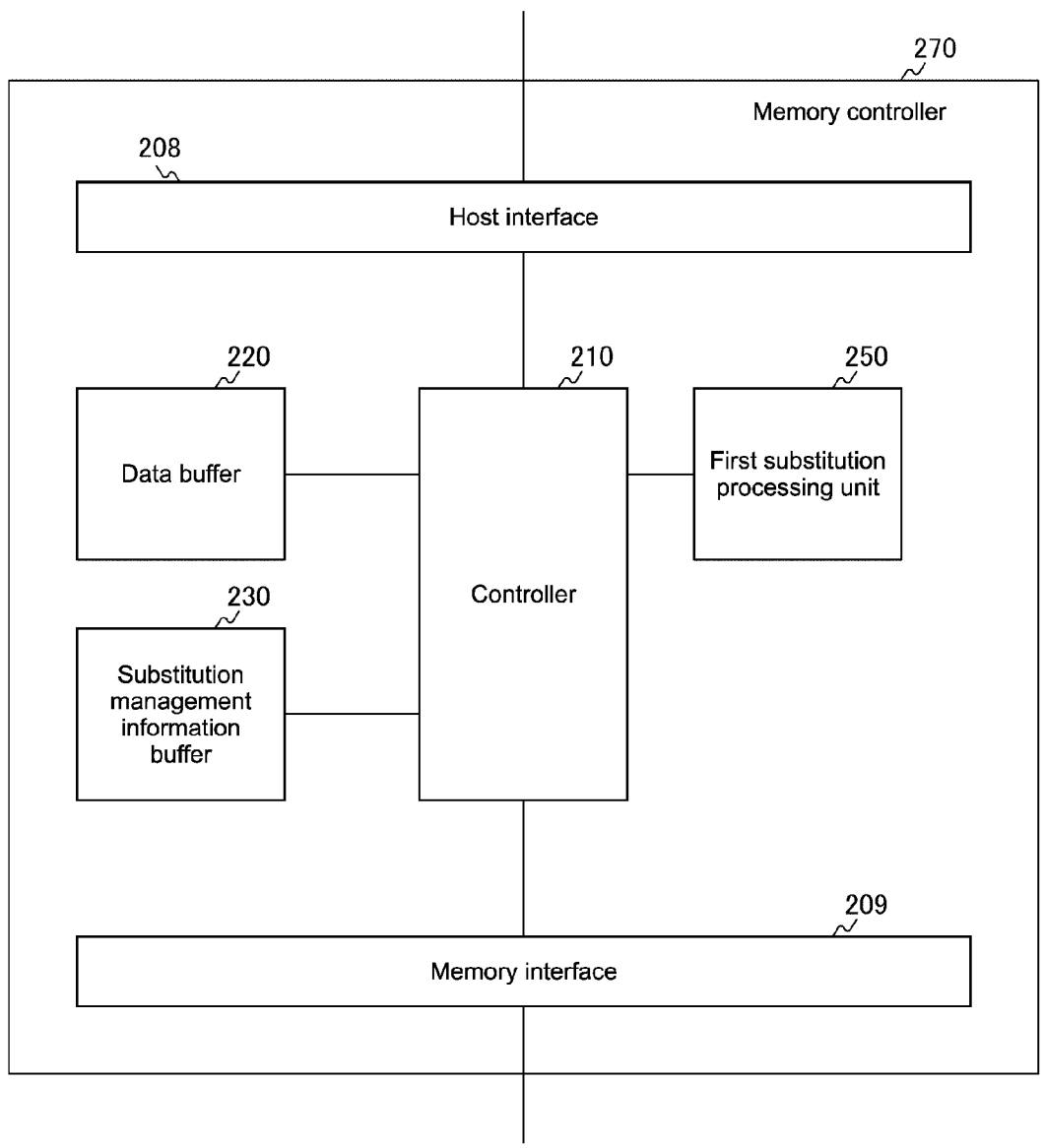
FIG. 43 is a diagram showing a configuration example of a memory controller according to a sixth embodiment of the present disclosure.

FIG. 43 is a diagram showing a configuration example of a memory controller according to the sixth embodiment. A memory controller 270 can have a configuration obtained by excluding the second substitution processing unit 260 from the memory controller 200. The configuration of the memory controller other than this, the functional configuration as a system, and the like are the same as those according to the first embodiment. In the following, the description thereof will be omitted.

Next, the writing process and the reading process according to the above-mentioned embodiment will be described with reference to the drawings. It should be noted that in the sixth embodiment, the first and second substitution management information described above with reference to FIG. 5 and FIG. 6 is used. Of these, the second substitution management information is stored in the memory in the host computer. Moreover, because the second substitution process is performed by the host computer, the procedure of the substitution process performed by the host computer 100 in addition to the memory controller 270 has been described. It should be noted that the host computer 100 that performs the second substitution process is an example of the host computer according to an embodiment of the present disclosure.

(Process Procedure of Writing Process)

Figure 44:
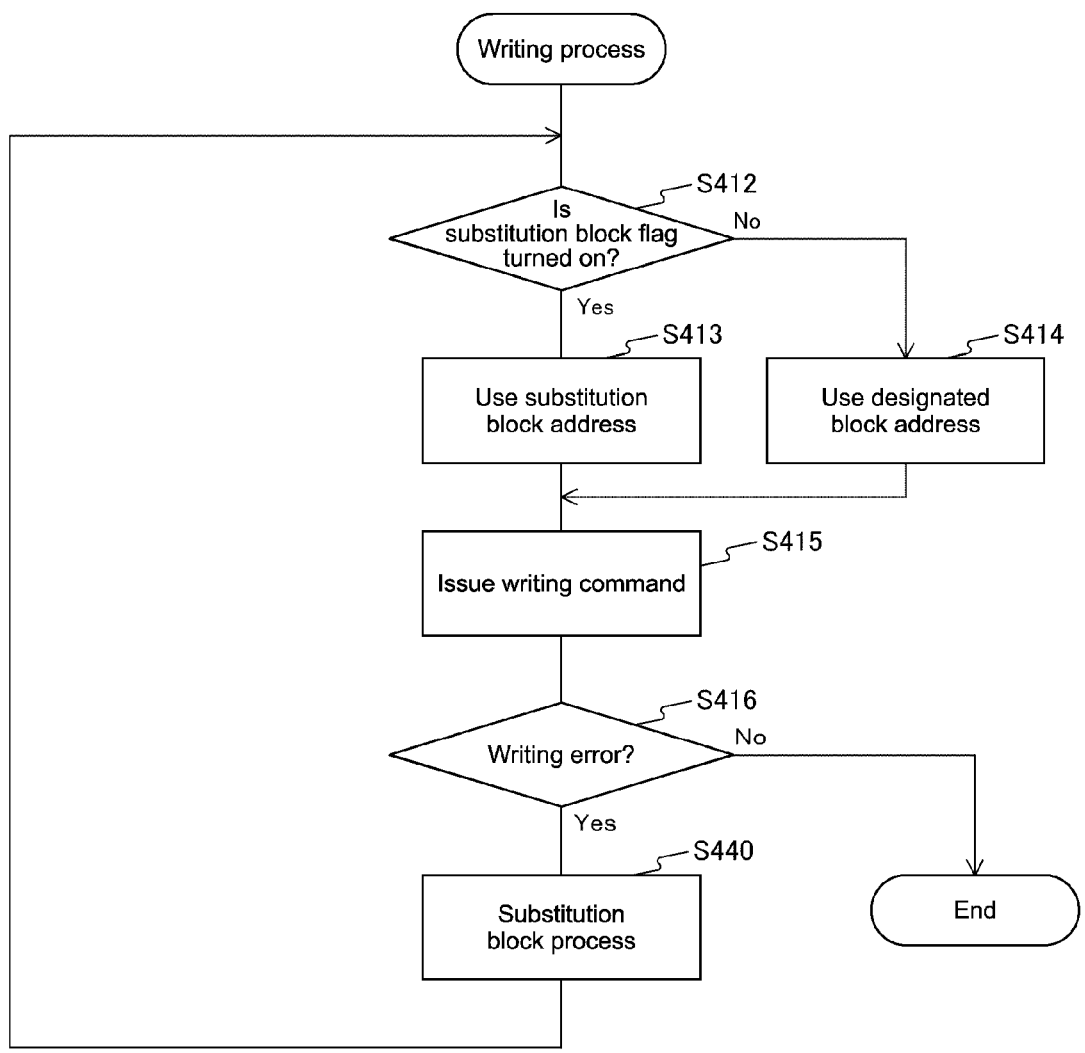
FIG. 44 is a diagram showing an exemplary process procedure of a writing process performed by a host computer according to the sixth embodiment.

FIG. 44 is a diagram showing an exemplary process procedure of a writing process performed by a host computer according to the sixth embodiment. The host computer 100 is configured to search for the substitution block flag of the second substitution management information corresponding to the block to which the writing target page belongs. In the case where this flag is turned on, i.e., the block is substituted (Step S412: Yes), the substitution block address is used to perform the subsequent processes (Step S413). In other words, the address of the page in the substitution block is used to perform the writing process. On the other hand, in the case where the block is not substituted (Step S412: No), the designated block address is used to perform the subsequent processes (Step S414). In other words, the address of the page being a writing target is used to perform the writing process. The host computer 100 is configured to issue, for the memory controller 270, a writing command including the address of the page obtained by the processes described above (Step S415). The host computer 100 waits for a response from the memory controller 270, and finishes the writing process in the case where no wiring error is returned (step S416: No).

In the case where a writing error has been returned (Step S416: Yes), the host computer 100 performs a substitution block process (Step S440) and then, performs the process of Step S412 and the subsequent processes again.

Figure 45:
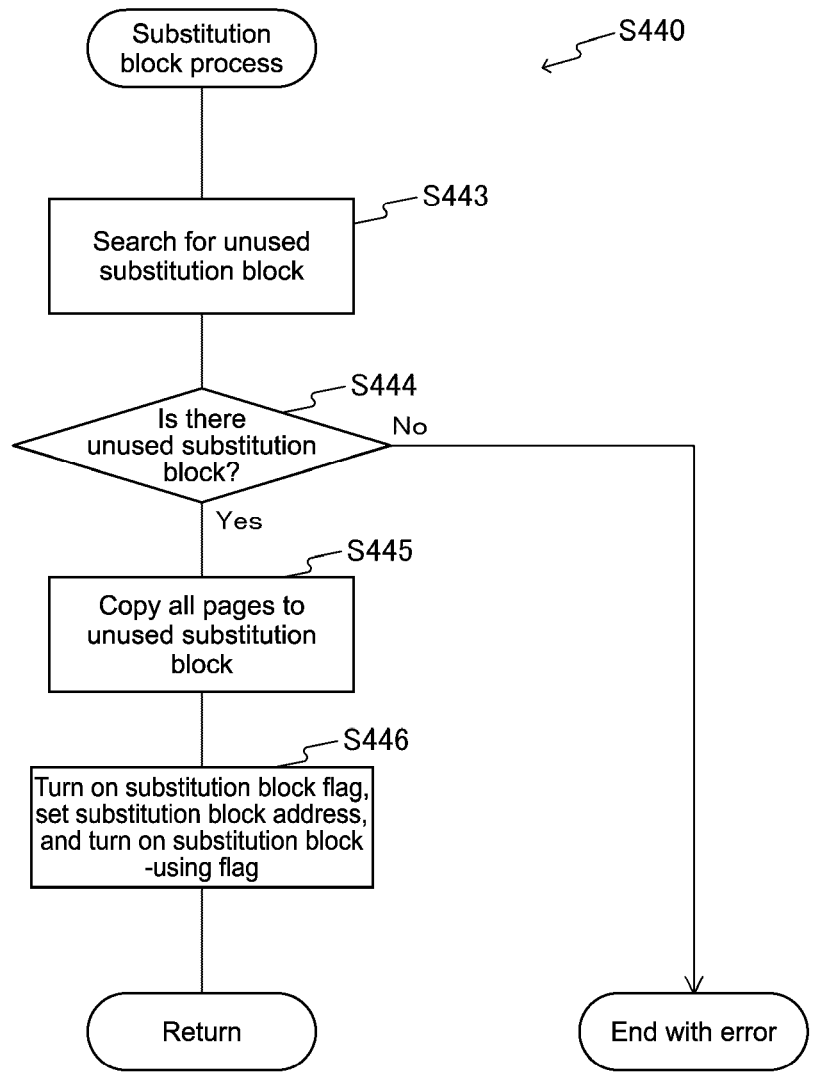
FIG. 45 is a diagram showing an exemplary process procedure of a substitution block process (Step S440) performed by the host computer according to the sixth embodiment.

FIG. 45 is a diagram showing an exemplary process procedure of a substitution block process (Step S440) performed by the host computer 100 according to the sixth embodiment. The host computer 100 is configured to search for an unused substitution block (Step S443). This process is performed by searching for the substitution block-using flag of the second substitution management information. As a result, in the case where there is no unused substitution block (Step S444: No), the substitution process is hard to perform. The host computer 100 finishes the writing process with an error.

In the case where there is an unused substitution block (Step S444: Yes), data stored in al pages included in the designated block is copied to the page of the unused substitution block (step S445). This process is performed by the host computer 100 instructing the memory controller 270. After that, the substitution block flag of the second substitution management information is turned on, the address of the unused substitution block is set to the substitution block address, and the substitution block-using flag is turned on (Step S446). The substitution block process is finished, and the process returns to the writing process described above with reference to FIG. 44.

Figure 46:
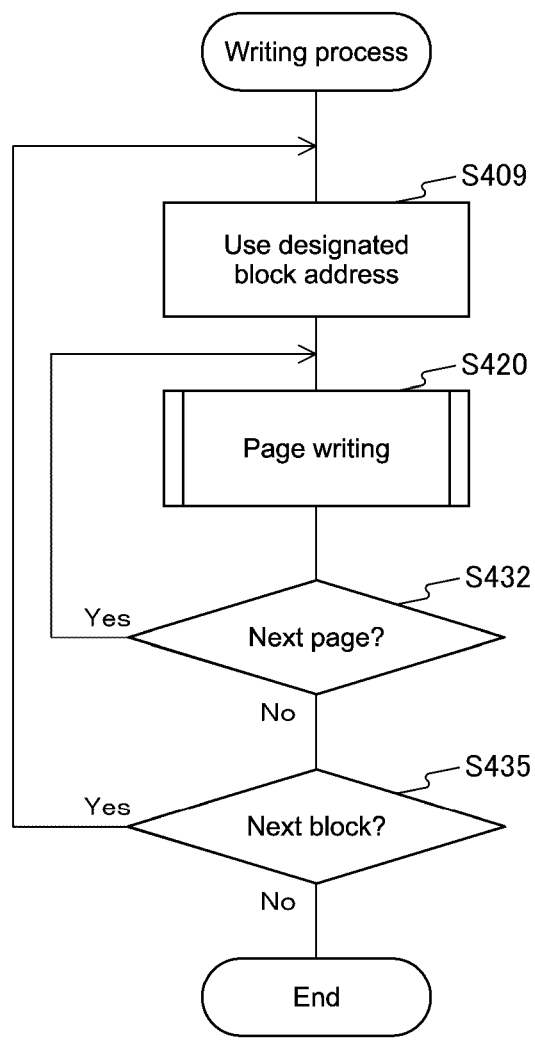
FIG. 46 is a diagram showing an exemplary process procedure of a writing process performed by the memory controller according to the sixth embodiment.

FIG. 46 is a diagram showing an exemplary process procedure of a writing process performed by a memory controller according to the sixth embodiment. When receiving the writing command issued from the host computer 100 in the process of issuing a writing command (Step S415) described above with reference to FIG. 44, the memory controller 270 starts the writing process. In this embodiment, because the host computer 100 performs the second substitution process, the memory controller 270 constantly uses the designated block address to perform the subsequent processes (Step S409). Next, a page writing process (Step S420) is performed. In the case where the writing process is performed over a plurality of pages and there is a next writing page (Step S432: Yes), the page writing process (Step S420) is performed again. In the case where there is no next writing page (Step S432: No), the process proceeds to Step S435. In the case where the writing process is performed over a plurality of blocks and there is a next writing block (Step S435: Yes), the process of Step S409 and the subsequent processes are performed again. In the case where there is no next writing block (Step S435: No), the writing process is finished.

Figure 47:
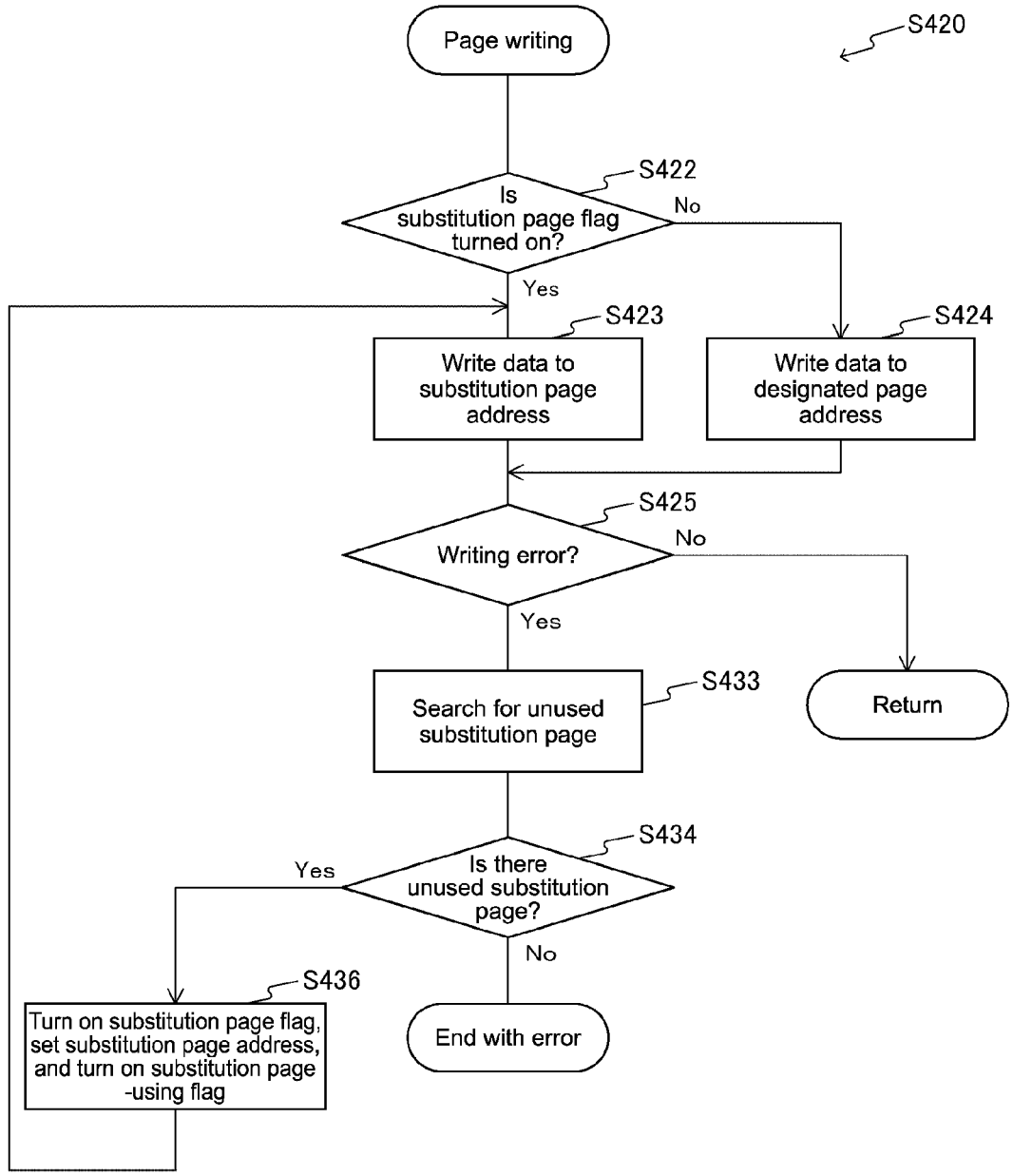
FIG. 47 is a diagram showing an exemplary process procedure of a page writing process (Step S420) performed by the memory controller according to the sixth embodiment.

FIG. 47 is a diagram showing an exemplary process procedure of a page writing process (Step S420) performed by a memory controller according to the sixth embodiment. The memory controller 270 is configured to search for the substitution page flag of the first substitution management information corresponding to the writing target page. In the case where this flag is turned on, i.e., the page is substituted (Step S422: Yes), data is written to the substitution page address (Step S423). In the case where the page is not substituted (Step S422: No), data is written to the designated page address (Step S424). After that, in the case where a writing error has not occurred (Step S425: No), the page writing process is finished.

In the case where a writing error has occurred (Step S425: Yes), the memory controller 270 searches for an unused substitution page to perform the substitution process (Step S433). This process is performed by searching for the substitution page for which the substitution page-using flag of the first substitution management information is not turned on. As a result, in the case where there is an unused substitution page (step S434: Yes), the substitution page flag of the first substitution management information is turned on, the address of the unused substitution page is set to the substitution page address, and the substitution page-using flag is turned on (Step S436). After that, the process returns to Step S423, and the data writing process is performed again. In the case where there is no unused substitution page, e.g., all substitution pages are used (step S434: No), the process is finished with an error. In this case, the memory controller 270 notifies the indication that a writing error has occurred of the host computer 100. As described above with reference to FIG. 44, the host computer 100 performs the substitution block process (Step S440).

(Process Procedure of Reading Process)

Figure 48:
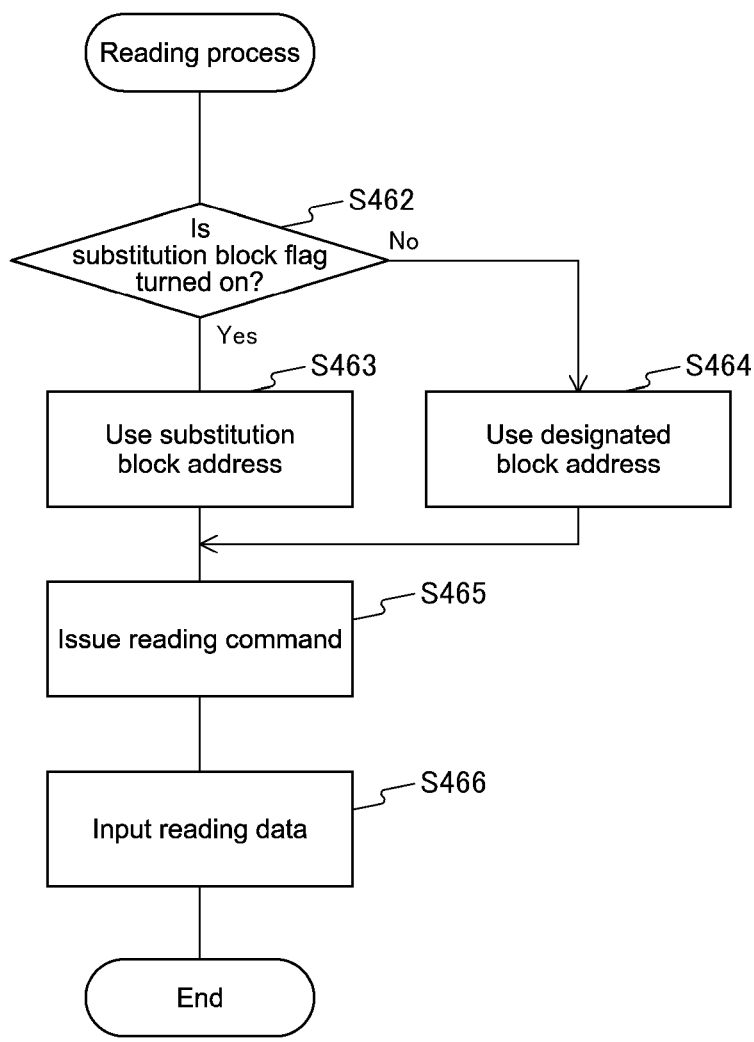
FIG. 48 is a diagram showing an exemplary process procedure of a reading process performed by the host computer according to the sixth embodiment.

FIG. 48 is a diagram showing an exemplary process procedure of a reading process performed by the host computer according to the sixth embodiment. The host computer 100 is configured to search for the substitution block flag of the second substitution management information corresponding to the block to which the reading target page belongs. In the case where this flag is turned on, i.e., the block is substituted (Step S462: Yes), the substitution block address is used to perform the subsequent processes (Step S463). In other words, the address of the page in the substitution block is used to perform the reading process. On the other hand, in the case where the block is not substituted (Step S462: No), the designated block address is used to perform the subsequent processes (Step S464). In other words, the address of the reading target page is used to perform the subsequent processes. The host computer 100 is configured to issue, for the memory controller 270, a reading command including the address of the page obtained by the processes described above (Step S465). The host computer 100 waits for reading data input from the memory controller 270 (Step S466), and then finishes the reading process.

Figure 49:
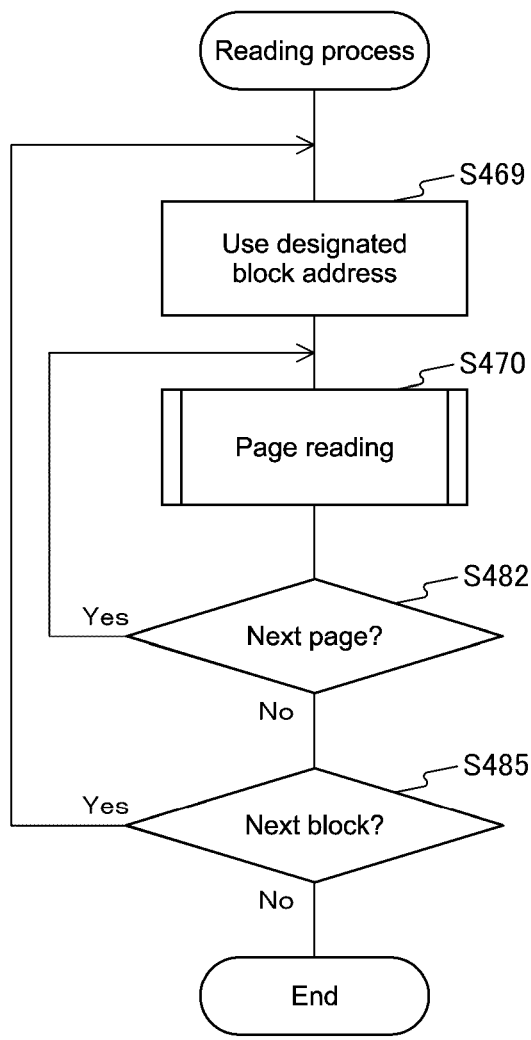
FIG. 49 is a diagram showing an exemplary process procedure of a reading process performed by the memory controller according to the sixth embodiment.

FIG. 49 is a diagram showing an exemplary process procedure of a reading process performed by the memory controller according to the sixth embodiment. When receiving the reading command issued from the host computer 100 in the process of issuing a reading command (Step S465) described above with reference to FIG. 48, the memory controller 270 starts the reading process. In this embodiment, because the host computer 100 performs the second substitution process, the memory controller 270 constantly uses the designated block address (Step S469). Next, a page reading process (Step S470) is performed. In the case where the reading process is performed over a plurality of pages and there is a next reading page (Step S482: Yes), the page reading process (Step S470) is performed again. In the case where there is no next reading page (Step S482: No), the process proceeds to Step S485. In the case where the reading process is performed over a plurality of blocks and there is a next reading block (Step S485: Yes), the process of Step S469 and the subsequent processes are performed again. In the case where there is a next reading block (step S435: No), the reading process is finished.

Figure 50:
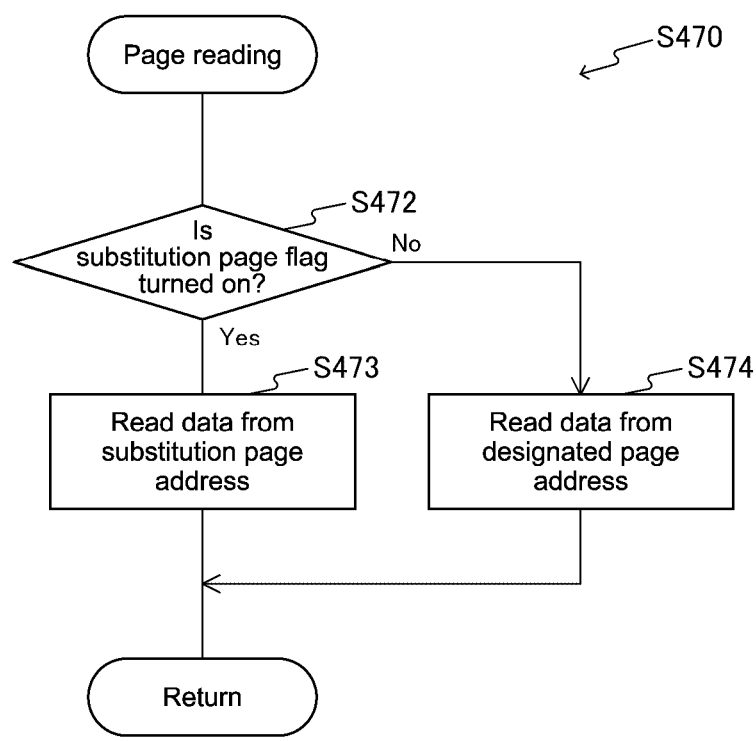
FIG. 50 is a diagram showing an exemplary process procedure of a page reading process (Step S470) performed by the memory controller according to the sixth embodiment.

FIG. 50 is a diagram showing an exemplary process procedure of a page reading process (Step S470) performed by the memory controller according to the sixth embodiment. The memory controller 270 is configured to search for the substitution page flag of the first substitution management information corresponding to the reading target page. In the case where this flag is turned on, i.e., the page is substituted (Step S472: Yes), data is read from the substitution page address (Step S473). In the case where the page is not substituted (Step S472: No), data is read from the designated page address (Step S474). After that, the page reading process is finished.

In the sixth embodiment described above, because the host computer performs the second substitution process, the second substitution process may be performed as a part of the file system management function of the host computer. Specifically, the file system is managed in a unit of block, and the substitution block is substituted for the error block. The second substitution process is performed as a part of the file system management with the file system management information including, for example, the substitution block flag and the substitution block address being the second substitution management information.

As described above, according to the sixth embodiment, it is possible to reduce the capacity of the substitution management information buffer 230 that stores the substitution management information because the memory controller performs only the first substitution process.

7. Modified Example (Example in which Part of First Substitution Management Information is Transferred to Substitution Management Information Buffer)

The first substitution management information is an aggregate of the management information of each block. Therefore, a part of the first substitution management information can be taken out. The configuration in which only the management information of the block that is necessary for the process performed by the host computer 100 is transferred to the substitution management information buffer 230 and is used can be employed.

As described above, by transferring a part of the first substitution management information to the substitution management information buffer 230, it is possible to further reduce the capacity of the substitution management information buffer 230.

(Example in which Unnecessary First Substitution Management Information is Removed)

If an error block is generated, the second substitution process is performed. Therefore, the first substitution management information related to the block is not referred after that. Therefore, the configuration in which the unnecessary first substitution management information is removed at each time when the second substitution process is performed may be employed.

As described above, by removing a part of the unnecessary first substitution management information, it is possible to reduce the size of the first substitution management information.

(Example in which Number of Substitution Pages and Number of Substitution Blocks are Suitable for Non-Volatile Memory)

The configuration in which the proportion of the number of substitution pages to the total number of pages is close to the expected value of the proportion of the number of generated error pages to the total number of pages in the used non-volatile memory may be employed. Similarly, the configuration in which the proportion of the number of substitution blocks to the total number of blocks is close to the expected value of the proportion of the number of generated error blocks to the total number of blocks in the used non-volatile memory may be employed. With such a configuration, it is possible to provide a substitution function that can be applied to an expected error without preparing more substitution pages and blocks than necessary.

In the non-volatile memory of 2 G bytes described above with reference to FIG. 4, two cases where m is 131,072, d is 8,192, b is 32, and e is 2, and where m is 16,384, d is 1,024, b is 32, and e is 2 have been shown. Both the proportion of the number of substitution blocks to the total number of pages in the block (m/d) and the proportion of the number of substitution blocks to the total number of blocks (e/b) are 0.0625. The proportions can be close to the expected value of the proportion of generated error page and the expected value of the proportion of generated error block described above.

As described above, with the configuration in which the proportions are close to the expected values of generated error page and error block in the non-volatile memory that uses the proportion of the number of pages to the total number of pages and the proportion of the number of blocks to the total number of blocks, the effects of improving the efficiency of using the memory can be achieved.

It should be noted that the configuration in which the proportions are close to the expected values of generated error page and error block in the non-volatile memory that uses the proportion of the number of pages to the total number of pages and the proportion of the number of blocks to the total number of blocks is an example of the configuration of the non-volatile memory according to an embodiment of the present disclosure.

As described above, according to the embodiments of the present disclosure, it is possible to perform the substitution process in a unit of page in the block and the substitution process in a unit of block, to reduce the capacity of the memory consumed in the substitution process, and to reduce the substitution management information that is necessary therefor.

It should be noted that the embodiments of the present disclosure are shown as an example for implementing the present disclosure. The matters in the embodiments of the present invention have corresponding relations to the invention specifying matters in the claims. Similarly, the invention specifying matters in the claims have corresponding relations to the matters in the embodiments of the present invention having the same names as the invention specifying matters. It should be noted that the present disclosure is not limited to the above-mentioned embodiments and various modifications can be made without departing from the gist of the present disclosure.

Moreover, the process procedure described in the above-mentioned embodiments may be regarded as a method including the series of procedures.

It should be noted that the effects described above are not necessarily restrictive, and may be any of those described in the present disclosure.

It should be noted that the present disclosure may also take the following configurations.

(1) A memory controller, which substitutes a substitution page for an error page in a block including a plurality of pages in a non-volatile memory and secures a substitution block to substitute a page in the secured substitution block for the error page when the substitution page is insufficient in a block to which the error page belongs, the substitution page being assigned to the block to which the error page belongs, the substitution block being different from the block to which the error page belongs.

(2) The memory controller according to (1) above, including:
 a first substitution management information buffer configured to store first substitution management information that represents a correspondence relationship between the error page and the substitution page; and
 a second substitution management information buffer configured to store second substitution management information that represents a correspondence relationship between the block having the insufficient substitution page and the substitution block.

(3) The memory controller according to (2) above, in which
 the first substitution management information is created when the error page has been generated first, and
 the second substitution management information is created when the block having the insufficient substitution page has been generated first.

(4) The memory controller according to (1) or (2) above, including
 an address conversion unit configured
  to convert a logical address of a designated page into a physical address of a page,
  to convert the logical address into a physical address of the substitution page instead of a physical address of the error page when the error page is substituted, and
  to convert the logical address into a physical address of the page in the substitution block when the substitution page is insufficient.

(5) The memory controller according to any one of (1) to (4) above, in which
 the page includes a plurality of banks,
 an error bank in the error page is substituted in a unit of bank by a bank in the substitution page when the error page is substituted, and
 a substitution block that is different from the block to which the error page belongs is secured to substitute a bank in a page in the substitution block for the error bank when the bank in the substitution page is insufficient in the block to which the error page belongs.

(6) A storage apparatus, including:
 a non-volatile memory; and
 a memory controller configured to substitute a substitution page for an error page in a block including a plurality of pages in the non-volatile memory and secure a substitution block to substitute a page in the secured substitution block for the error page when the substitution page is insufficient in a block to which the error page belongs, the substitution page being assigned to the block to which the error page belongs, the substitution block being different from the block to which the error page belongs.

(7) The storage apparatus according to (6) above, in which
 the non-volatile memory is configured so that the number of substitution pages assigned to the block substantially matches an expected value of the number of error pages generated in pages included in the block, and that the number of substitution blocks substantially matches an expected value of the number of blocks having the insufficient substitution page in all blocks.

(8) The storage apparatus according to (6) above, in which
 the non-volatile memory is configured to store first substitution management information that represents a correspondence relationship between the error page and the substitution page, and second substitution management information that represents a correspondence relationship between the substitution block and the block having the insufficient substitution page, and the memory controller includes
a first substitution management information buffer configured to store the first substitution management information, and
a second substitution management information buffer configured to store the second substitution management information.

(9) An information processing system, including:
a non-volatile memory;
a memory controller configured to substitute a substitution page for an error page in a block including a plurality of pages in the non-volatile memory and secure a substitution block to substitute a page in the secured substitution block for the error page when the substitution page is insufficient in a block to which the error page belongs, the substitution page being assigned to the block to which the error page belongs, the substitution block being different from the block to which the error page belongs; and
a host computer configured to access the non-volatile memory via the memory controller.

(10) An information processing system, including:
a non-volatile memory;
a memory controller configured to substitute a substitution page for an error page in a block including a plurality of pages in the non-volatile memory, the substitution page being assigned to a block to which the error page belongs; and
a host computer configured
to access the non-volatile memory via the memory controller, and
to change an access destination to a substitution block that is different from the block to which the error page belongs to substitute a page in the substitution block for the error page when the substitution page is insufficient in the block to which the error page belongs.

(11) A method of controlling a non-volatile memory, including:
substituting a substitution page for an error page in a block including a plurality of pages in a non-volatile memory; and
securing a substitution block to substitute a page in the secured substitution block for the error page when the substitution page is insufficient in a block to which the error page belongs, the substitution page being assigned to the block to which the error page belongs, the substitution block being different from the block to which the error page belongs.

It should be understood by those skilled in the art that various modifications, combinations, sub-combinations and alterations may occur depending on design requirements and other factors insofar as they are within the scope of the appended claims or the equivalents thereof.

What is claimed is:

1. A memory controller comprising:
a host interface configured to electronically receive host computer data from a host computer along with a writing command that instructs the memory controller to perform a writing process, the writing command includes a logical block address and a logical page address;
a substitution processing unit configured to electronically convert the logical page address into a physical page address and to electronically convert the logical block address into a physical block address, the physical block address identifies a location of a data storing block in memory and the physical page address identifies a location of a data storing page in the data storing block; and
a memory interface configured to electronically send the host computer data to the memory during the writing process, the memory controller is configured to control a writing of the host computer data to the data storing page during the writing process,
wherein the memory controller is configured to electronically determine whether or not a writing error has occurred during the writing of the host computer data to the data storing page, the memory controller is configured to electronically determine whether or not an unused substitution page exists in the data storing block when the writing error has occurred during the writing of the host computer data to the data storing page.

2. The memory controller according to claim 1, wherein data to be read from the memory absent from the unused substitution page.

3. The memory controller according to claim 1, wherein the memory controller is configured to control a writing of the host computer data to the unused substitution page when the memory controller determines that the unused substitution page exists in the data storing block.

4. The memory controller according to claim 1, wherein the memory controller is configured to electronically control a writing of the host computer data to an unused substitution block when the memory controller determines that the unused substitution page does not exist in the data storing block.

5. The memory controller according to claim 1, wherein the substitution processing unit includes a first substitution processing unit that is configured to electronically convert the logical page address into the physical page address.

6. The memory controller according to claim 5, wherein the substitution processing unit includes a second substitution processing unit that is configured to electronically convert the logical block address into the physical block address.

7. A storage apparatus comprising:
the memory controller according to claim 1; and
the memory.

8. The storage apparatus according to claim 7, wherein the memory is non-volatile memory.

9. An information processing system comprising:
the memory controller according to claim 1;
the memory; and
the host computer.

10. The information processing system according to claim 9, wherein the memory is non-volatile memory.

11. A method of controlling memory, the method comprising:
electronically receiving host computer data from a host computer along with a writing command that instructs a memory controller to perform a writing process;
electronically sending the host computer data to memory during the writing process;
electronically determining whether or not a writing error has occurred during a writing of the host computer data to a data storing page; and
electronically determining whether or not an unused substitution page exists in the data storing block when the writing error has occurred during the writing of the host computer data to the data storing page.

12. The method according to claim 11, wherein the memory controller controls a writing of the host computer data to the unused substitution page when the memory controller determines that the unused substitution page exists in the data storing block.

13. The method according to claim 11, wherein the memory controller controls a writing of the host computer data to an unused substitution block when the memory controller determines that the unused substitution page does not exist in the data storing block.

14. The method according to claim 11, wherein the memory controller controls a writing of the host computer data to the data storing page during the writing process.

15. The method according to claim 11, wherein data to be read from the memory absent from the unused substitution page.

16. The method according to claim 11, wherein a physical block address identifies a location of a data storing block in the memory and a physical page address identifies a location of the data storing page in the data storing block.

17. The method according to claim 16, further comprising:
   electronically converting a logical page address into the physical page address, the writing command includes the logical page address.

18. The method according to claim 16, further comprising:
   electronically converting a logical block address into the physical block address, the writing command includes the logical block address.

* * * * *